United States Patent
Bogdan

(10) Patent No.: US 9,584,171 B2
(45) Date of Patent: Feb. 28, 2017

(54) ADAPTIVE DATA RECOVERY

(71) Applicant: John W Bogdan, Ottawa (CA)

(72) Inventor: John W Bogdan, Ottawa (CA)

(73) Assignee: John W. Bogdan, Ottawa, Ontario (CA)

( * ) Notice: Subject to any disclaimer, the term of this patent is extended or adjusted under 35 U.S.C. 154(b) by 0 days.

(21) Appl. No.: 14/852,937

(22) Filed: Sep. 14, 2015

(65) Prior Publication Data

US 2016/0006467 A1    Jan. 7, 2016

Related U.S. Application Data

(63) Continuation of application No. 14/099,907, filed on Dec. 6, 2013, now Pat. No. 9,136,891, which is a continuation-in-part of application No. 13/844,722, filed on Mar. 15, 2013, now Pat. No. 9,100,165.

(51) Int. Cl.
| | |
|---|---|
| *H04L 25/03* | (2006.01) |
| *H04B 1/10* | (2006.01) |
| *H04L 7/00* | (2006.01) |
| *H04L 27/26* | (2006.01) |
| *H03H 17/02* | (2006.01) |
| *H03H 17/04* | (2006.01) |
| *H04L 1/00* | (2006.01) |

(52) U.S. Cl.
CPC ....... *H04B 1/1027* (2013.01); *H03H 17/0251* (2013.01); *H03H 17/04* (2013.01); *H04L 1/0091* (2013.01); *H04L 7/0079* (2013.01); *H04L 25/0398* (2013.01); *H04L 27/2647* (2013.01); *H04L 27/2657* (2013.01); *H04L 27/2695* (2013.01); *H04L 1/0045* (2013.01)

(58) Field of Classification Search
CPC . H04L 25/0398; H04L 25/03; H04L 27/2647; H04L 27/2666
See application file for complete search history.

(56) References Cited

U.S. PATENT DOCUMENTS

2013/0329837 A1\* 12/2013 Reyland, Jr. .......... H04L 1/0054
375/341

\* cited by examiner

*Primary Examiner* — Jean B Corrielus

(57) ABSTRACT

This application presents an adaptive data recovery (ADR) of original data symbols from intervals or parameters of tone signals derived from a received OFDM signal, conducted without compensating distortions or noise introduced to the received OFDM signal by an OFDM transmission channel. Such ADR is implemented by converting back the derived intervals or parameters into original data symbols corresponding to distinctive sets of the intervals or parameters which the derived intervals or parameters belong to.

3 Claims, 30 Drawing Sheets

FIG. 1 Inverse Transformation Method applied for DMT Data Recovery
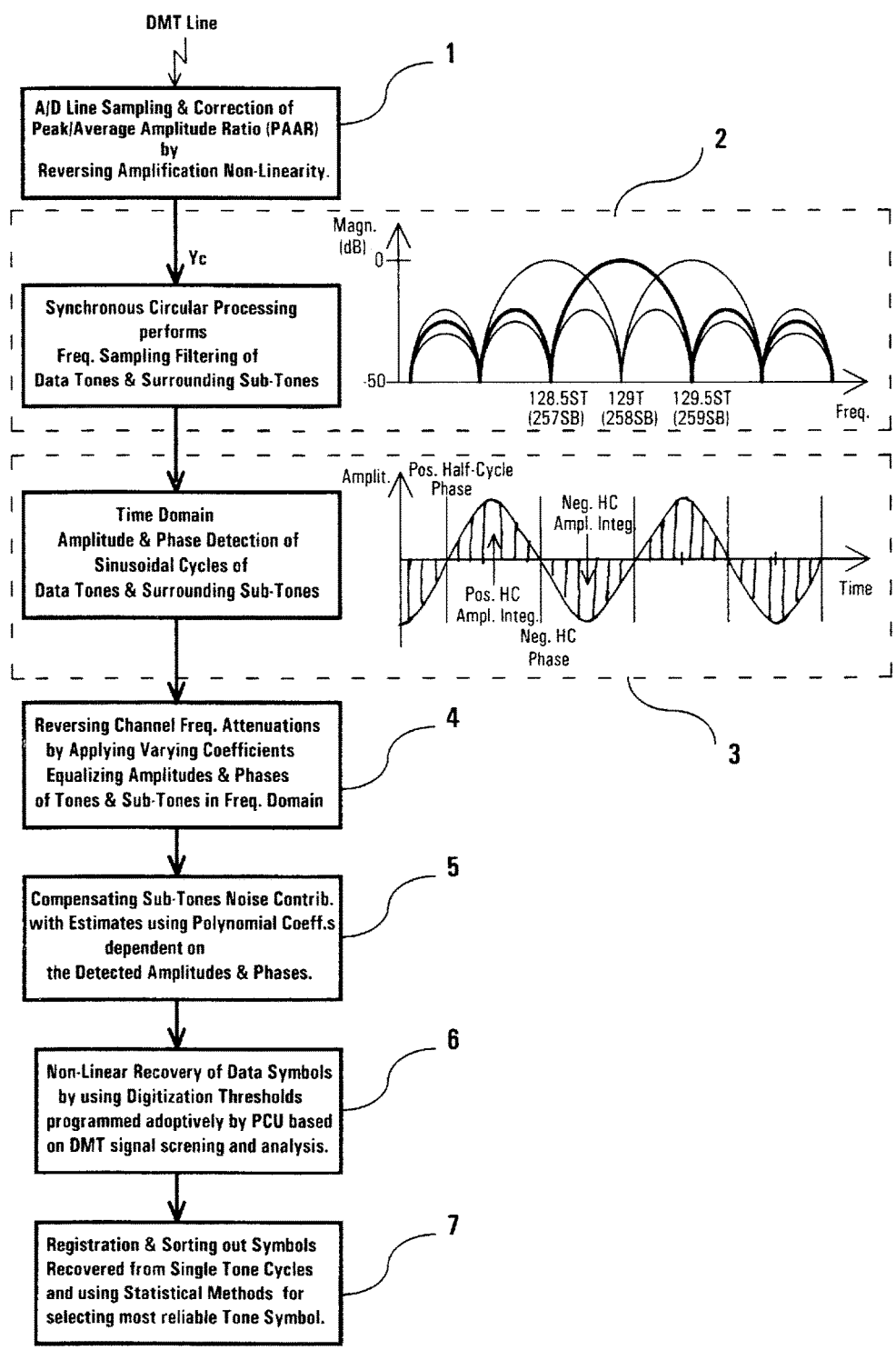

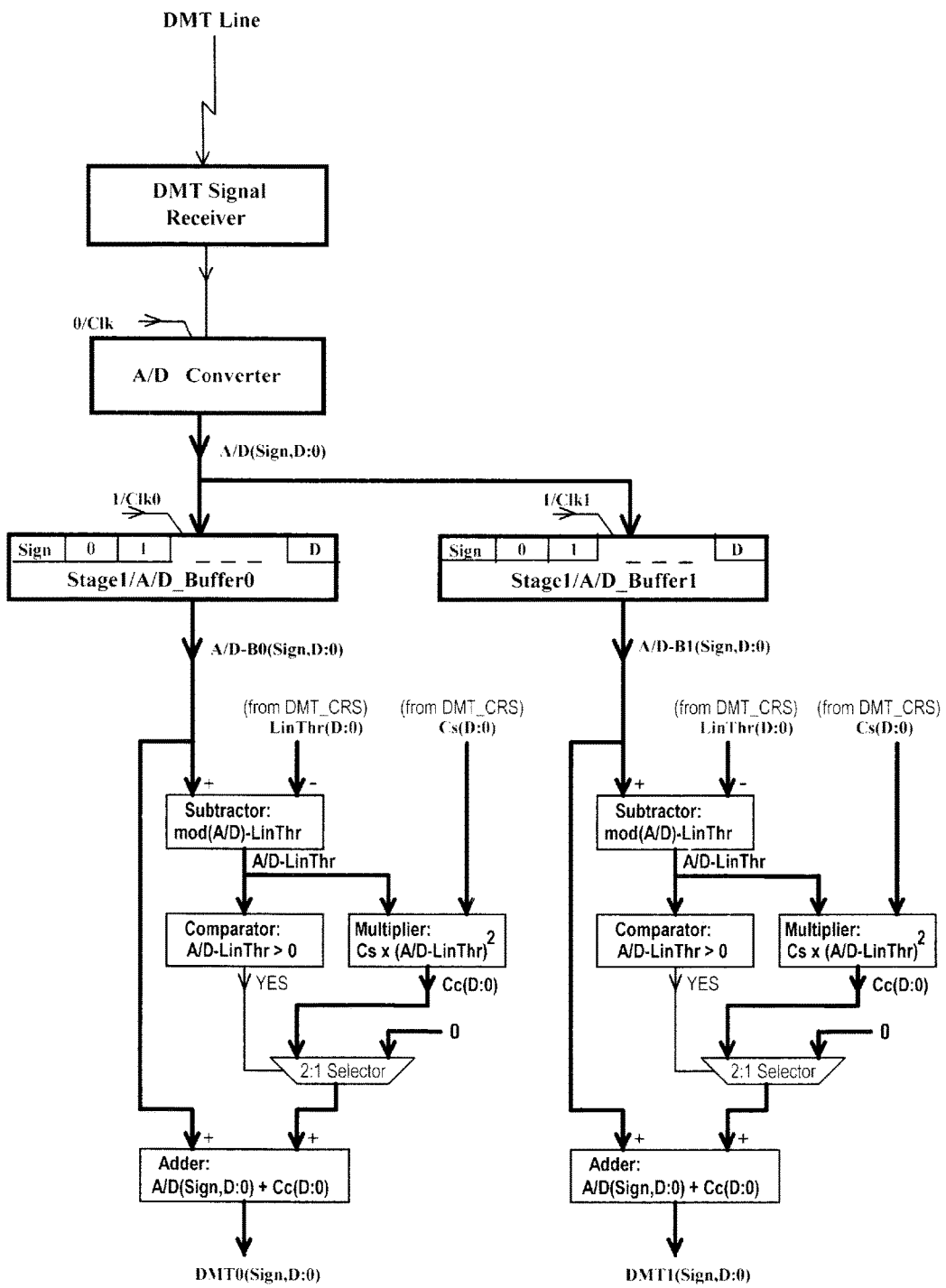
FIG.2 DMT Signal Sampling and Non-linearity Correction

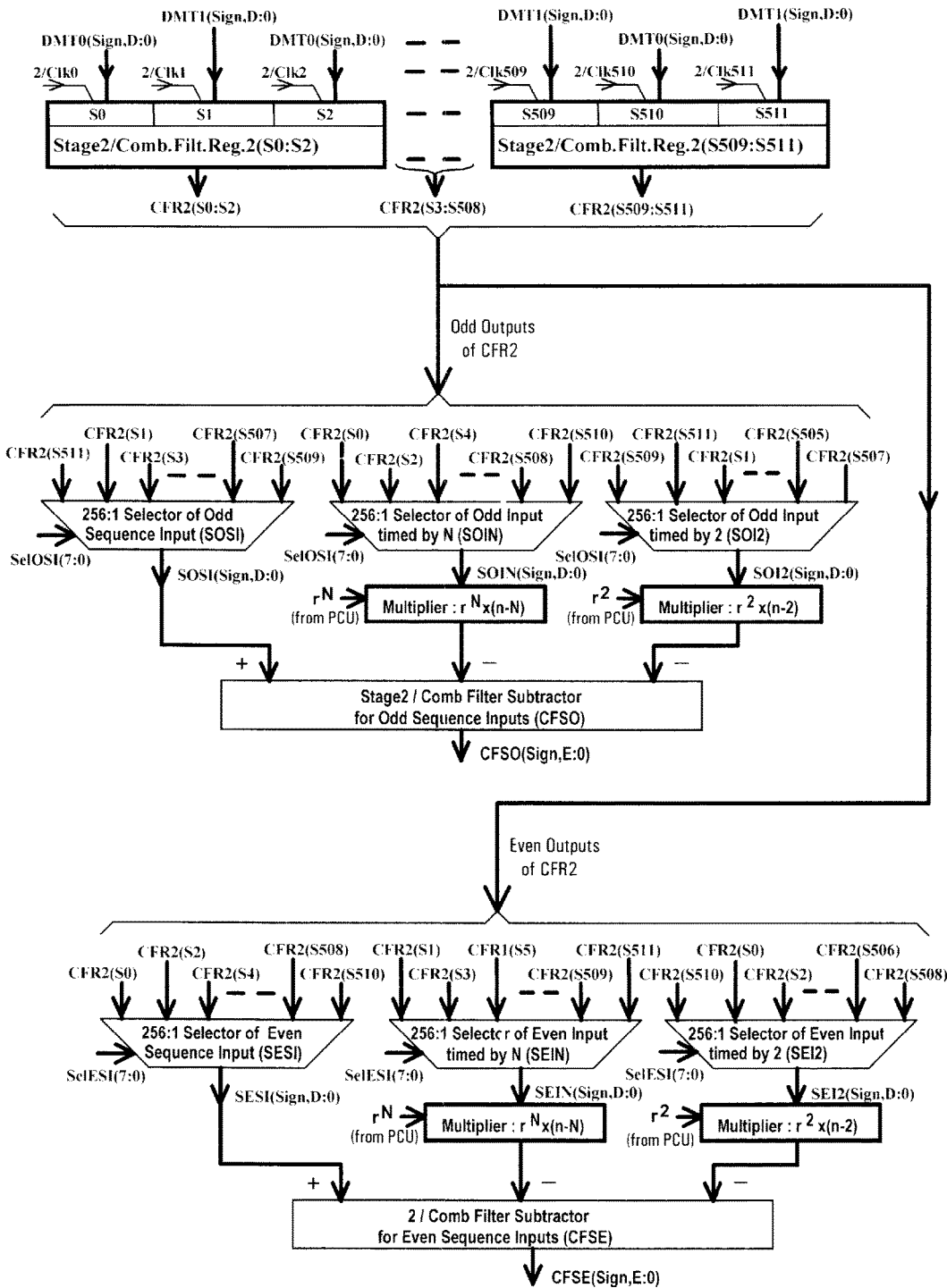
FIG.3 Comb Filtering of DMT Signal

FIG.4 129Tone / Resonating IIR Filter (129T/RIF)
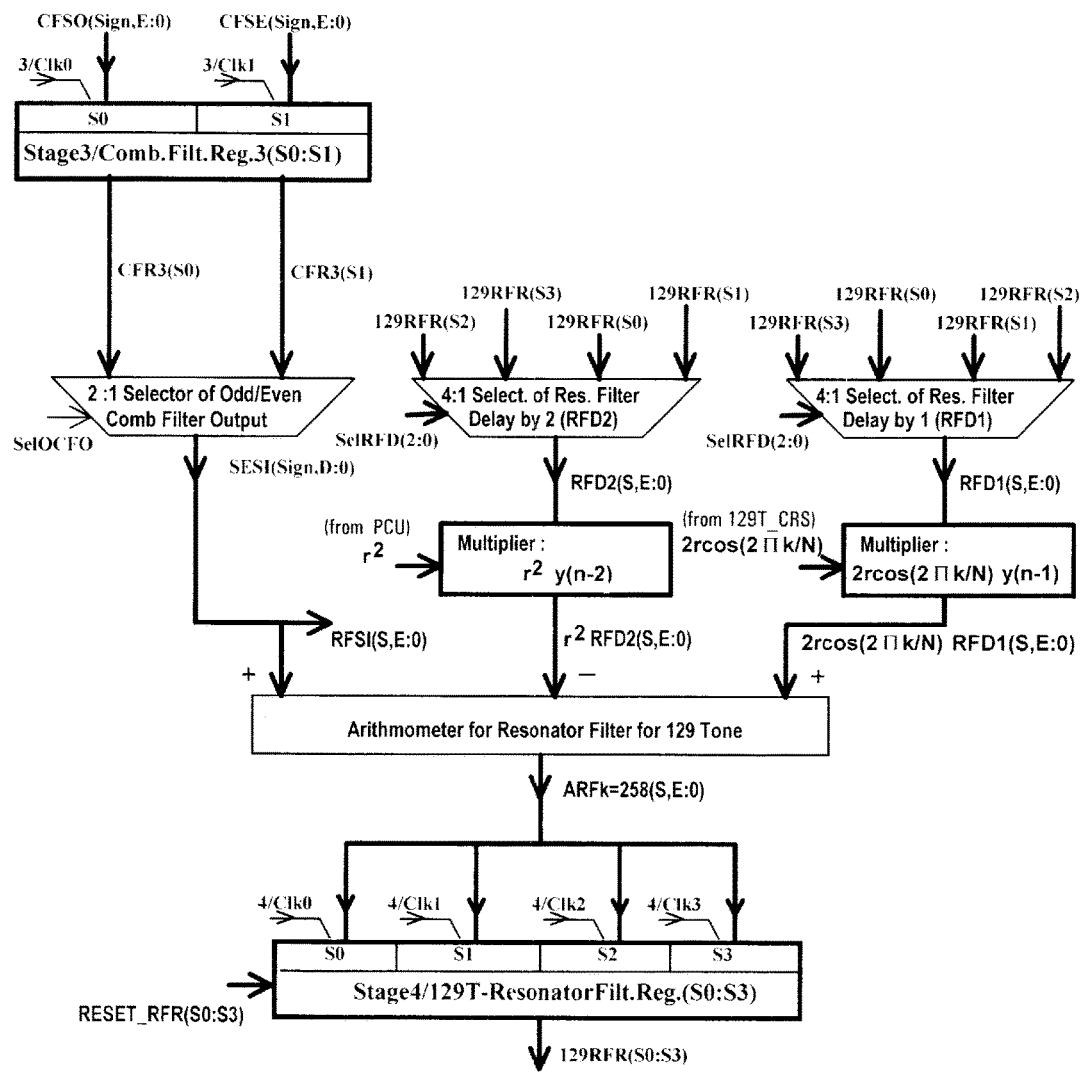

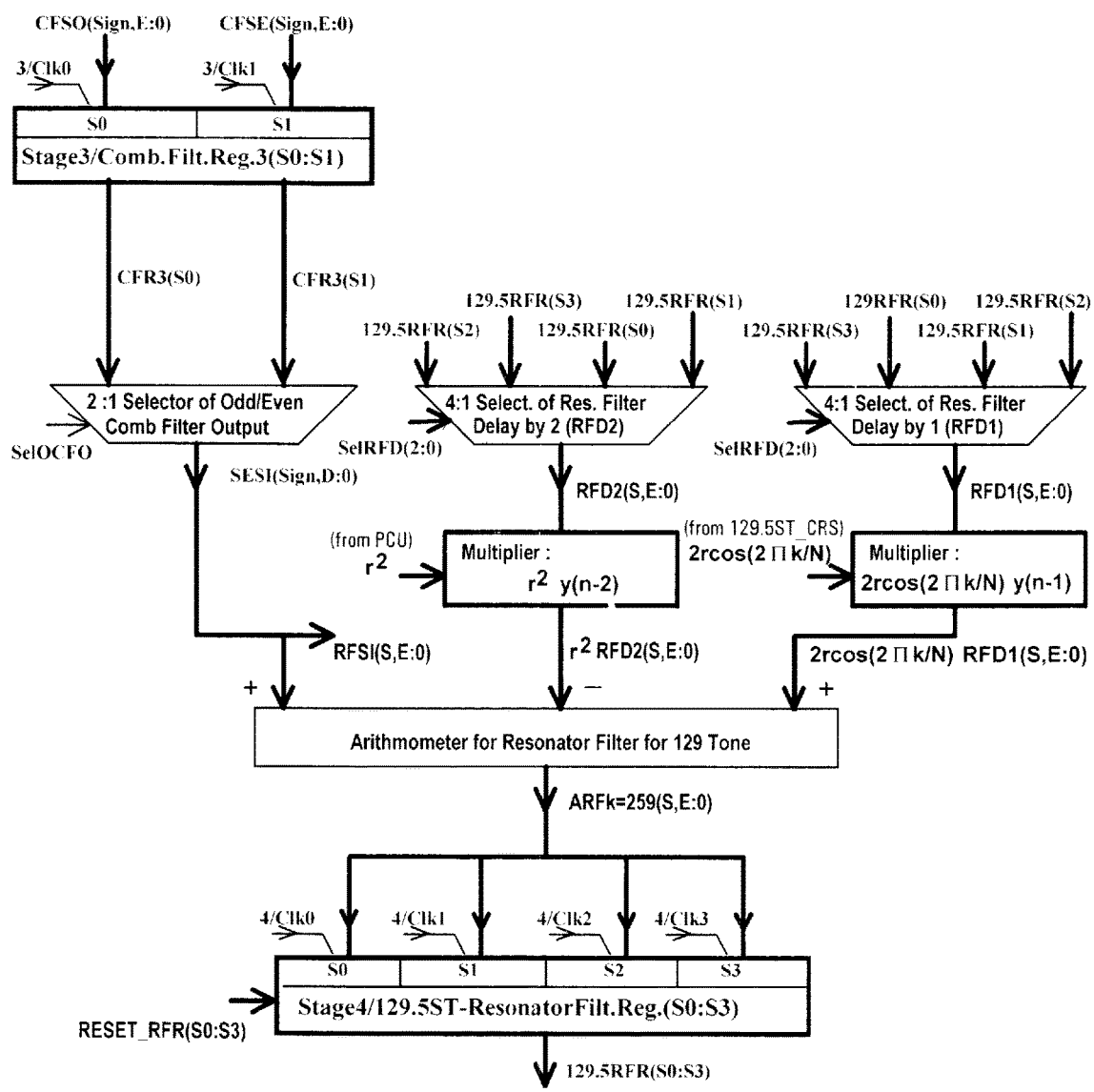
FIG.4A 129.5SubTone / Resonating IIR Filter (129.5ST/RIF)

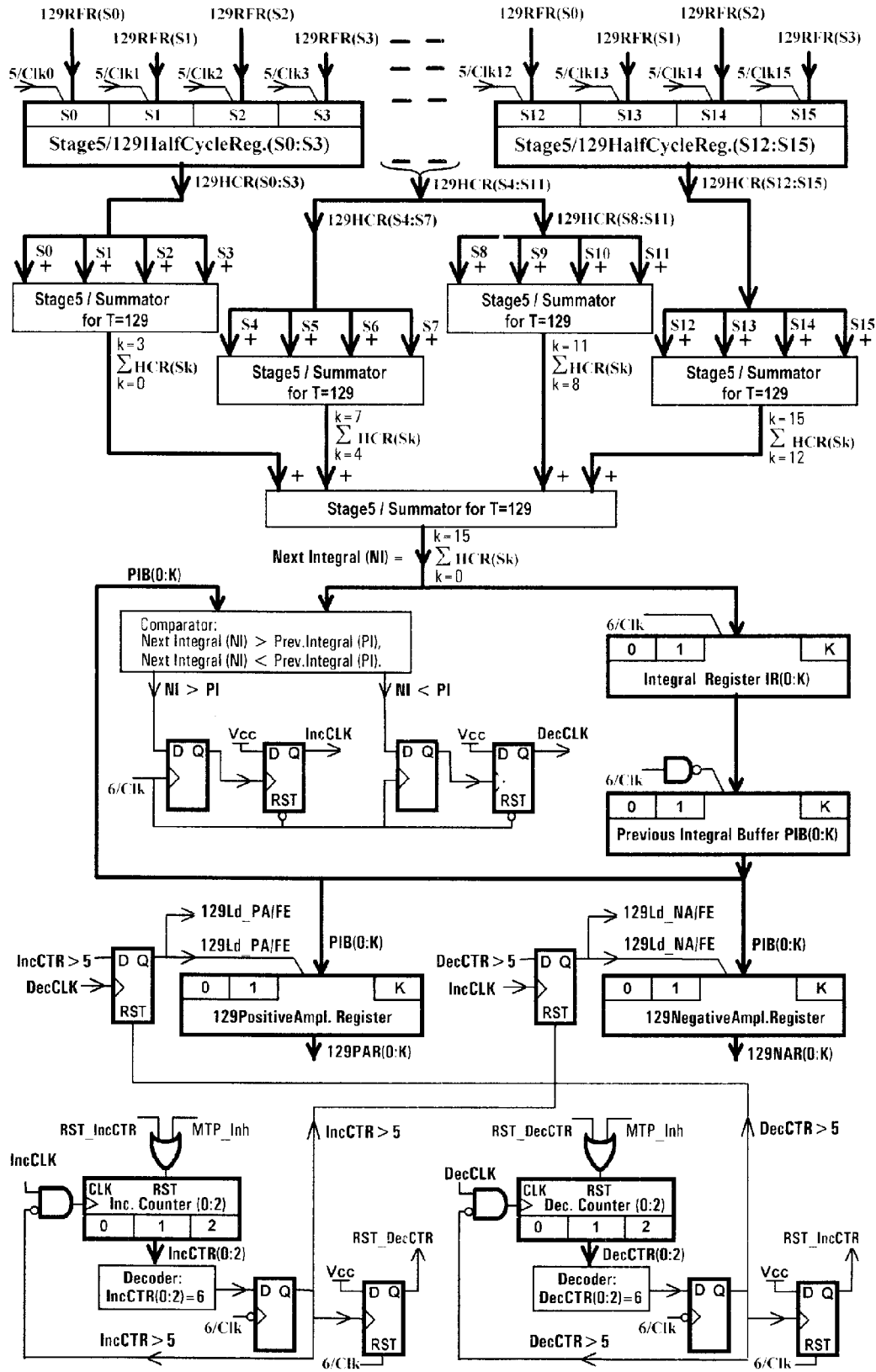
FIG.5 Half-Cycles Integration & Amplitudes Registration for 129 Tone

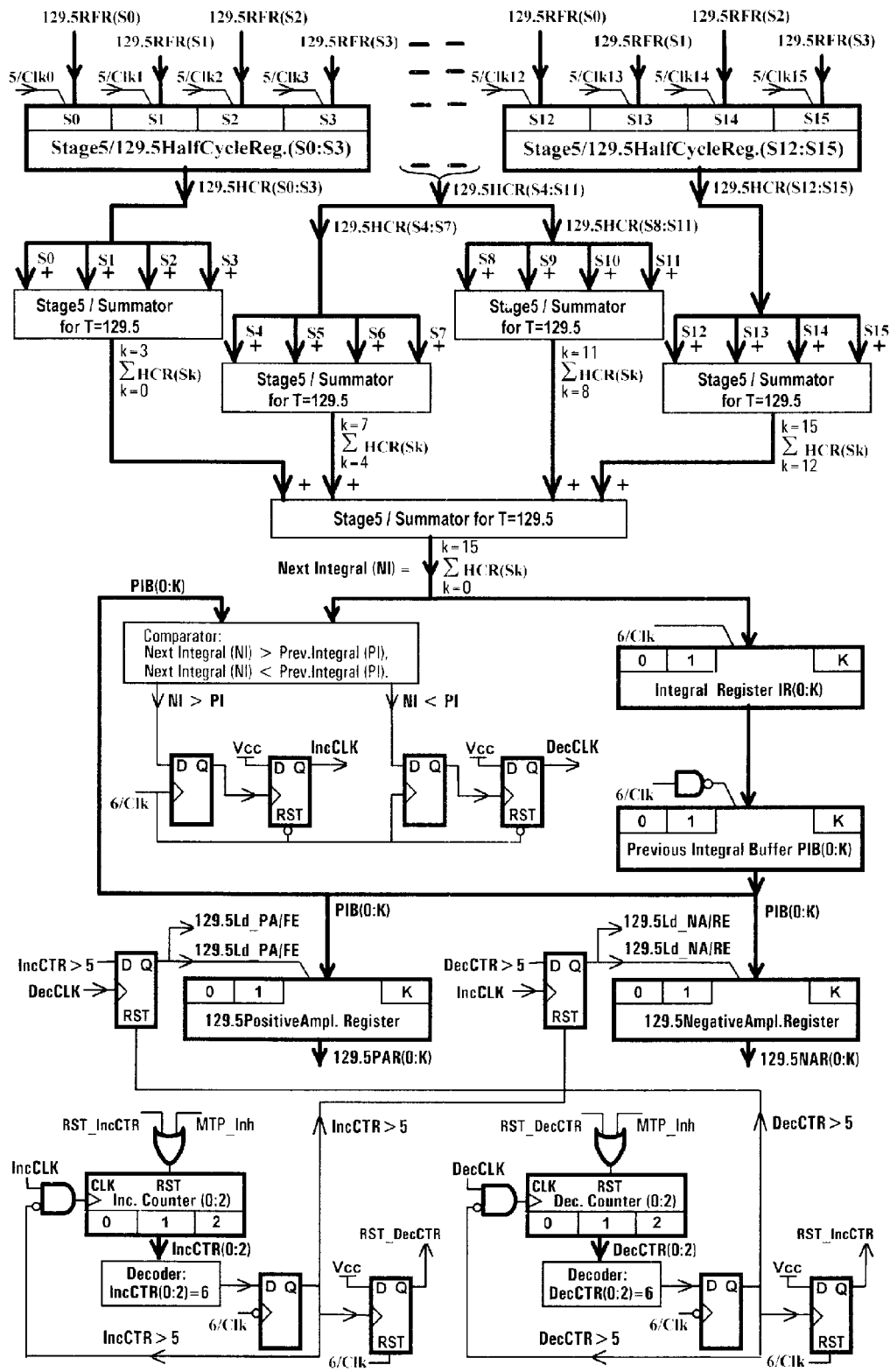
FIG.5A Half-Cycles Integration & Amplitudes Registration for 129.5 Sub-Tone

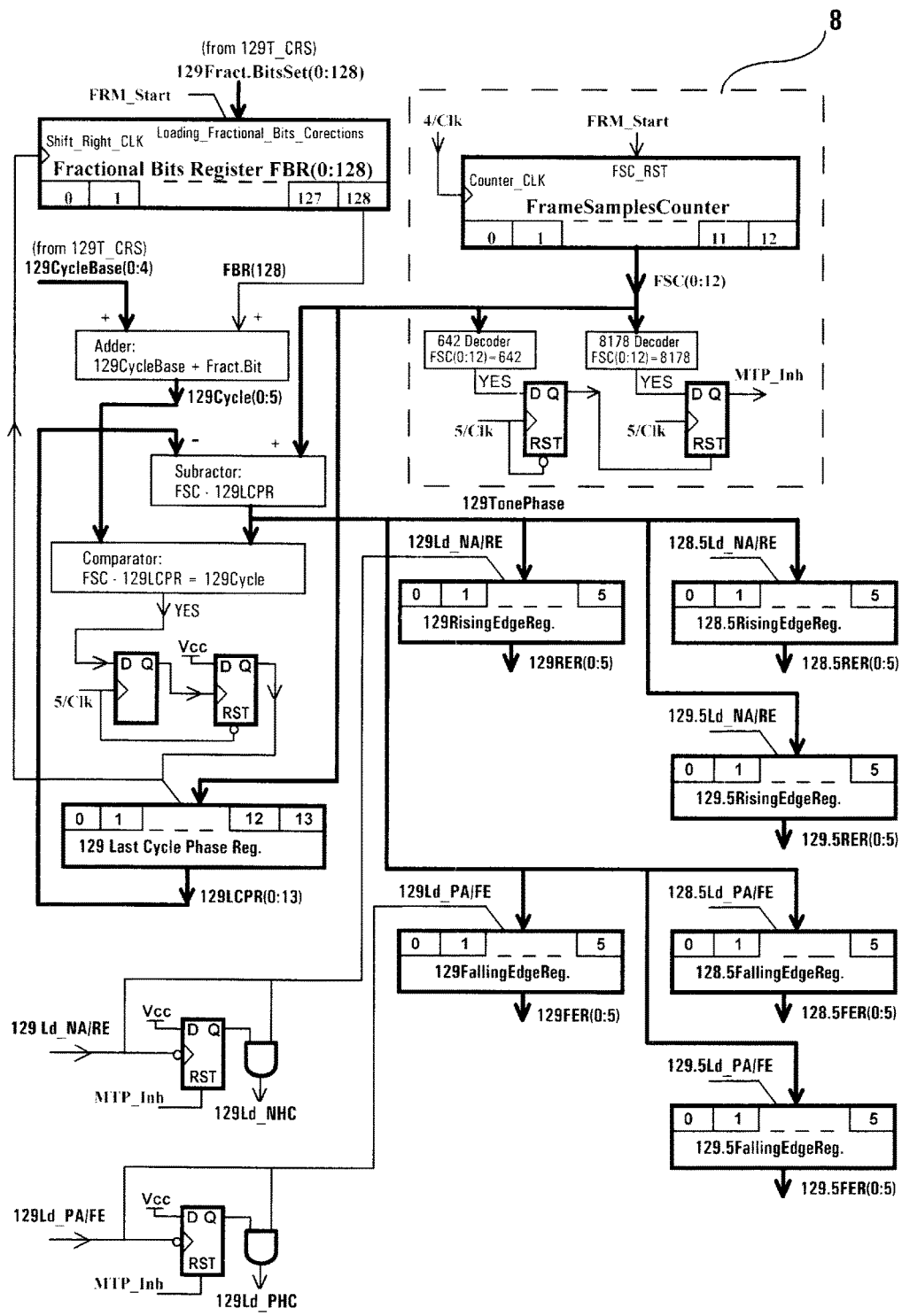
FIG.6 129T / 128.5ST /129.5ST Phase Capturing and Tone Processing Initialization FIG.7 Retiming & Averaging of Positive and Negative HC for 129T/128.5ST/129.5ST
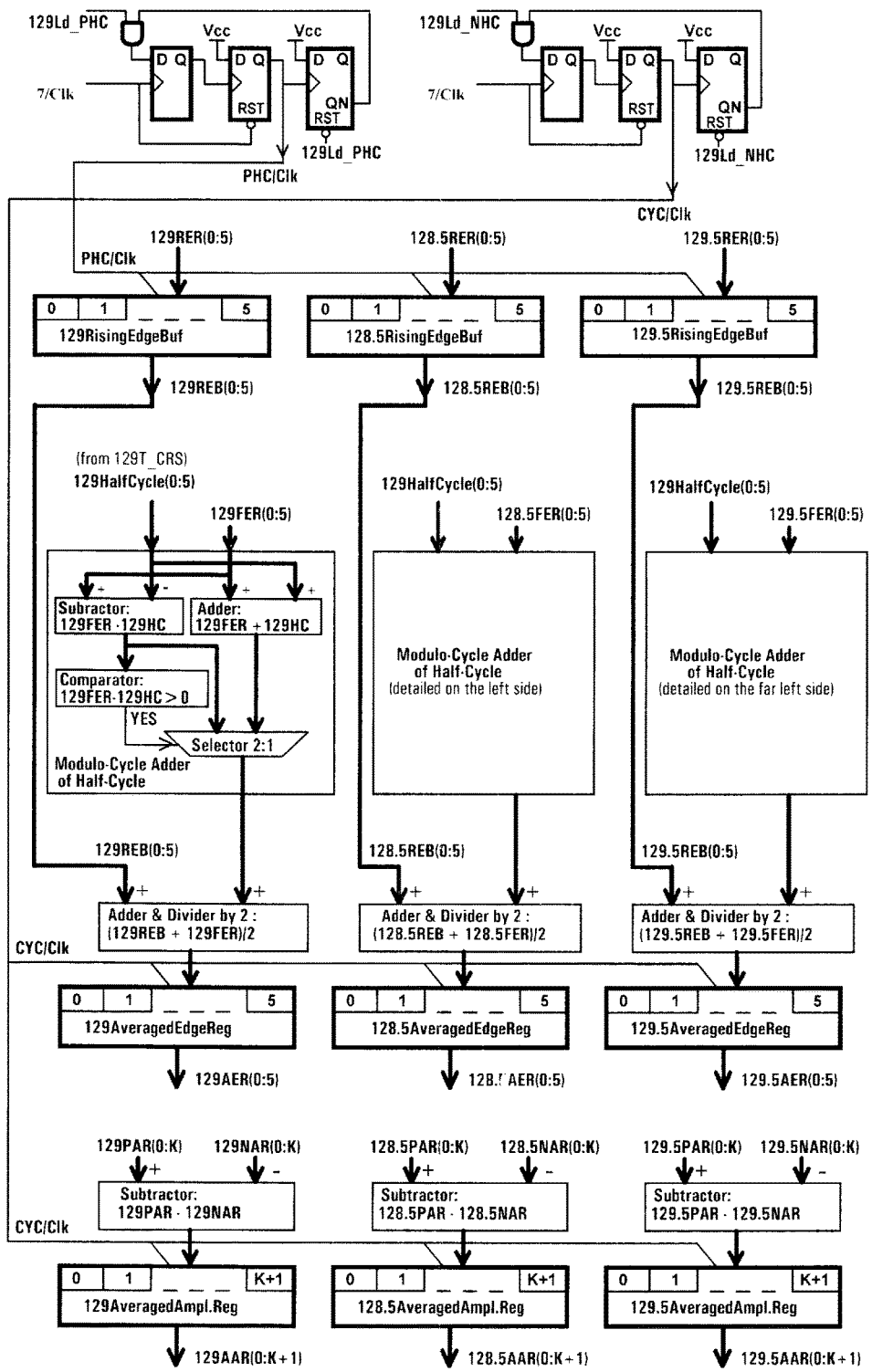

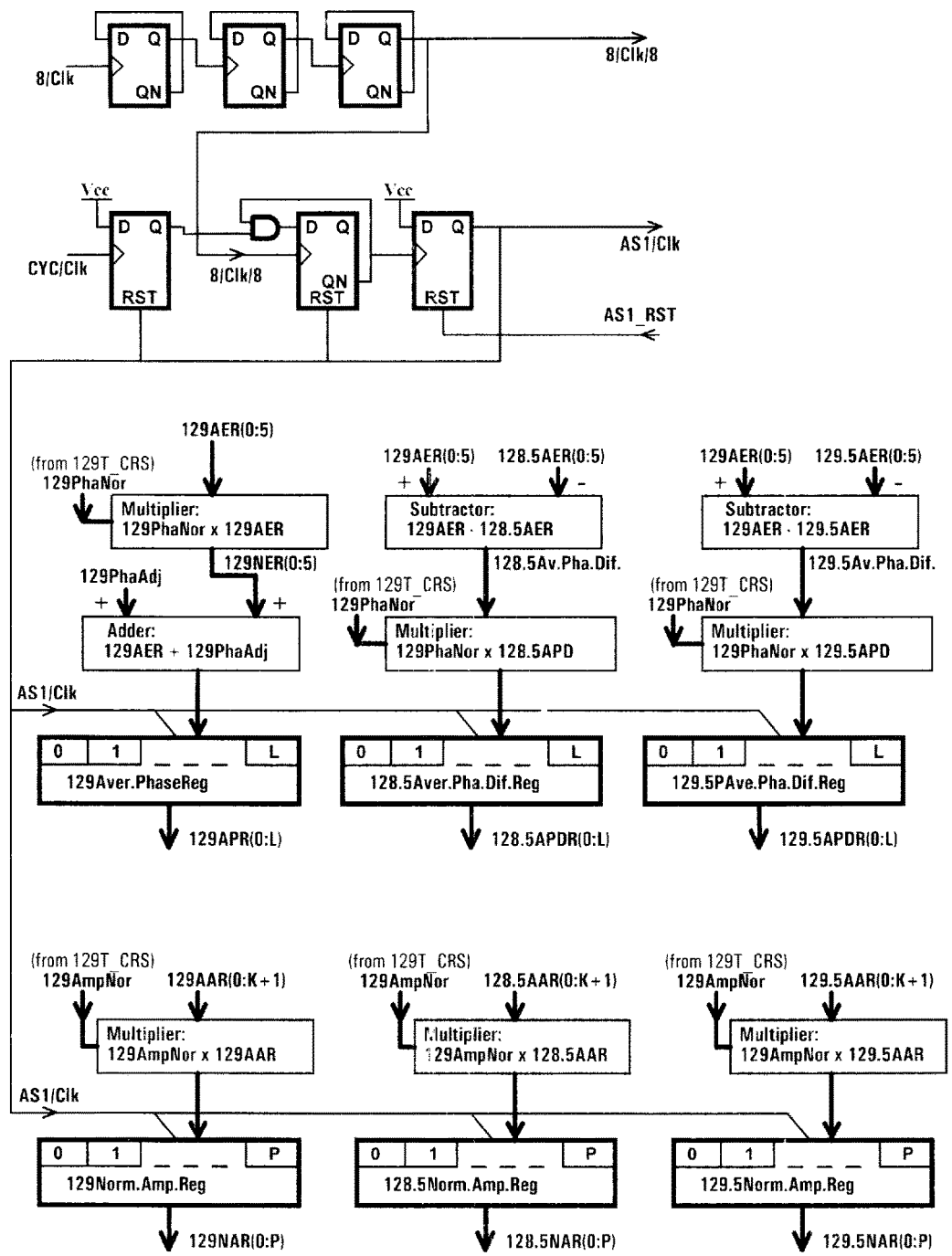
FIG.8 129T / 128.5ST / 129.5ST Amplitude & Phase Normalization

FIG.9A Accessing Coefficients for 129T Compensation for 129.5T Noise
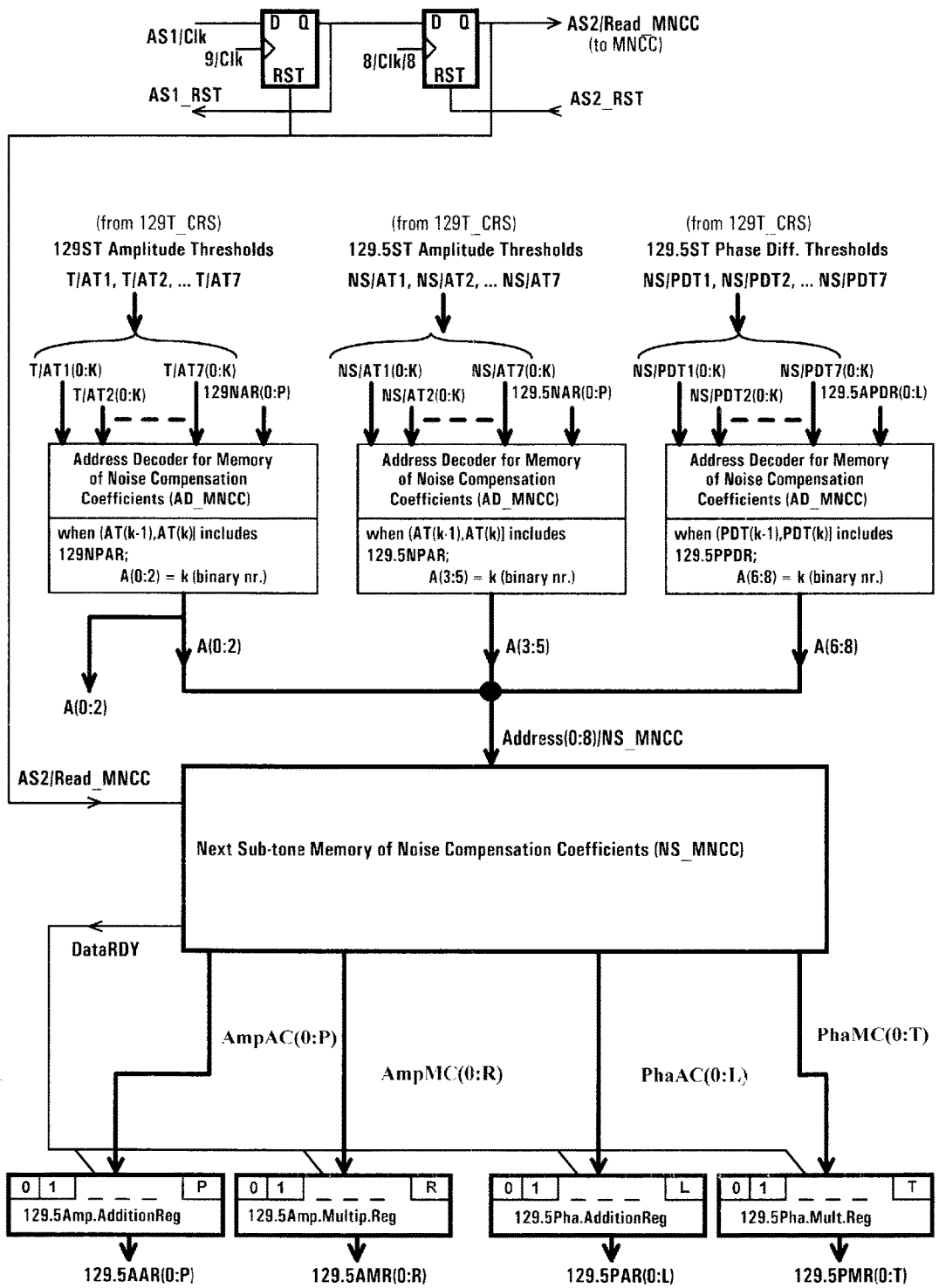

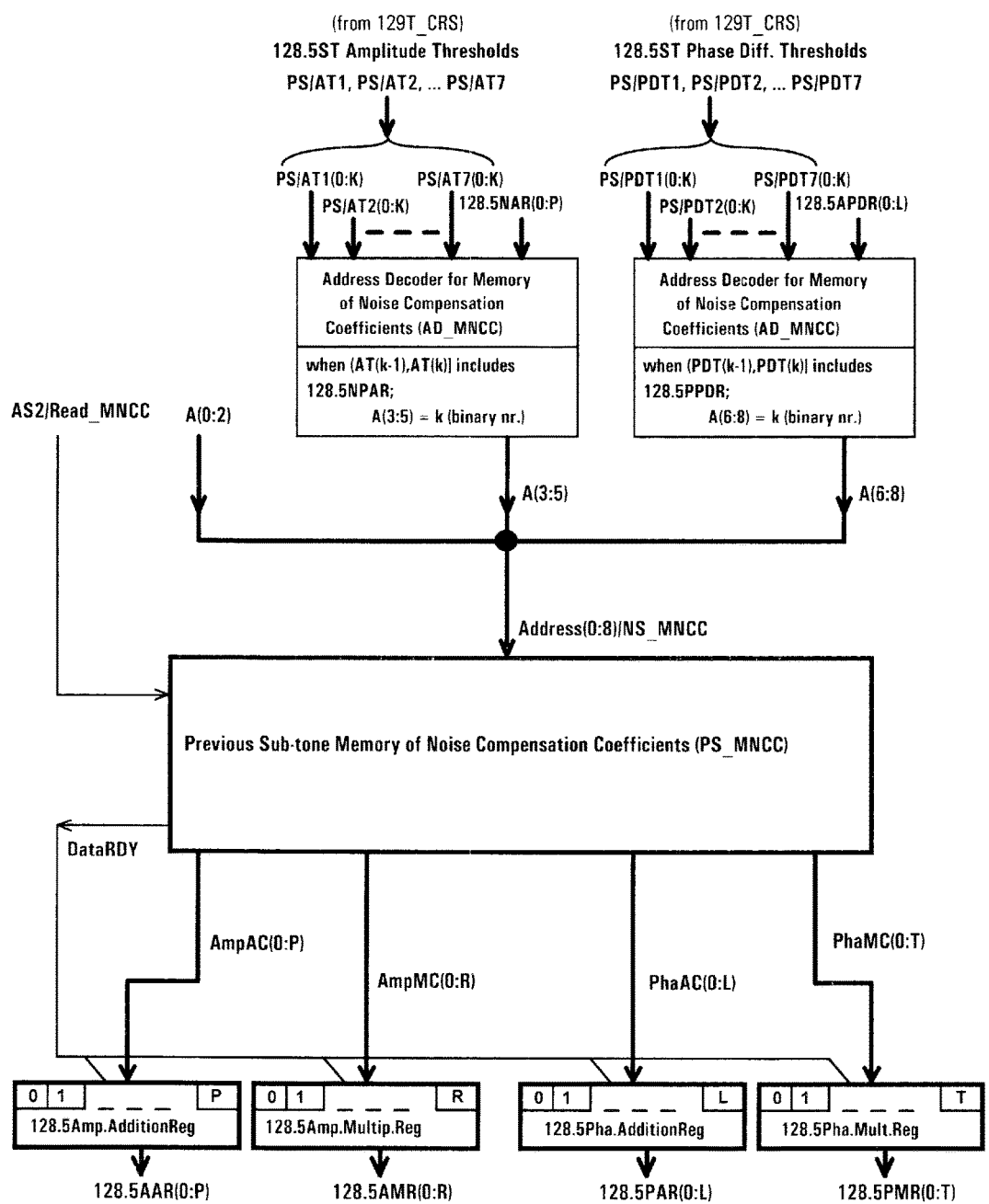
FIG.9B Accessing Coefficients for 129T Compensation for 128.5T Noise

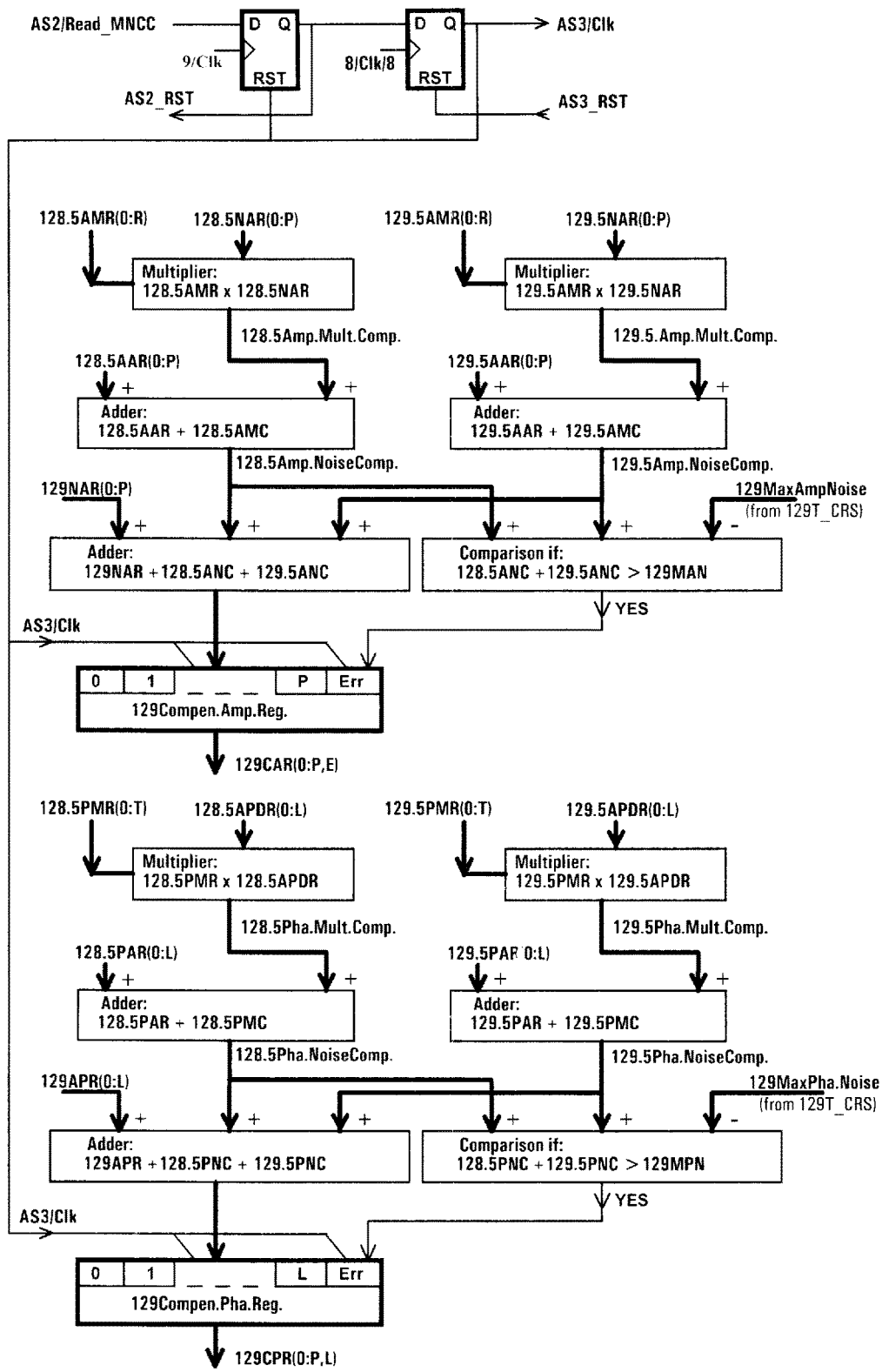
FIG.10 129T Amplitude & Phase Compensation with 128.5ST & 129.5ST Noise Estimates

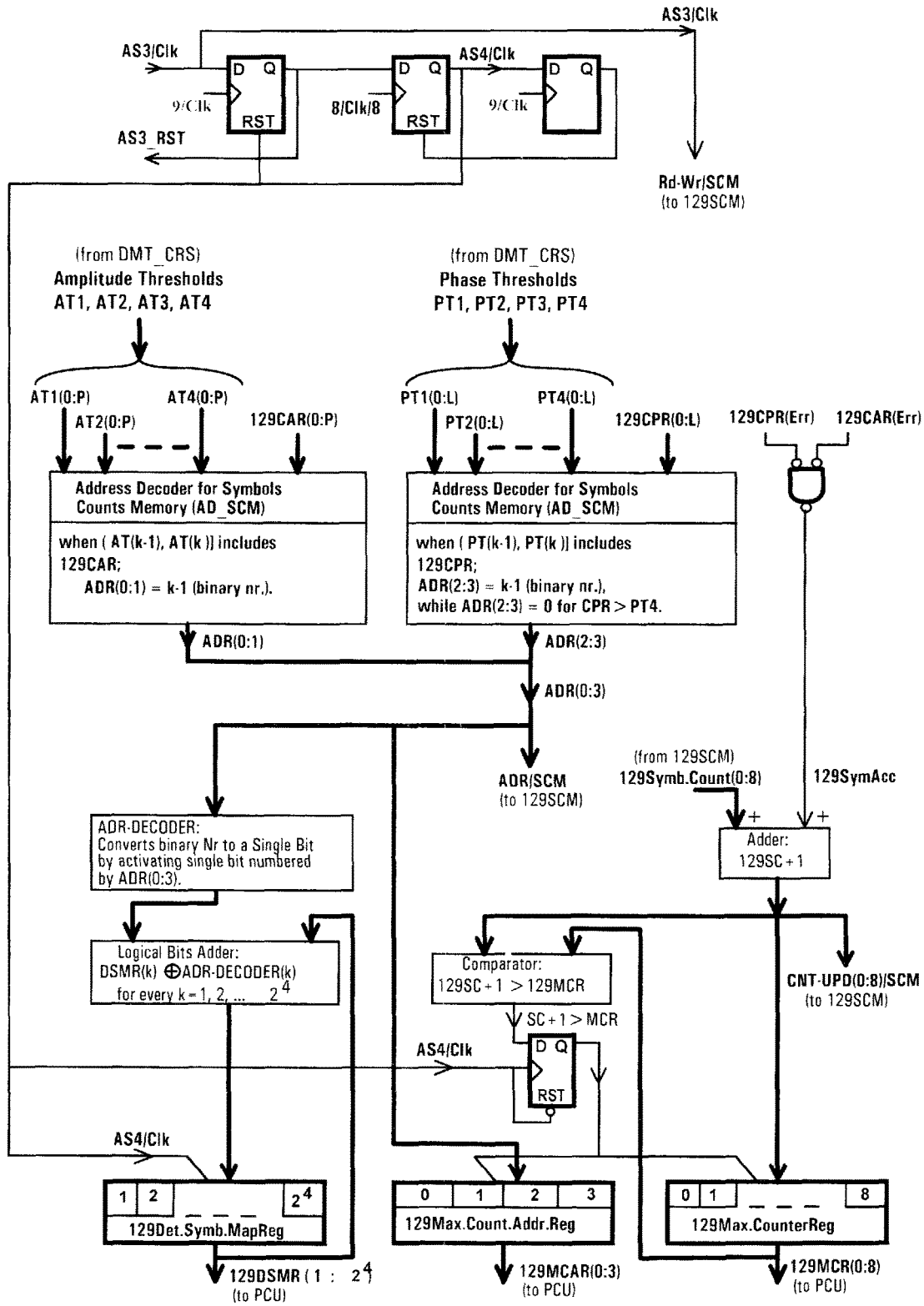
FIG.11 Recovery and Registration of 129T Frame Symbols.

FIG.12A Time Slots for Sub-Clocks driving consecutive Processing Stages

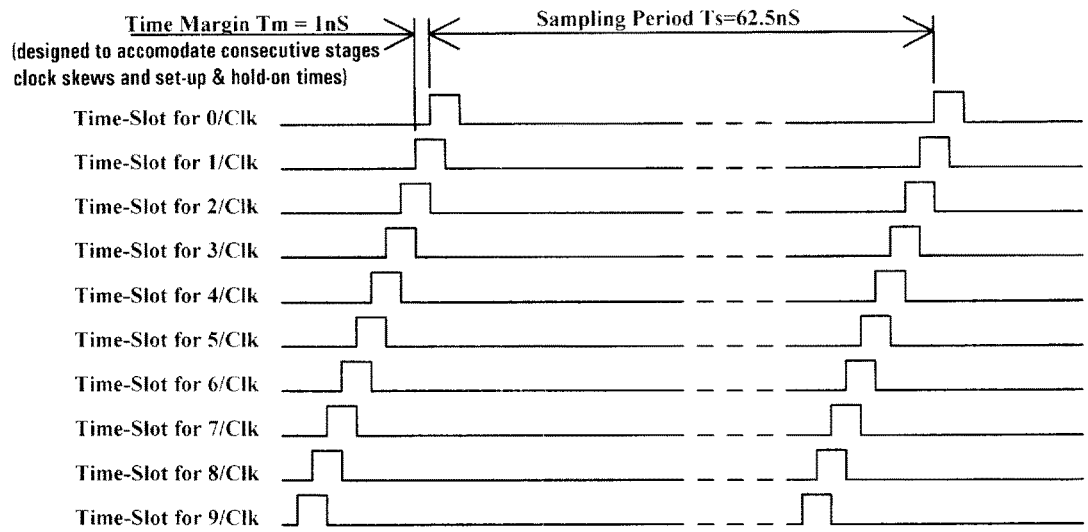

FIG.12B Circular Sub-Clocks driving consecutive bits of Circular Processing Stages

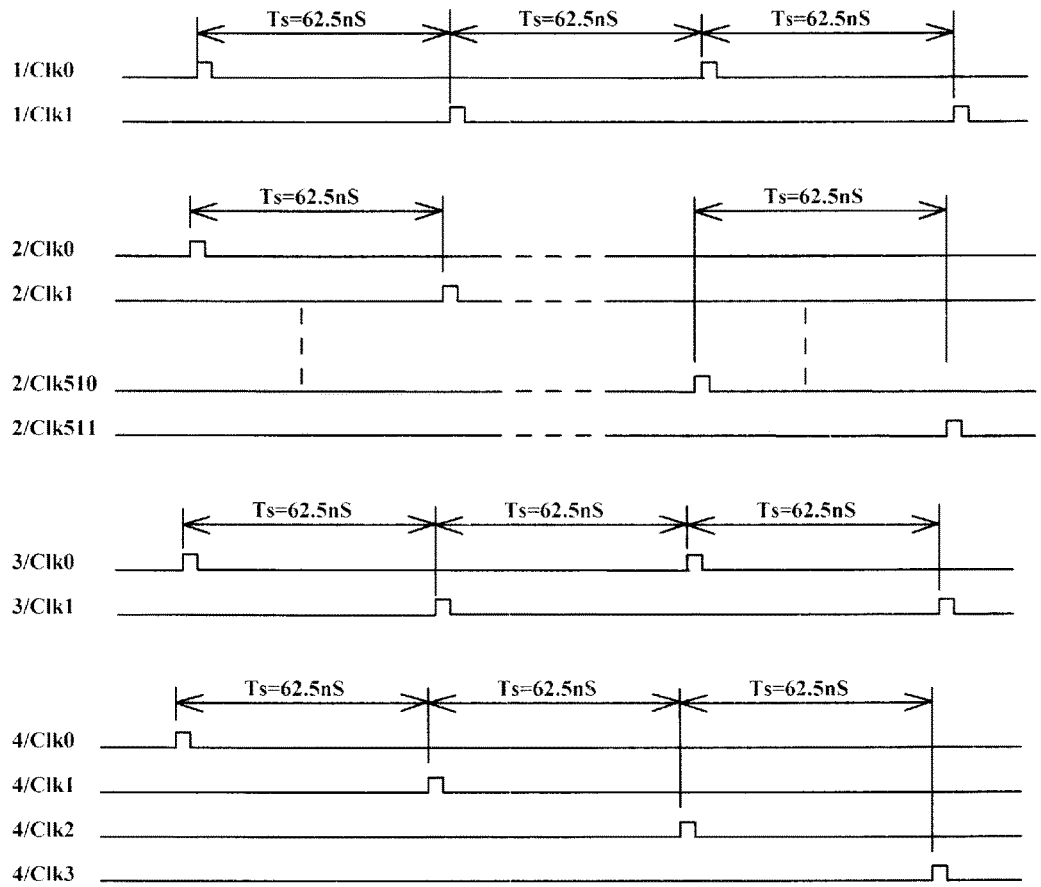

Note:
While the time-slots define phase displacements assigned to sub-clocks; such time slots are filled periodically with circular sub-clock pulses, as it is required for driving specific bits of every circular register representing processing stage of circular pipelin

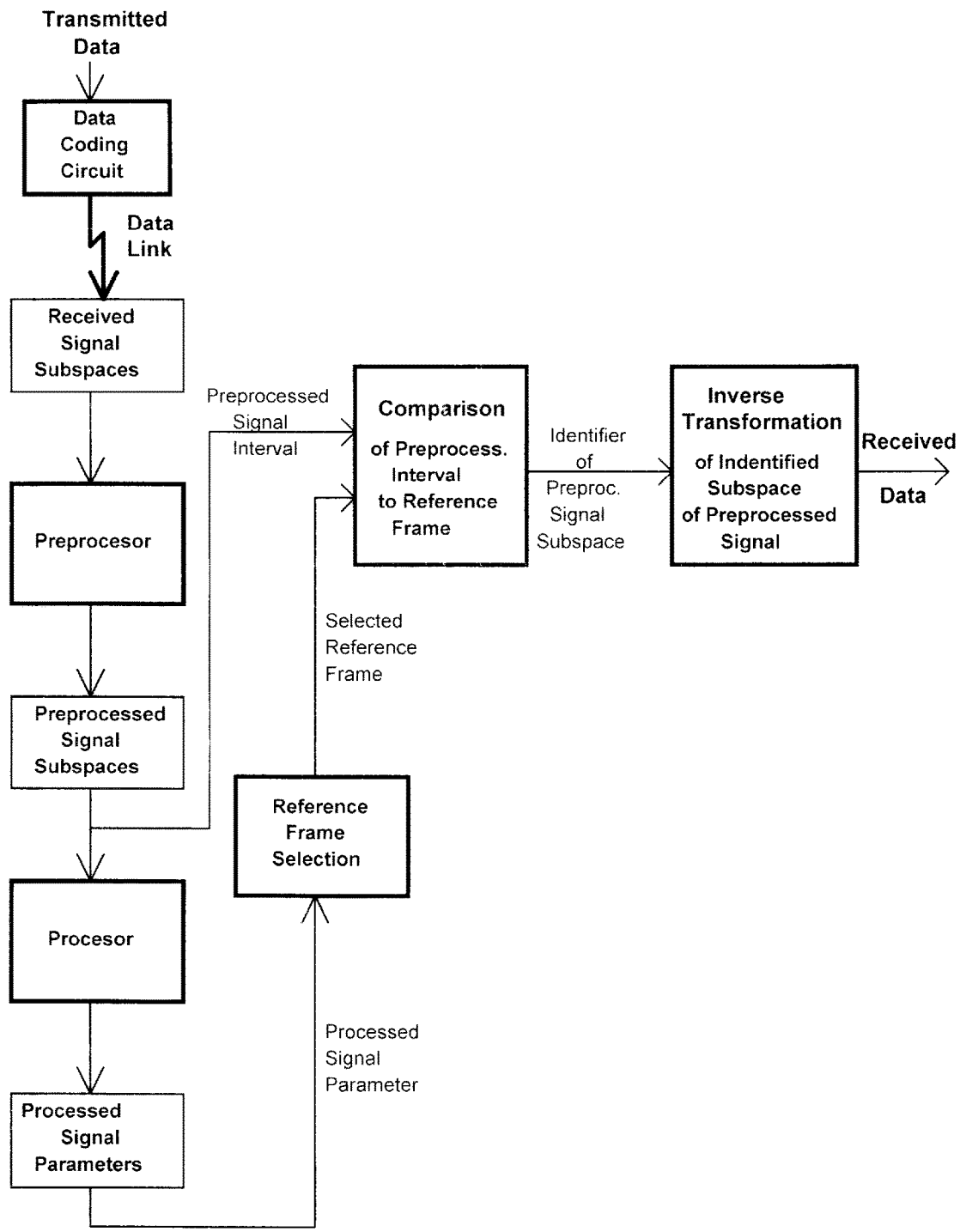
FIG.13A Data recovery from preprocessed signal subspaces using processed signal parameters (DRPS PSP)

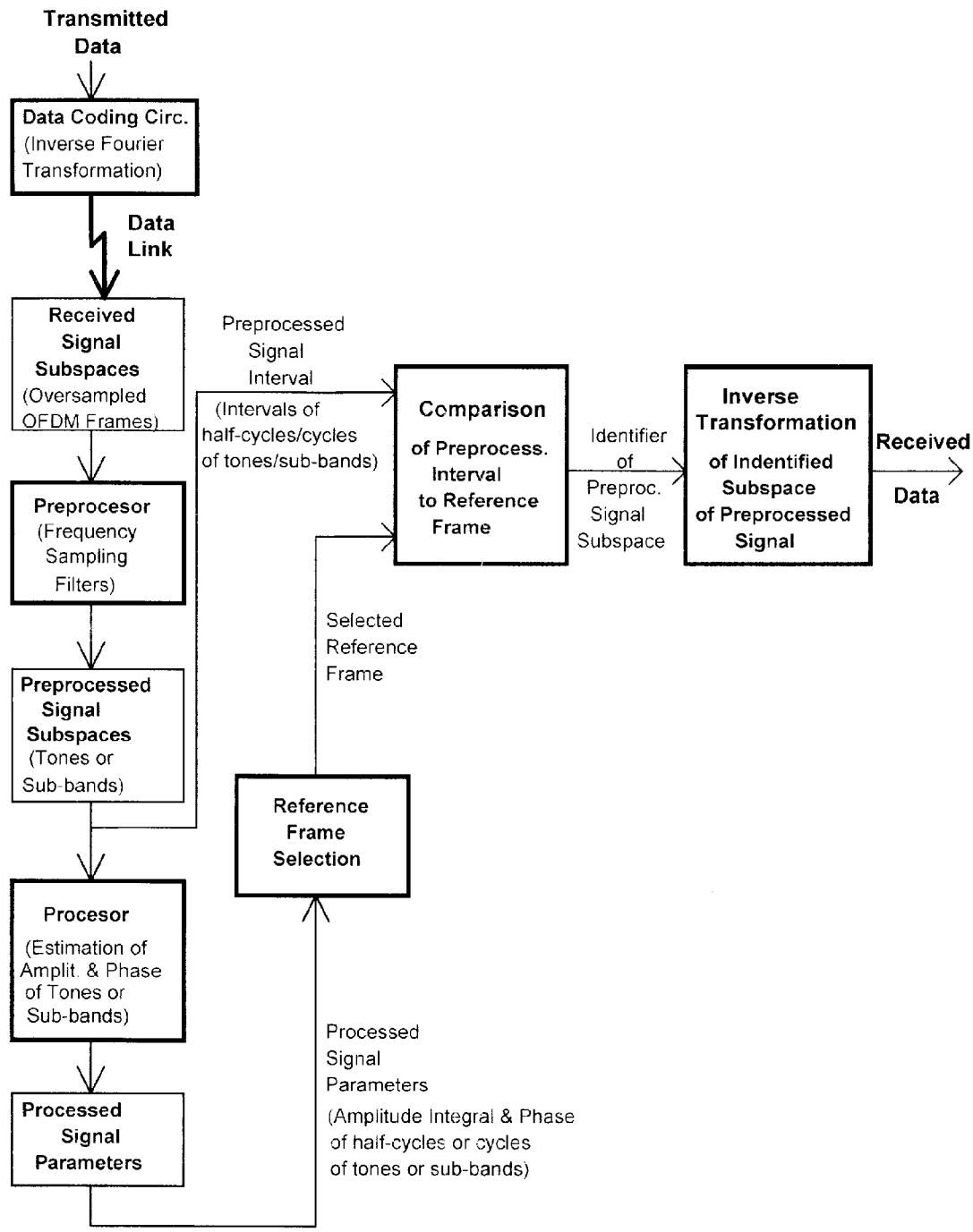
FIG.13B Data recovery from preprocessed subspaces of OFDM signal using processed signal parameters (DRPS PSP OFDM)

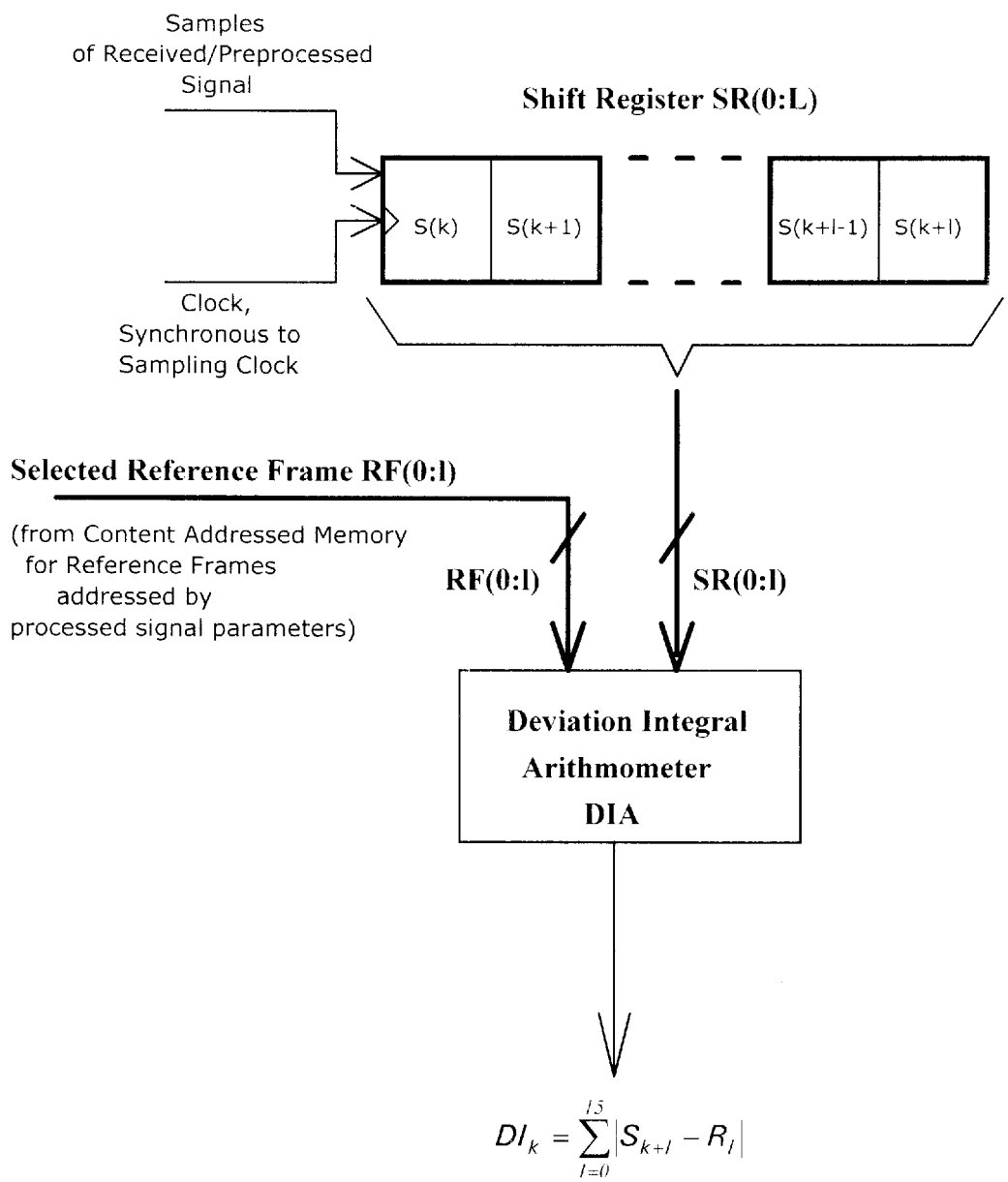
FIG.13C Comparator of signal interval to reference frame (CSR)

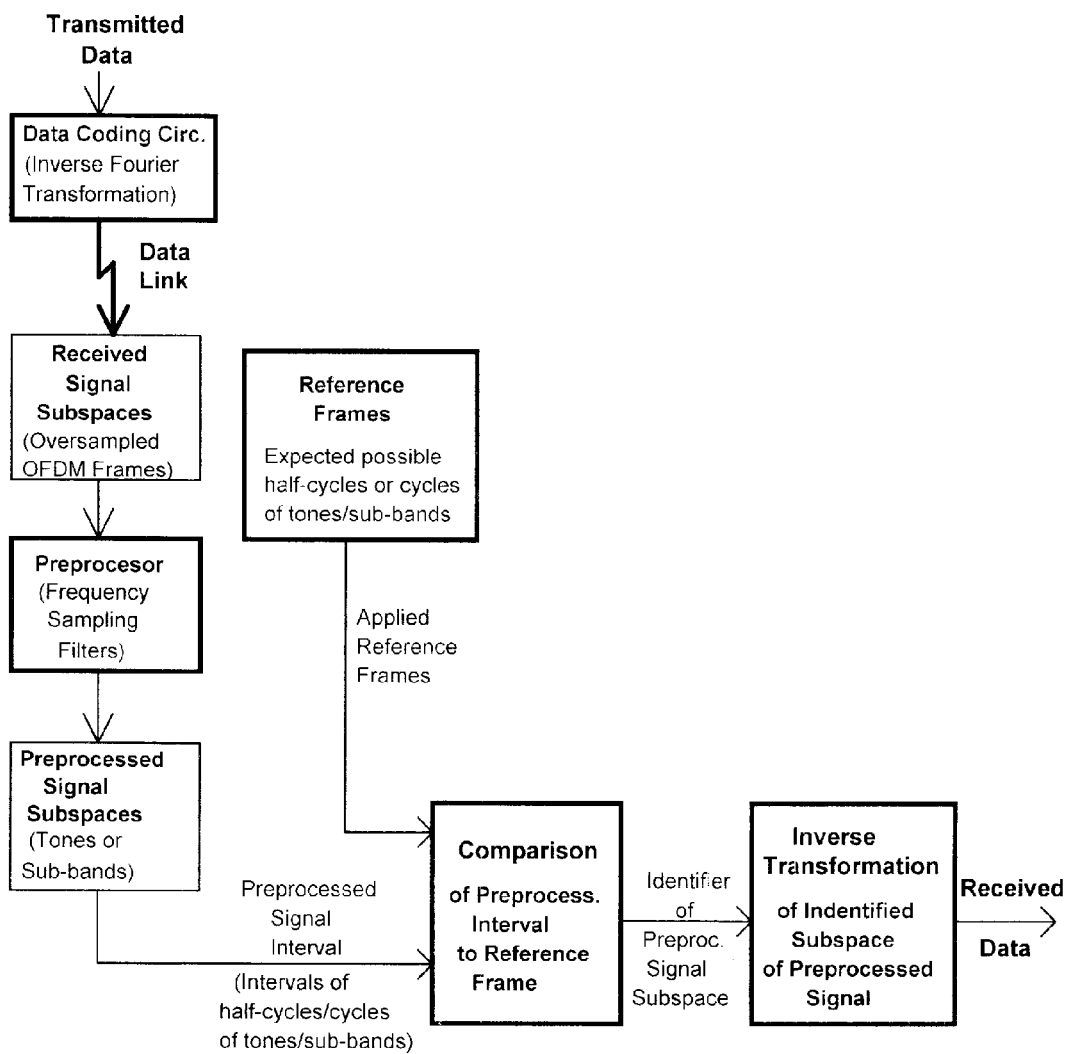
FIG.13D Data recovery from preprocessed subspaces of OFDM signal (DRPS OFDM)

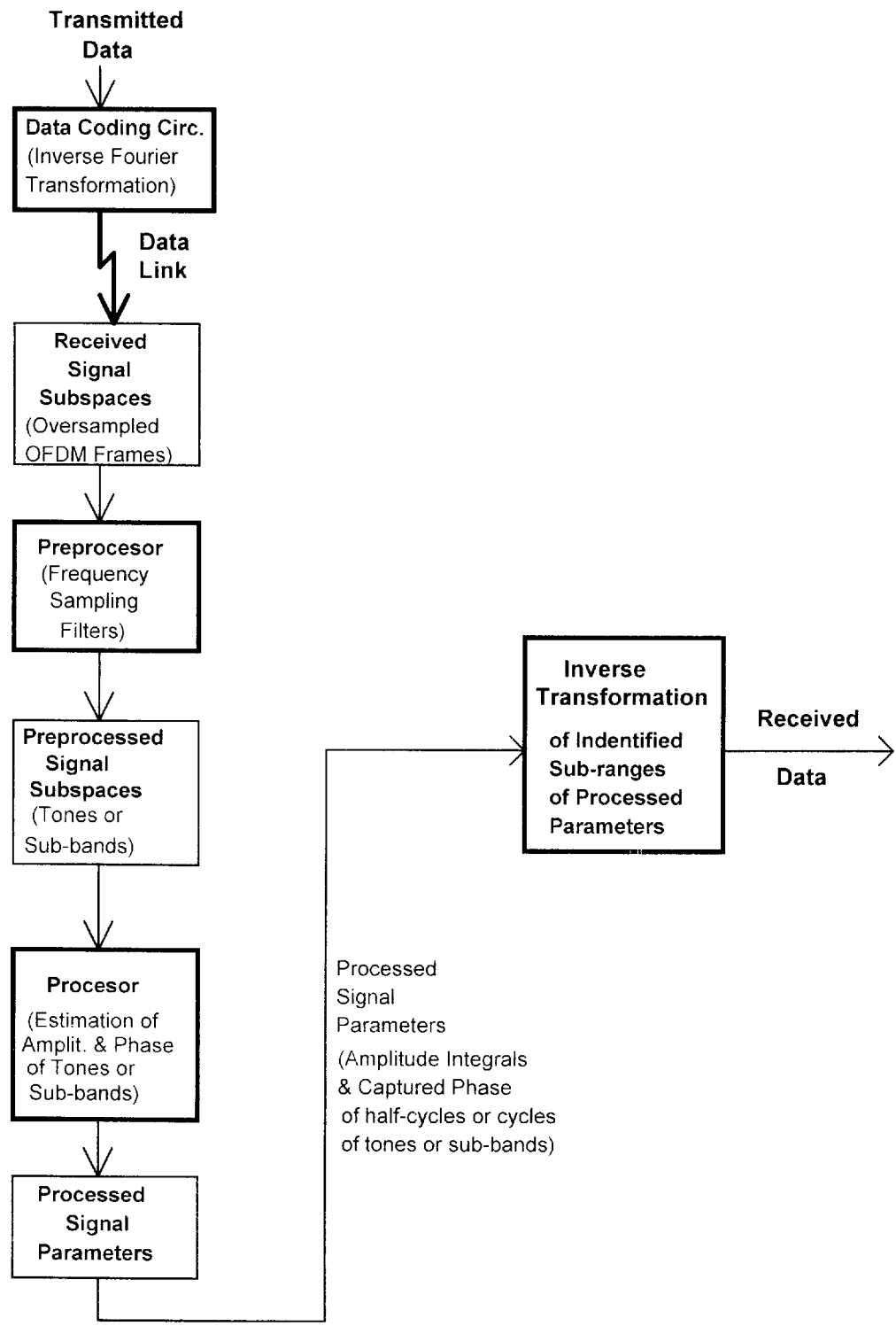

FIG.14 Direct Data Recovery using parameters of sub-band cycles (DDR PSBC)
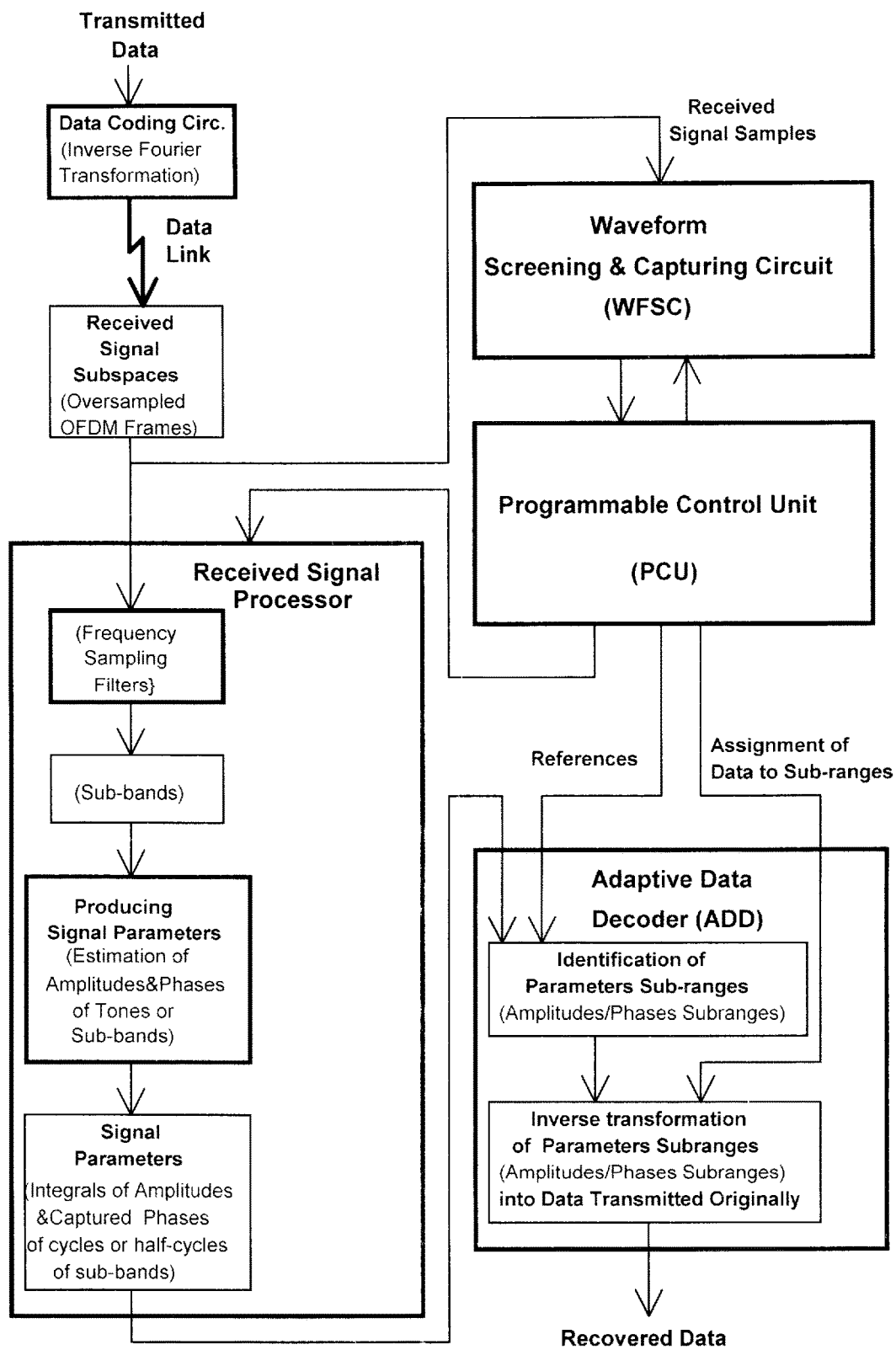

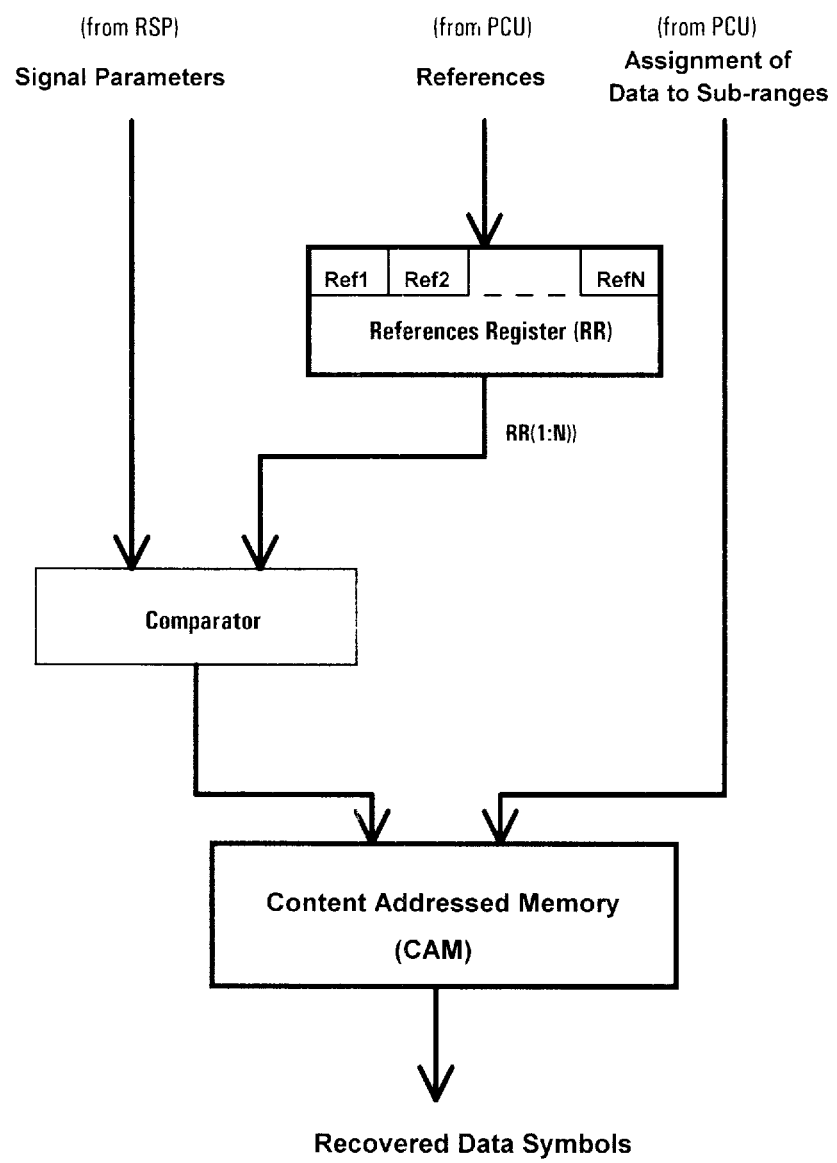
FIG.15 Adaptive Data Decoder (ADD) for DDR PSBC

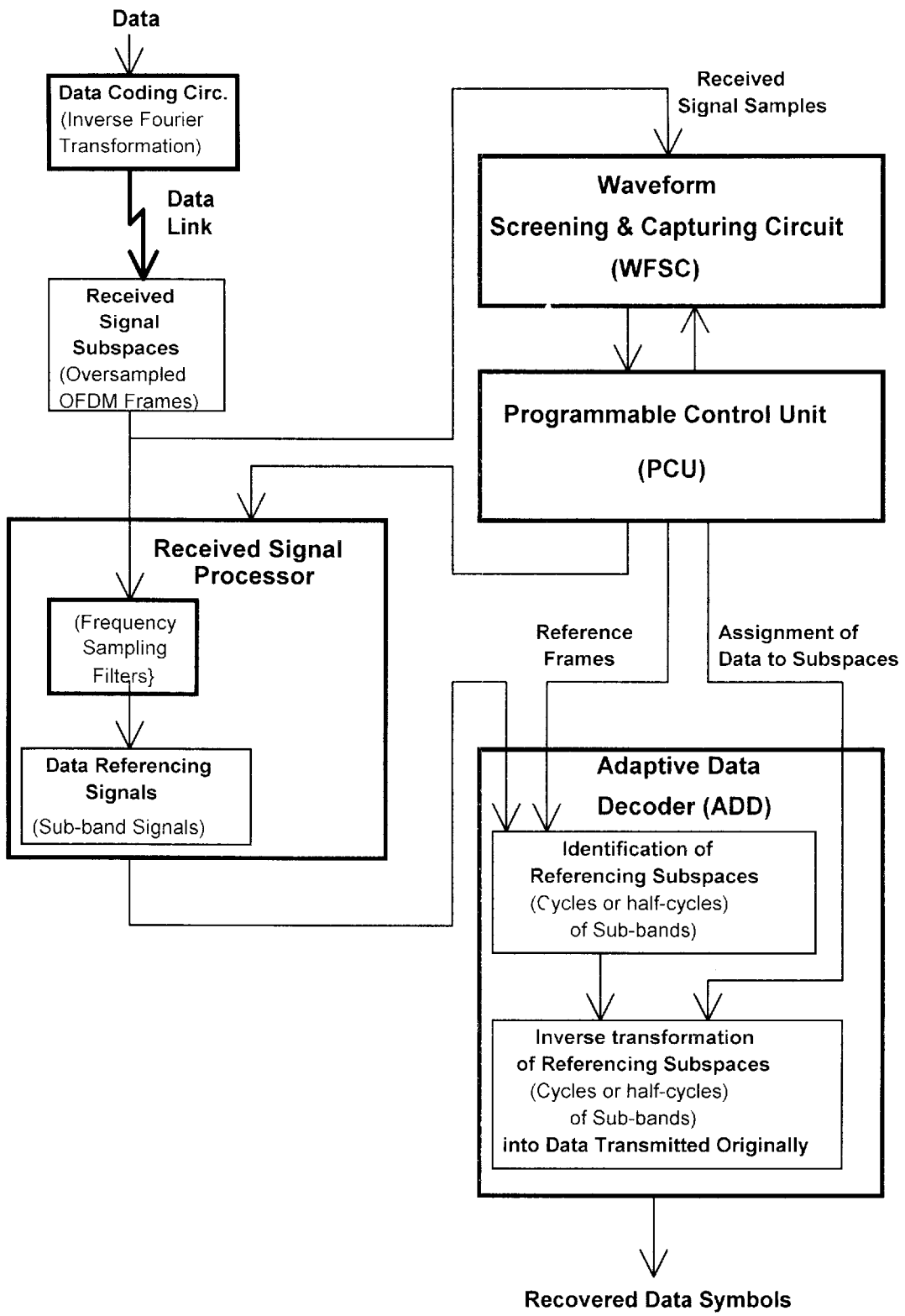

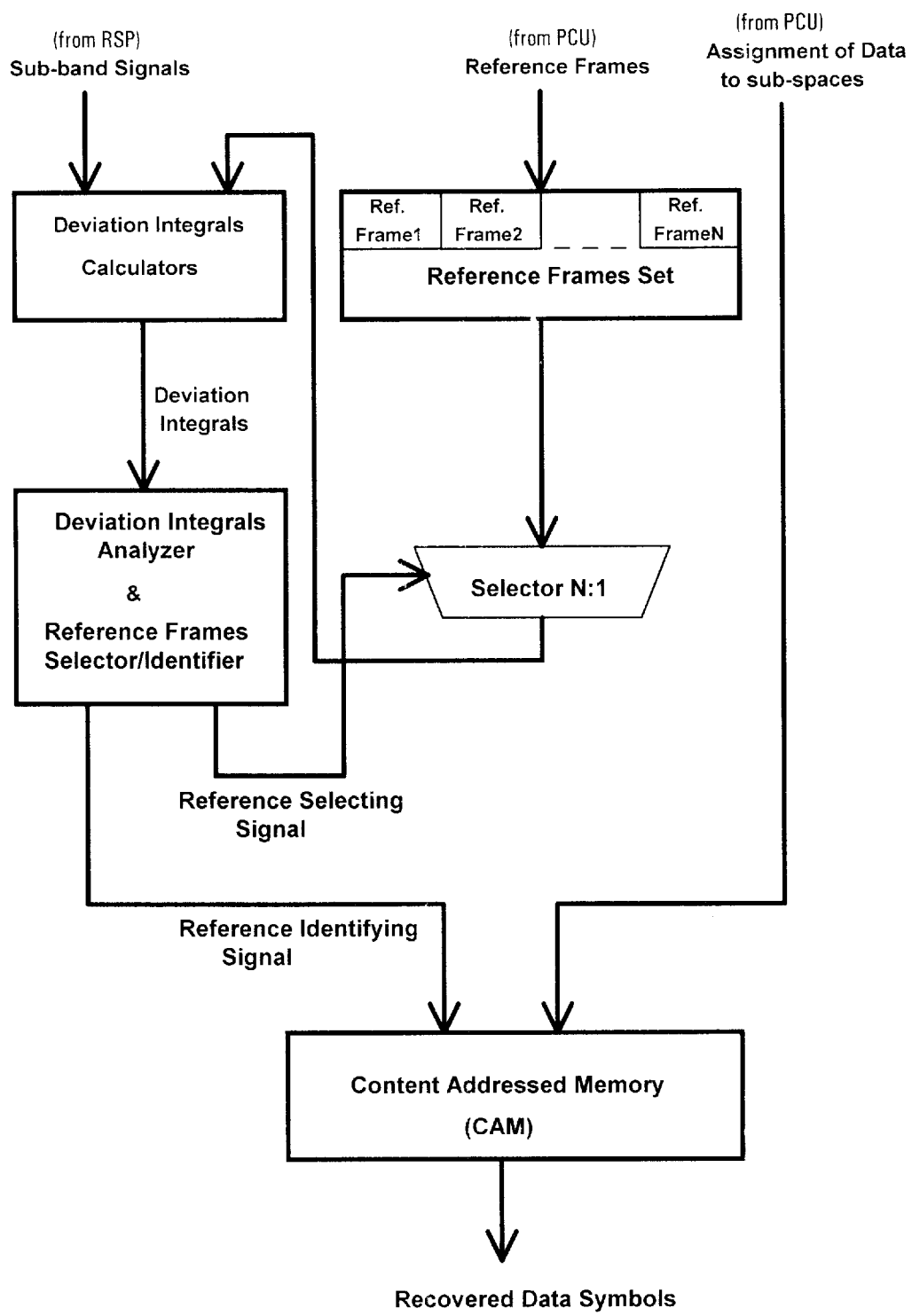
FIG.17 Adaptive Data Decoder (ADD) for DDR SBS

FIG.18 Direct Data Recovery using parameters of sub-bands (DDR PSB)
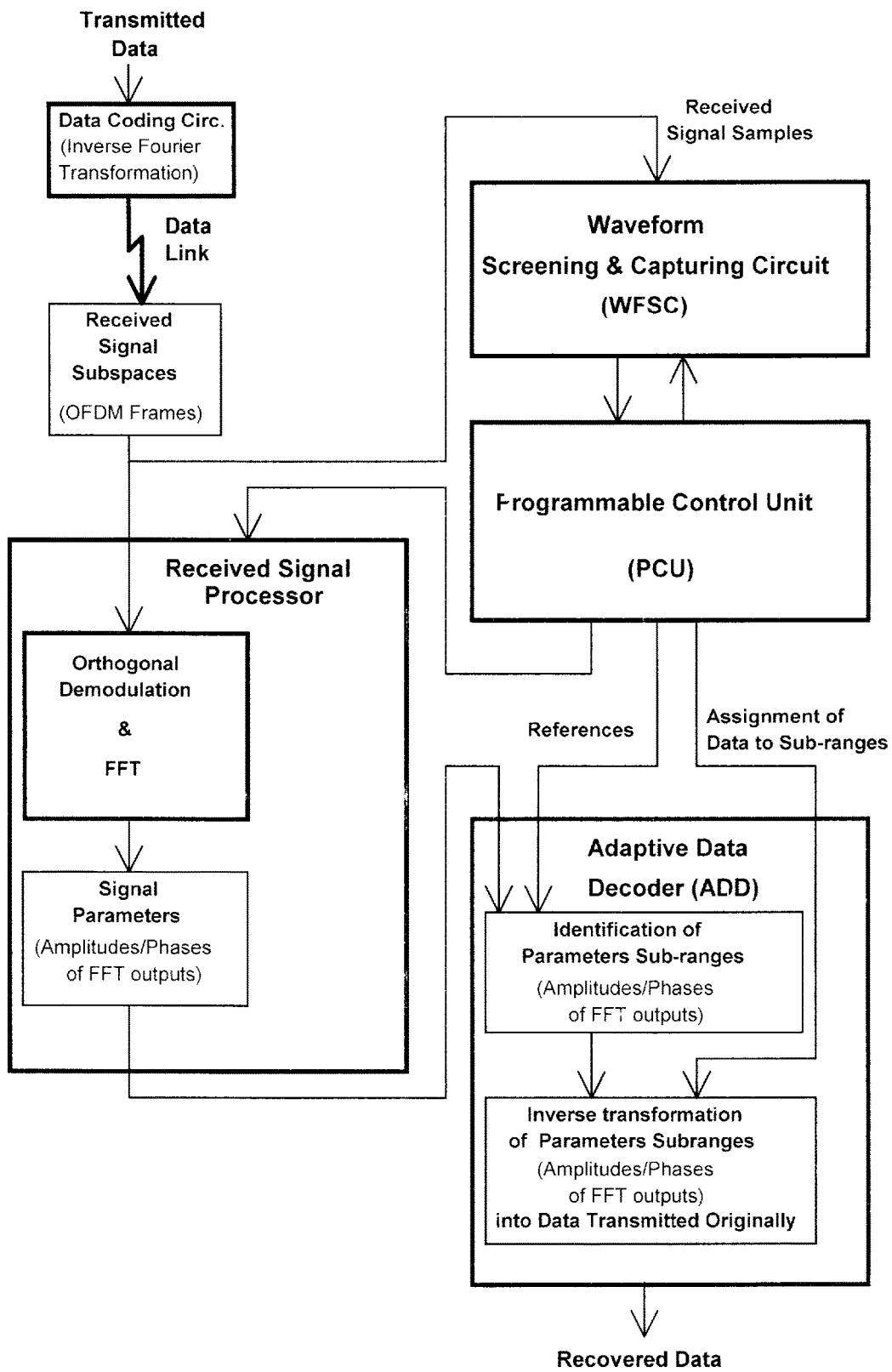

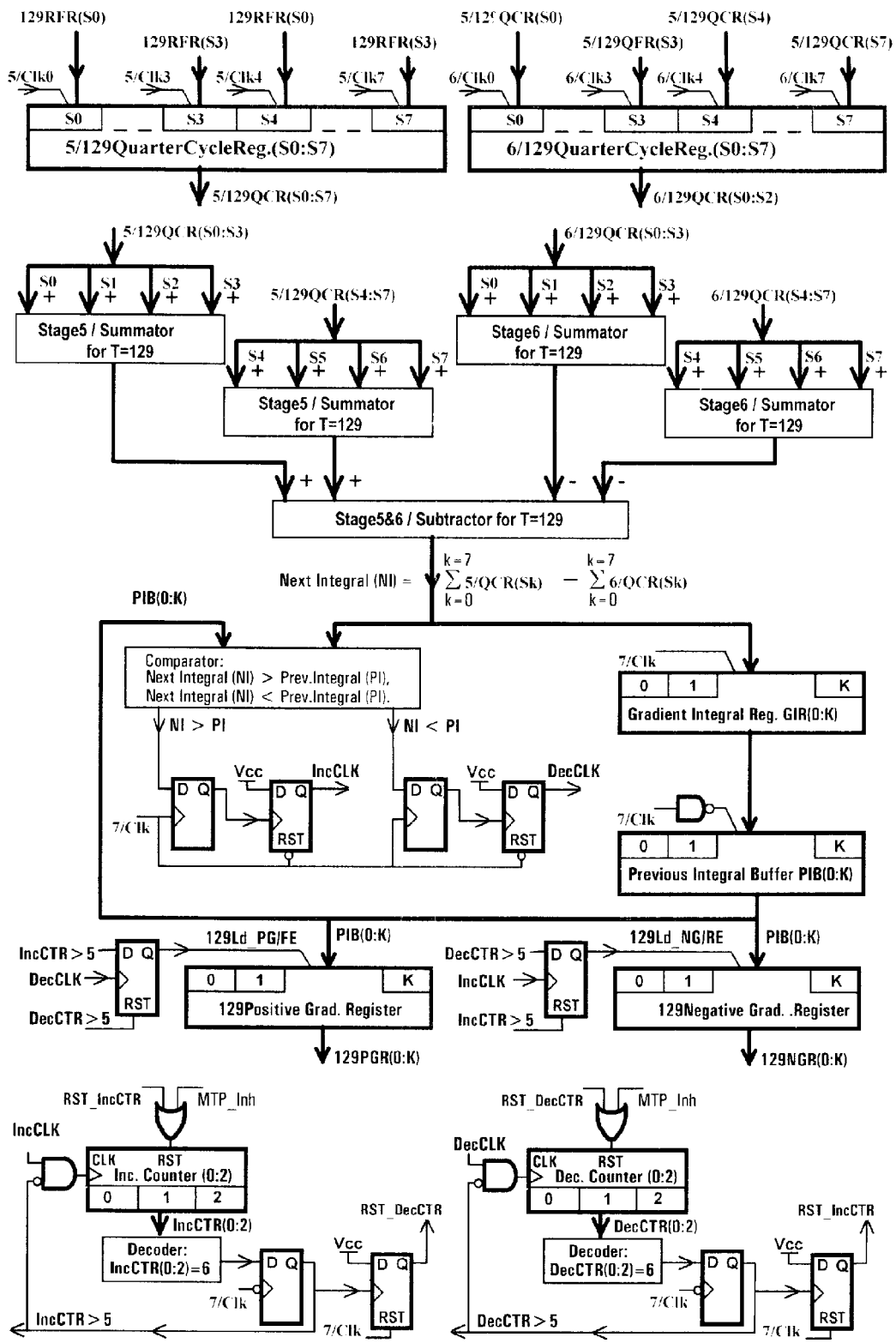
FIG.19 Half-Cycles Gradient Integration & Registration for 129 Tone

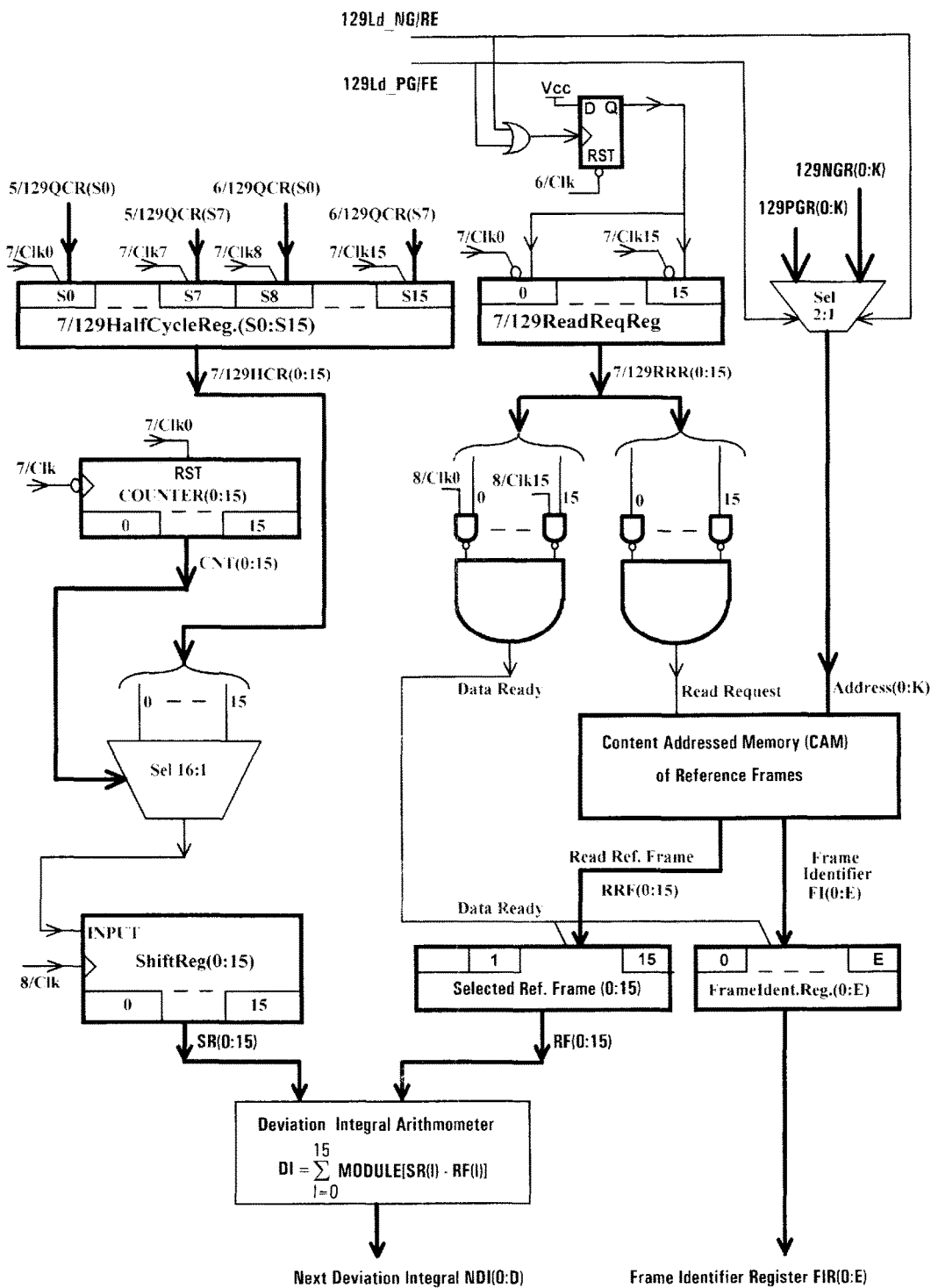
FIG.20 Derivation of Deviation Integrals

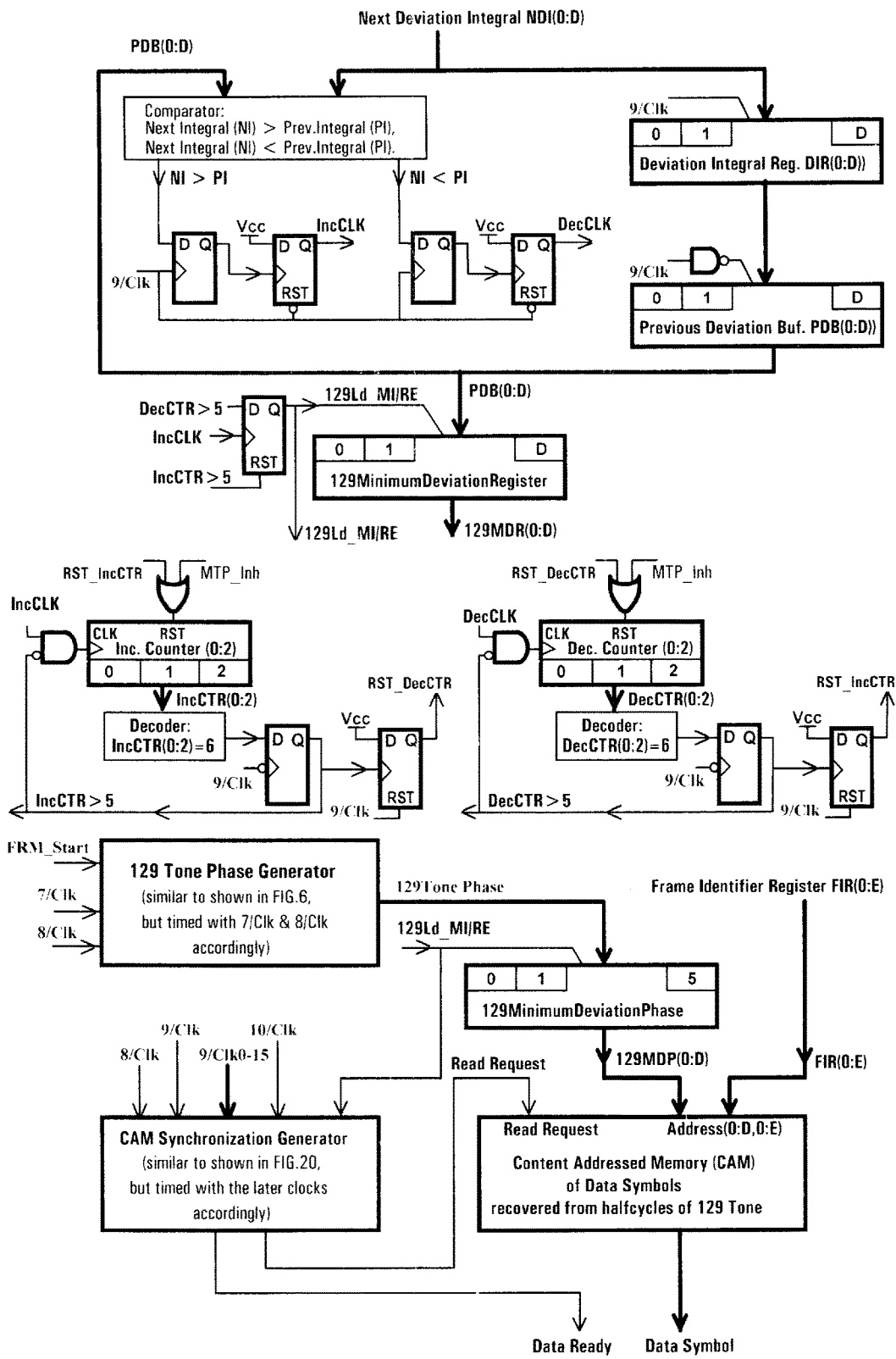
FIG.21 Inverse Transformation of Referencing Subspaces

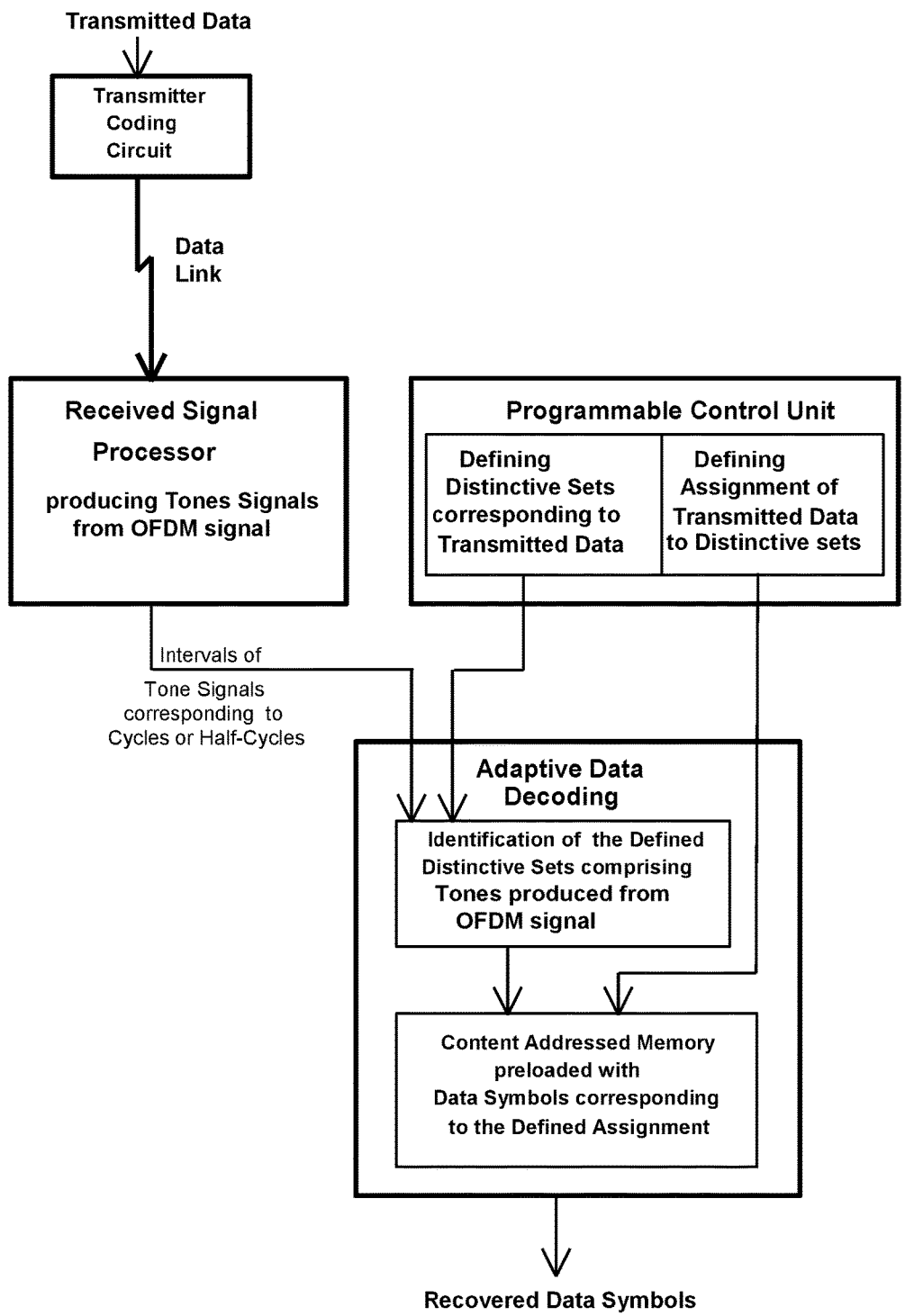
FIG.22 Adaptive Data Decoding from intervals of tone signals

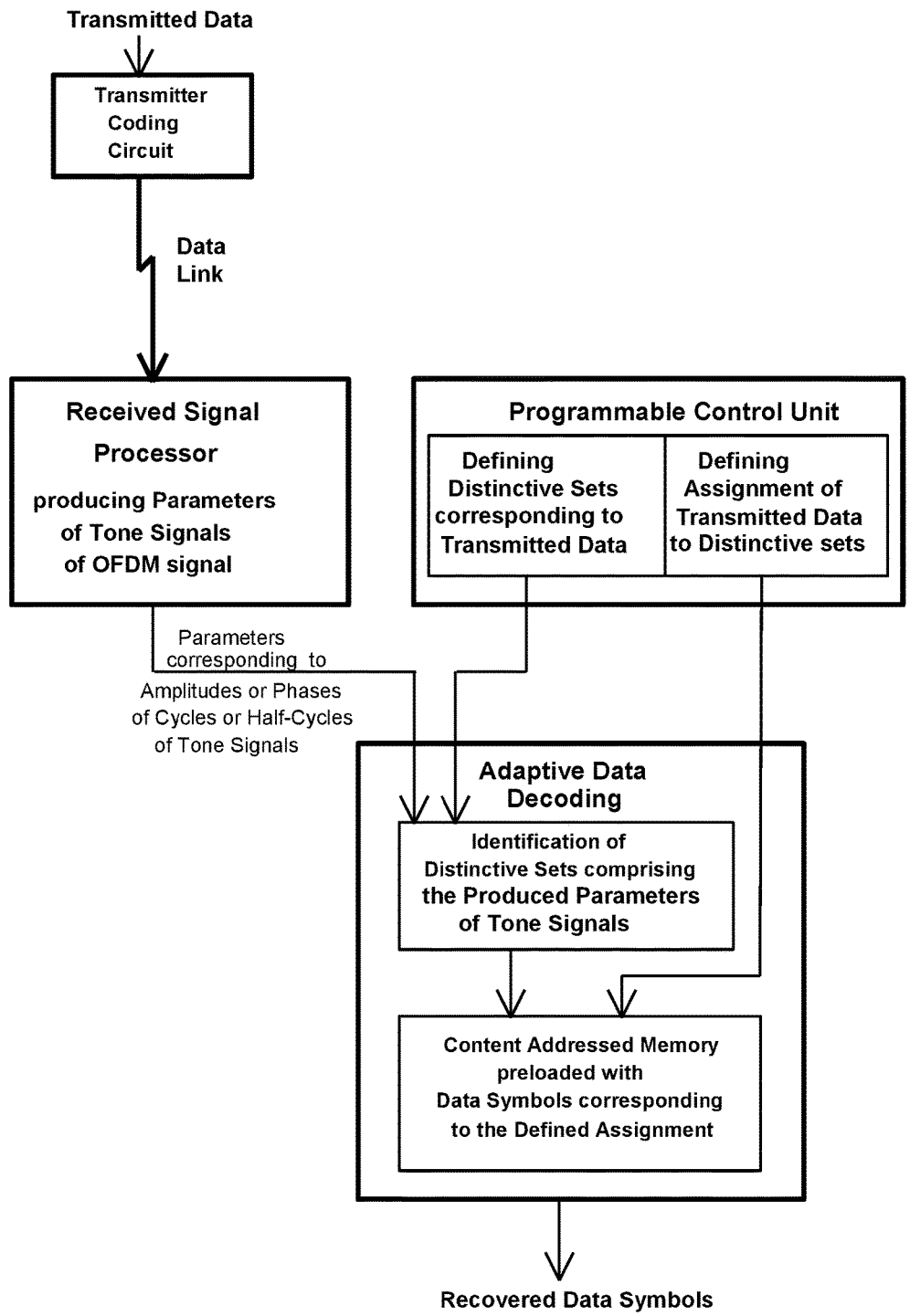
FIG.23 Adaptive Data Decoding from parameters of tone signals

ADAPTIVE DATA RECOVERY

This application is Continuation and claims priority benefits of U.S. non-provisional application Ser. No. 14/099,907 filed on Dec. 6, 2013 and issued as U.S. Pat. No. 9,136,891 on Sep. 15, 2015 wherein the Ser. No. 14/099,907 is incorporated herein by reference in its entirety as if fully set forth herein, wherein:

the Ser. No. 14/099,907 is Continuation In Part and claims priority benefits of U.S. non-provisional application Ser. No. 13/844,722 filed on Mar. 15, 2013 and issued as U.S. Pat. No. 9,100,165 on Aug. 4, 2015.

BACKGROUND OF THE INVENTION

1. Field of the Invention

This application includes a direct data recovery (DDR) based on reversing transmission channel transfer function, in order to achieve a direct recovery of original data and synchronizing clock from received signals affected by all deterministic and random distortions introduced by the channel.

The DDR can eliminate an intermediate recovery of signal transmitted originally from received signal, required in conventional solutions before actual data recovery can be made.

Therefore DDR can prevent signal processing errors added by such intermediate recovery and reduce power consumption and computing resources required in conventional receivers.

The DDR is applicable to communication channels including Non Return Zero (NRZ) or Pulse Amplitude Modulation (PAM), OFDM Multi-carrier/Multi-tone, Carrierless Amplitude Phase (CAP), Frequency Modulation (FM), Phase Modulation (PM).

The DDR can be applied in data recovery systems for wireless, optical, or wireline communication and in local or remote measurement systems.

The DDR shall be particularly advantageous in system on chip (SOC) implementations of data recovery systems.

Such DDR includes utilization of inverse signal transformation (IST) presented in the parent application as comprising a noise filtering with inverse transformation (NFIT) and phase and frequency recovery techniques (PFRT) described therein by separate subsections taken from their application Ser. No. 12/047,318 (issued as U.S. Pat. No. 8,284,877) and Ser. No. 11/931,026 (issued as U.S. Pat. No. 8,374,075) accordingly.

Some elements of asynchronous data recovery (ADR) solutions presented earlier by the same applicant in PCT/CA06/001332, can be useful in explaining a background field to DDR contributions in PAM and coherent optical communication.

2. Background of DDR 2.1 General Background of DDR and IST

Conventional methods and systems for data recovery are directed to transformation of specific received signals into shapes similar to those transmitted originally before any decoding of data, as they use fixed data decoding schemes, applicable only to such similarly shaped signals, in order to decode data encoded originally in the transmitter.

Such conventional solutions, focused on recovering original signal shapes from specific received signal shapes, can not be effective in reversing dynamic and random signal distortions introduced by data links, since:

said distortions are projecting said original signal shapes into received signal subspaces instead of transforming them into said specific received signals;

said conventional solutions are not directed to applying varying data decoding schemes responding to said transfer function of transmission channel and current characteristics of received signal.

In conditions of constantly growing data rates, data links complexity and spectrum utilization, distortions introduced by transmission channels are growing into major parts of signals received from remote sources in electronic environments contaminated highly.

Therefore the conventional methods based on said recovery of original signal required by said fixed decoding, become comparable to chasing a butterfly into a route leading it into a fixed net instead of letting butterfly to fly freely and moving the net into its path.

The IST is based on a fundamentally different principle of operation than such conventional systems, because mobile adaptive decoding is applied directly to said received signal space, distorted by the transmission channel, instead of applying such fixed decoding to the original signal recovered from said received signal space.

Such IST includes utilizing a relation between a subset of received signal space (comprising a particular received signal) and data encoded originally into this signal, wherein such relation includes said inverse transformation of channel function.

Furthermore said conventional data recovery from received signal requires complex processing for achieving said recovery of original data carrying signal, wherein such complex processing is applied continuously to a waveform of over-sampled received signal.

IST replaces such complex processing of received signal with a direct application of reference frames to the received signal waveform, wherein said reference frames, representing expected shapes of received signal intervals, are compared with received signal shapes in order to identify original signal shapes which these received signal shapes correspond to.

Still furthermore said reference frames and/or their parameters can be derived by a background processing responding to changes of transmission channel which are by many orders slower than changes of transmitted signal, while said recovery of original signal shape requires a real time processing responding to the changes of transmitted signal which are by many orders faster.

Therefore such conventional solutions, spending resources on such "real time reconstruction" of very fast original signals instead of focusing on said more direct data recovery of original data from said received signal subspaces, can not be efficient in utilizing processing resources or minimizing power.

Consequently, conventional data recovery methods and circuits have limitations causing that only linear time invariant filters (LTI filters) can be used in majority of serial communication links.

Such LTI approximations impair filtering efficiency of the majority of the communication links which are non-linear and time variant and have changing in time characteristics.

Furthermore due to such limitations of conventional solutions; even rarely used non-linear and/or adaptive filters using adaptive algorithms to accommodate changing in time characteristics of transmission channels, can accommodate only limited and slowly changing portions of signal nonlinearity and/or distortion caused by nonlinear and/or changing in time characteristics of transmission channel.

It is the objective of DDR to alleviate such limitations by enabling more efficient accommodation of line-load, non-linearity and time variant quick changes of transmission channel such as those caused by cross-talk and inter-band interference from adjacent transmission channels.

Non-provisional U.S. patent application Ser. No. 11/931,026 by Bogdan issued as U.S. Pat. No. 8,374,075, introduced utilization of reference frames for detecting data carrying intervals of received signals named therein as received signal edges.

Later than this 931026, PCT/CA06/001332 by Bogdan (see WO 2007/009266), disclosed improved utilization of such edge detection techniques including a comparison of said received signal with edge masks selected adaptively. Similar tools can be also utilized in next inventions such as DDR and ADD presented herein.

However the 001332 still requires said recovery of original data carrying signal or its data defining parameters which involves more complex processing and is much less efficient in reversing distortions and interferences introduced by the transmission channel.

Therefore DDR contributes the fundamentally different principle of operation explained above and further below, in order to enable major improvements in signal processing efficiency and accuracy over those enabled by the earlier 001332 and the other conventional solutions.

Most of earlier data recovery systems; require phase locking to the original transmitter's clock recovered from the distorted received signal. Such recovery of original clock has to be preceded by recovering an original shape of received signal, in order to minimize phase locking errors caused by signal distortions. Therefore such earlier systems implement frequency domain filters for noise reduction in the received waveform, and compensate line loads with a feedback signal connected from a receivers output to an input of the receiver.

Said phase locking eliminates immunity to high frequency phase noise exceeding bandwidth of receivers PLL.

Said frequency domain filters are inefficient in responding to changing high frequency noise and often attenuate high frequency data, while conventional line load compensation offers only delayed responses involving feedback signals which may compromise accuracy and/or stability of line receivers.

In particular, said frequency domain filters are conventionally used for recovering shape of original signal from serially transmitted pulses.

Since serially transmitted pulses must have widely variable lengths and frequencies, such frequency domain filters can not eliminate high frequency phase jitter and attenuate useful part of signal while filtering high frequency noise.

Consequently such-frequency domain filters are inherently inefficient and inaccurate in detecting phase of data carrying signals; while accurate and reliable phase detection is becoming essential for efficient modern communication based on NRZ/PAM, or PM over copper/fiber/wireless links.

Since such modern communication links utilize phases of signal transitions between limited set of signal levels or amplitudes for data encoding, said limitations in phase detection accuracy and noise filtering abilities reduce data rates and/or link lengths.

These earlier systems' limitations were partly addressed by solutions presented in the 001332, wherein:
a received signal is densely over-sampled and phases and amplitudes of data carrying pulses and phases of their edges are recovered without causing any signal attenuation;
and a number of data symbols contained in the pulse is determined by measuring length of such pulse instead of relying on sampling pulse amplitude with a phase aligned clock targeting a middle of symbol time periods.

In addition to the elimination of said phase alignment of a local receiver clock, the 001332 presents solutions directed to instant compensation of line load effects and crosstalk noise.

Nevertheless even the 001332, still requires said recovery of original data carrying signal or its data defining parameters.

Therefore it still has limited efficiency in inverting signal distortions introduced by data links, as they can not apply said direct data decoding in order to enable accurate and timely responses to said fast changes of the data carrying signals of high speed communication links.

2.2 Background of NFIT

The purpose of noise filters is to reconstruct original signal by reduction of received signal components representing noise and/or by enhancement of received signal components representing the original signal.

Limitations of conventional noise filtering methods and electronic circuit technologies cause that only linear time invariant filters (LTI filters) can be used in majority of serial communication links.

Such LTI approximations impair filtering efficiency of the majority of the communication links which are non-linear and time variant and have changing in time characteristics.

Furthermore due to such limitations of conventional solutions; even rarely used non-linear and/or adaptive filters using adaptive algorithms to accommodate changing in time characteristics of transmission channels, can accommodate only limited and slowly changing portions of signal non-linearity and/or distortion caused by nonlinear and/or changing in time characteristics of transmission channel.

Frequency sampling filters (FSF) capable of recovering particular sinusoidal tones/sub-bands from a composite signal such as OFDM frame, were known and described as rarely used in the book by Richard G. Lyons; "Understanding Digital Signal Processing", Second Edition 2004 Prentice Hall.

However such frequency sampling filters and other conventional frequency domain methods do not have time domain solutions needed to preserve and recover phase alignments of singular cycles of tones/sub-bands to the composite signal frame, wherein such phase alignments carry phases of tones/sub-bands transmitting data encoded originally.

It is the objective of solutions presented herein to alleviate such limitations by contributing;
accommodation of unlimited non-linearity and time variant quick changes of transmission channel such as those caused by line load, cross-talk and inter-band interference from adjacent transmission channels,
and said time domain solutions combining signal processing in frequency domain and in time domain, in order to enable recovery of phases and amplitudes of singular cycles or half-cycles of data carrying tones or sub-bands comprised in the composite signal.

SUMMARY

1. Summary of IST

This invention is directed to data recovery by applying an inverse transformation of transmission channel transform function.

IST comprises data recovery from wide variety of transmission channel configurations (see FIG. 13A), including:

an encoder of original data into transmitted signals and a data link converting transmitted signals into received signal subspaces corresponding to the original data, wherein this conversion can introduce deterministic or random distortions and/or internal or external interference to the received signal subspaces;

said encoder and said data link and an preprocessor of received signal subspaces converting them into preprocessed signal subspaces also corresponding to the original data;

wherein such preprocessed signal subspaces can be utilized to enable more efficient inverse transformation algorithms (their utilization is illustrated further on in systems for data recovery from OFDM frames shown in FIG. 13B, FIG. 13D, FIG. 16);

said encoder and said data link and said preprocessor and a processor of said preprocessed signal subspaces converting them into signal parameters sub-ranges corresponding to the original data (see FIG. 13E, FIG. 14).

Consequently the IST comprises said direct data recovery with said inverse transformation applied to wide variety of signals and their parameters including:

said received signal subspaces, said preprocessed signal subspaces, and said signal parameters sub-ranges.

Such IST is based on utilizing a relation between said data transmitted originally and said received subspaces and/or said preprocessed subspaces and/or said received parameters sub-ranges.

Such basic relations are derived by a background processor based on theoretical models of transmission channels and/or training sessions and/or adaptive analysis of received signal samples supplied by a waveform screening and capturing circuit (WFSC) described further below.

In addition to the derivation of these basic relations said background processor, implemented as the programmable control unit (PCU), controls operations of:

said real time processing of data carrying signals and their derivatives performed by a synchronous sequential processor (SSP) implementing data recovery operations, and said waveform screening and capturing circuit (WFSC).

The application of the inverse transformation and the basic relations includes:

outlining said received signal subspaces and/or said preprocessed signal subspaces and/or said signal parameters sub-ranges as distinctive sets comprising elements corresponding to the same specific data transmitted originally;

and defining assignment of specific transmitted data to specific said received signal subspaces and/or preprocessed signal subspaces and/or processed said signal parameters sub-ranges;

wherein such assignment enables direct identification of transmitted data based on identification of said received signal subspace or said preprocessed signal subspace or said signal parameters sub-range which a received signal or a preprocessed signal or a signal parameter belongs to.

In addition to producing said received parameters useful for said direct identification of transmitted data, IST includes also processing of said preprocessed signal space in order to derive processed signal parameters useful for characterizing elements of subspaces of received signals space or subspaces of preprocessed signal space.

Consequently the IST comprises using such received signal parameters for different purposes described below:

selecting a reference frame or frames which intervals of received signal shall be compared to in order to identify received signal subspaces comprising these intervals;

selecting a reference frame or frames which intervals of preprocessed signal shall be compared to in order to identify preprocessed signal subspaces comprising these intervals;

direct identification and recovery of data transmitted originally from a limited set of sub-ranges of said received parameters.

Such IST comprises both methods described below.

A more direct method includes steps presented below:

sets of shapes of received signal intervals, expected when particular data symbols or data units are transmitted originally, are identified using theoretical models and/or results of training session and/or results of an adaptive filter control process;

a relation between said original data symbols or units and corresponding to them such expected sets of received interval shapes (also named contour further on), is preprogrammed as an inverse transformation of transmission channel with its distortions and interferences;

a specific shape (contour) of an interval of received signal is processed in order to detect which such set of said expected interval shapes (further named as received signal subspace) comprises the specific shape of the processed interval;

said inverse transformation is applied to the set of expected interval shapes (received signal subspace) comprising said processed interval shape, in order to recover data transmitted originally.

Another method, which can be more suitable for certain data transmission techniques (such as OFDM), includes utilization of said intermediate step described as:

preprocessing of said received signal subspaces in order to recover its components carrying transmitted data (these components are comprised in preprocessed subspaces as it is explained further below), before applying steps (described above for the shape of received signal) to shapes of these components intervals by using expected sets of shapes of components intervals (instead of using said expected sets of shapes of received signal intervals);

applying said inverse transformation to said sets of expected component shapes (further named as preprocessed signal subspaces) detected as comprising specific shapes of said components intervals, in order to recover data transmitted originally.

Said preprocessing of the received subspaces is exemplified by using frequency sampling filters for recovering sub-bands or tones from OFDM composite signal in the NFIT version of IST and it is described further on in NFIT related sections of this application;

wherein the half-cycles or cycles of said sub-bands or tones recovered within the NFIT, are exemplifying said preprocessed received signal space.

IST method applies an inverse channel transformation, defining relationship between originally transmitted data and received signal shapes, to a frame of reference, characterizing a set of shapes corresponding to a specific original data symbol or a plurality of such data symbols, in order to recover said original data from the received signal shape affected by channels distortions and/or interferences.

Such IST method comprises the steps of:
capturing an over-sampled received signal waveform;
calculating estimates of shapes similarity, between an captured waveform interval and said reference frame, such as correlation integrals or deviation integrals;
identifying a closest reference frame by comparing such correlation integrals or deviation integrals;
said recovery of said data symbol or said set of data symbols transmitted originally, by applying the inverse transformation of said channel transform function to the closest reference and/or an estimate of said shape similarity with the closest frame;
wherein such channel transformation and its inverse transformation can be derived by using theoretical models and/or results of training session and/or results of an adaptive filter control process.

The IST method described above; further comprises the steps of:
performing preliminary analysis of said waveform captured in the receivers channel and/or a waveform captured in a neighbor channel and/or other measurable interference;
and using such analysis results for said selection of the expected closest reference frame or a subset of reference frames expected to comprise such closest frame;

Such IST comprises the apparatus for and steps of:
comparing such captured waveform interval with such mask by producing an estimate of their shapes similarity, named as proximity estimate, such as correlation integral or deviation integral between samples belonging to the waveform interval and their counterparts belonging to the mask;
using such proximity estimate to detect, if the set of shapes characterized by the mask used (also named as reference frame) corresponds to the captured waveform;
wherein said inverse transformation of the channel transfer function is applied to the mask (reference frame) characterizing such corresponding set of shapes, in order to recover said original data from received signal subjected to transmission channel distortions and interferences.

The IST further includes instant accommodation of time variant quickly changing characteristics of transmission channel, caused by interferences such as line loads or cross-talk or inter-band interference; wherein such DRIT comprises the steps of:
producing real time evaluations of such instantly changing interferences by a pre-processing of waveforms produced or affected by said interfering sources;
using such real time evaluations for a selection of said mask used for producing said proximity estimate, wherein the selected mask is pre-designed to accommodate such instant interferences;
using such proximity estimate to detect, if the set of shapes characterized by the mask used corresponds to the captured waveform subjected to the instant interferences.

IST principles of operation discussed herein enable wide spectrum of solutions comprising configurations 1-12 described below.

Examples of such IST solutions are shown in FIG. 13A, FIG. 13B, FIG. 13D, FIG. 13E and their relations to components detailed in the subsection "1. Embodiments of NFIT" of DETAILED DESCRIPTION are indicated in the subsection "2. Embodiments of IST".

1. A system and a method for data recovery from received signal subspaces (DRRS).

This is the inverse transformation system & method for recovering transmitted data from a signal received from a transmission channel which includes a data coding circuit, encoding said transmitted data into transmitted signal contours defined by transmitted signal parameters such as amplitudes or phases, and a signal transmission link, transforming said transmitted signal contours into received signal subspaces, wherein this link introduces deterministic or random distortions affecting the received signal subspaces;
wherein the DRRS comprises:
deriving an inverse transformation reversing a transfer function of said transmission channel, in order to recover said transmitted data based on identification of received signal subspaces comprising said received signals;
comparing a set of samples of an interval of said received signal with elements of a reference frame related to a particular said signal subspace,
wherein said particular signal sub-space corresponds to a particular said transmitted contour encoding specific transmitted data;
using a result of a single said comparison or results of multiple said comparisons for identifying a specific said signal subspace which said interval belongs to;
applying said inverse transformation to the identified subspace in order to recover data carried by said received signal interval.

The DRRS is the simplified version of the DRPS PSP system (described in the clause 8 below and shown in FIG. 13A), as it is implemented without the preprocessing and processing operations.

Such simplified DRRS applies a predefined reference frame or frames directly to the received signals in order to identify received signals subspaces comprising particular signals.

2. A system and a method for data recovery from received subspaces of PAM signal (DRRS PAM).

This is the inverse transformation system & method for recovering transmitted data from a signal received from a transmission channel which includes a data coding circuit for pulse amplitude modulation (PAM), encoding said transmitted data into transmitted signal edges defined by transmitted signal parameters such as amplitudes and phases determining amplitudes and lengths of data carrying pulses, and a signal transmission link, transforming said transmitted edges into received signal subspaces, wherein this link introduces deterministic or random distortions affecting the received signal subspaces comprising received signal edges;
wherein the DRRS PAM comprises:
deriving an inverse transformation reversing a transfer function of said transmission channel, in order to recover said transmitted data based on identification of said received signal subspaces;
comparing a set of samples of an interval of said received signal with elements of a reference frame related to a particular said signal subspace,
wherein said particular signal sub-space corresponds to a particular said transmitted edge encoding specific data transmitted originally;
using a result of a single said comparison or results of multiple said comparisons for identifying a specific said signal subspace which said interval belongs to;
applying said inverse transformation to the identified subspace in order to recover data signaled by said received signal interval.

Such DRRS PAM can be useful in less demanding PAM systems with lower numbers of amplitude levels (such as two or four levels) and/or low inter-symbol interference (ISI) and/or crosstalk,
wherein using a limited number of reference frames applied to the same signal interval can be sufficient.

3. A system and a method for data recovery from received signal subspaces using processed signal parameters (DRRS PSP).

This is the inverse transformation system & method for recovering data from received signal subspaces produced by a transmission channel which includes a data coding circuit, encoding said transmitted data into transmitted signal contours defined by transmitted signal parameters such as amplitudes or phases, and a signal transmission link, transforming said transmitted signal contours into said received signal subspaces, wherein said link introduces deterministic or random distortions affecting said received signal subspaces; wherein the DRRS RSP comprises:

deriving an inverse transformation reversing a transfer function of said transmission channel, in order to enable recovery of said transmitted data from said received signal subspaces identified as comprising specific received signals;

using a preprocessor of said received signals for transforming said received signal subspaces into preprocessed signal subspaces, wherein said preprocessed sub-spaces correspond to said transmitted contours encoding data transmitted originally;

processing said preprocessed subspaces in order to produce processed signal parameters enabling selection of a single reference frame or multiple reference frames close to these preprocessed subspaces;

using said processed signal parameters for said selection of said close reference frame or frames;

comparing a set of samples of an interval of said received signal with elements of said selected reference frame, using a result of a single said comparison or results of multiple said comparisons for identifying a specific said received signal subspace which said received signal interval belongs to;

applying said inverse transformation to the identified subspace in order to recover data carried by said received signal interval.

4. A system and a method for data recovery from received subspaces of PAM signal using processed signal parameters (DRRS RSP PAM).

This is the inverse transformation system & method for recovering transmitted data from received signal subspaces produced by a transmission channel which includes a data coding circuit for pulse amplitude modulation (PAM), encoding said transmitted data into transmitted signal edges defined by transmitted signal parameters such as amplitudes and phases determining amplitudes and lengths of data carrying pulses, and a signal transmission link, transforming said transmitted signal edges into said received signal subspaces, wherein said link introduces deterministic or random distortions affecting said received signal subspaces; wherein the DRRS RSP PAM comprises:

deriving an inverse transformation reversing a transfer function of said transmission channel, in order to enable recovery of said transmitted data from said received signal subspaces identified as comprising specific received signals;

using a preprocessor of said received signals for transforming said received signal subspaces into preprocessed signal subspaces, wherein said preprocessed sub-spaces correspond to said transmitted edges encoding transmitted data;

processing said preprocessed subspaces in order to produce processed signal parameters enabling selection of a single reference frame or multiple reference frames close to these preprocessed subspaces;

using said processed signal parameters for said selection of said close reference frame or frames;

comparing a set of samples of an interval of said received signal with elements of said selected reference frame, using a result of a single said comparison or results of multiple said comparisons for identifying a specific said received signal subspace which said received signal interval belongs to;

applying said inverse transformation to the identified subspace in order to recover data carried by said received signal interval.

Such DRRS RSP PAM can be particularly advantageous in more demanding PAM systems with high data rates and utilizing more than 4 amplitude levels, wherein higher numbers of possible edges, increased also by higher interference levels, would require excessive numbers of reference frames to be applied simultaneously if said selection of expected close reference frames were not applied.

5. A system and a method for data recovery from preprocessed signal subspaces (DRPS).

This is the inverse transformation system & method for recovering transmitted data from a preprocessed signal produced by a transmission channel which includes a data coding circuit, encoding said transmitted data into transmitted signal contours defined by transmitted signal parameters such as amplitudes or phases, and a signal transmission link and a preprocessor of a received signal, transforming said transmitted signal contours into pre-processed signal subspaces, wherein said link introduces deterministic or random distortions affecting received signal subspaces and said preprocessor transforms said received signal subspaces into said preprocessed signal subspaces; wherein the DRPS comprises:

deriving an inverse transformation reversing a transfer function of said transmission channel, in order to enable recovery of said transmitted data from specific said preprocessed subspaces identified as comprising specific said preprocessed signals;

comparing a set of samples of an interval of said preprocessed signal with elements of a reference frame related to a particular preprocessed subspace, wherein the particular preprocessed sub-space corresponds to a particular said transmitted contour encoding a particular said transmitted data;

using a result of a single said comparison or results of multiple said comparisons for identifying a specific said preprocessed subspace which said preprocessed signal interval belongs to;

applying said inverse transformation to the identified subspace in order to recover transmitted data carried by said preprocessed signal interval.

6. A system and a method for data recovery from preprocessed subspaces of OFDM signal (DRPS OFDM)

This is the inverse transformation system & method for recovering transmitted data from a preprocessed signal produced by a transmission channel which includes a data coding circuit, encoding said transmitted data into transmitted OFDM frames defining data carrying tones or sub-bands, and a signal transmission link and a preprocessor of received OFDM frames, transforming said transmitted OFDM frames into preprocessed signal subspaces representing specific OFDM tones or sub-bands, wherein said link introduces deterministic or random distortions affecting received signal subspaces and said preprocessor transforms said received signal subspaces into said preprocessed signal subspaces; wherein the DRPS OFDM comprises:

deriving an inverse transformation reversing a transfer function of said transmission channel, in order to enable recovery of said transmitted data from specific said preprocessed subspaces identified as comprising specific said preprocessed signals;

comparing a set of samples of an interval of said preprocessed signal with elements of a reference frame related to a particular said preprocessed signal subspace, wherein this particular reference frame corresponds to a half-cycle or cycle of a particular said tone or sub-band represented by this preprocessed signal subspace;

using a result of a single said comparison or results of multiple said comparisons for identifying a specific said preprocessed subspace which said preprocessed signal interval belongs to;

applying said inverse transformation to the identified subspace in order to recover transmitted data carried by said preprocessed signal interval.

Such DRPS OFDM is shown in FIG. 13D and described further in the subsection "2. Embodiments of IST" relating to NFIT components described in greater detail in the subsection "1. Embodiments of NFIT".

7. A system and a method for data recovery from preprocessed subspaces of PAM signal (DRPS PAM).

This is the inverse transformation system & method for recovering transmitted data from a preprocessed signal produced by a transmission channel which includes a data coding circuit for pulse amplitude modulation (PAM), encoding said transmitted data into transmitted signal edges defined by transmitted signal parameters such as amplitudes and phases determining amplitudes and lengths of data carrying pulses, and a signal transmission link and a preprocessor of a received signal, transforming said transmitted signal edges into pre-processed signal subspaces, wherein said link introduces deterministic or random distortions affecting received signal subspaces and said preprocessor transforms said received signal subspaces into said preprocessed signal subspaces; wherein the DRPS PAM comprises:

deriving an inverse transformation reversing a transfer function of said transmission channel, in order to enable recovery of said transmitted data from specific said preprocessed subspaces identified as comprising said preprocessed signals;

comparing a set of samples of an interval of said preprocessed signal with elements of a reference frame related to a particular preprocessed subspace, wherein the particular preprocessed sub-space corresponds to a particular said transmitted contour encoding a specific said transmitted data;

using a result of a single said comparison or results of multiple said comparisons for identifying a specific said preprocessed subspace which said preprocessed signal interval belongs to;

applying said inverse transformation to the identified subspace in order to recover data carried by said preprocessed signal interval.

8. A system and a method for data recovery from preprocessed signal subspaces using processed signal parameters (DRPS PSP).

This is the inverse transformation system & method for recovering transmitted data from a preprocessed signal produced by a transmission channel which includes a data coding circuit, encoding said transmitted data into transmitted signal contours defined by transmitted signal parameters such as amplitudes or phases, and a signal transmission link and a preprocessor of a received signal, transforming edges of said transmitted signal into preprocessed signal subspaces, wherein said link introduces deterministic or random distortions affecting received signal subspaces and said preprocessor transforms said received signal subspaces into said preprocessed signal subspaces; wherein the DRPS PSP comprises:

deriving an inverse transformation reversing a transfer function of said transmission channel, in order to enable recovery of said transmitted data from specific said preprocessed subspaces identified as comprising specific said preprocessed signals;

processing said preprocessed subspaces in order to produce processed signal parameters enabling selection of a single reference frame or multiple reference frames close to these preprocessed subspaces;

using said processed signal parameters for said selection of said close reference frame or frames;

comparing a set of samples of an interval of said preprocessed signal with elements of said selected reference frame, using a result of a single said comparison or results of multiple said comparisons for identifying a specific said preprocessed signal subspace which said preprocessed signal interval belongs to;

applying said inverse transformation to the identified subspace in order to recover data carried by said received signal interval.

9. A system and a method for data recovery from preprocessed subspaces of OFDM signal using processed signal parameters (DRPS PSP OFDM).

This is the inverse transformation system & method for recovering transmitted data from a preprocessed signal produced by a transmission channel which includes a data coding circuit, encoding said transmitted data into transmitted OFDM frames defining data carrying tones or sub-bands, and a signal transmission link and a preprocessor of received OFDM frames, transforming said transmitted OFDM frames into preprocessed signal subspaces representing specific OFDM tones or sub-bands, wherein said link introduces deterministic or random distortions affecting received signal subspaces and said preprocessor transforms said received signal subspaces into said preprocessed signal subspaces; wherein the DRPS PSP OFDM comprises:

deriving an inverse transformation reversing a transfer function of said transmission channel, in order to enable recovery of said transmitted data from specific said preprocessed subspaces identified as comprising specific said preprocessed signals;

processing said preprocessed subspaces in order to produce processed signal parameters enabling selection of a single reference frame or multiple reference frames close to these preprocessed subspaces;

using said processed signal parameters for said selection of said close reference frame or frames;

comparing a set of samples of an interval of said preprocessed signal with elements of said selected reference frame, using a result of a single said comparison or results of multiple said comparisons for identifying a specific said preprocessed signal subspace which said preprocessed signal interval belongs to;

applying said inverse transformation to the identified subspace in order to recover data carried by said received signal interval.

Such DRPS PSP OFDM is shown in FIG. 13B and described further in the subsection "2. Embodiments of IST" relating to NFIT components described in the subsection "1. Embodiments of NFIT".

10. A system and a method for data recovery from preprocessed subspaces of PAM signal using processed signal parameters (DRPS PSP PAM).

This is the inverse transformation system & method for recovering transmitted data from a preprocessed signal produced by a transmission channel which includes a data coding circuit for pulse amplitude modulation (PAM), encoding said transmitted data into transmitted signal edges defined by transmitted signal parameters such as amplitudes and phases determining amplitudes and lengths of data carrying pulses, and a signal transmission link and a preprocessor of a received signal, transforming said transmitted signal edges into pre-processed signal subspaces, wherein said link introduces deterministic or random distortions affecting received signal subspaces and said preprocessor transforms said received signal subspaces into said preprocessed signal subspaces; wherein the DRPS PSP PAM comprises:
  deriving an inverse transformation reversing a transfer function of said transmission channel, in order to enable recovery of said transmitted data from specific said preprocessed subspaces identified as comprising specific said preprocessed signals;
  processing said preprocessed subspaces in order to produce processed signal parameters enabling selection of a single reference frame or multiple reference frames close to these preprocessed subspaces;
  using said processed signal parameters for said selection of said close reference frame or frames;
comparing a set of samples of an interval of said preprocessed signal with elements of said selected reference frame,
using a result of a single said comparison or results of multiple said comparisons for identifying a specific said preprocessed signal subspace which said preprocessed signal interval belongs to;
applying said inverse transformation to the identified subspace in order to recover data carried by said received signal interval.

11. A system and a method for data recovery from processed signal parameters (DRPP).

This is the inverse transformation system & method for recovering transmitted data from processed signal parameters produced by a transmission channel which includes a data coding circuit, encoding said transmitted data into transmitted signal contours defined by transmitted signal parameters such as amplitudes or phases, and a signal transmission link, transforming said transmitted signal contours into received signal subspaces affected by deterministic or random distortions, and a preprocessor of said received signal subspaces, transforming them into preprocessed signal subspaces, and a processor of said preprocessed signal subspaces, calculating processed signal parameters characterizing components of said preprocessed subspaces; wherein the DRPSP comprises the steps of:
deriving an inverse transformation reversing a transfer function of said transmission channel, in order to enable recovery of said transmitted data from said processed signal parameters;
comparing a particular said processed signal parameter with reference or references related to it,
wherein said related reference or references characterize a sub-range of said processed signal parameter corresponding to a specific said transmitted data;
using a result of a single said comparison or results of multiple said comparisons for identifying said sub-range of processed signal parameter;
applying said inverse transformation to the identified sub-range in order to recover transmitted data corresponding to it.

12. A system and a method for data recovery from processed parameters of OFDM signal (DRPP OFDM).

This is the inverse transformation system & method for recovering transmitted data from processed signal parameters produced by a transmission channel which includes a data coding circuit, encoding said transmitted data into transmitted OFDM frames defining data carrying tones or sub-bands, and a signal transmission link, transforming said transmitted OFDM frames into received signal subspaces affected by deterministic or random distortions, and a preprocessor of said received signal subspaces, transforming them into OFDM tones or sub-bands, and a processor of said tones or sub-bands, calculating processed signal parameters characterizing amplitudes and phases of half cycles or cycles of OFDM tones or sub-bands; wherein the DRPSP OFDM comprises the steps of:
deriving an inverse transformation reversing a transfer function of said transmission channel, in order to enable recovery of said transmitted data from said processed signal parameters;
comparing a particular said processed signal parameter with reference or references related to it,
wherein said related reference or references characterize a sub-range of said processed signal parameter corresponding to a specific said transmitted data;
using a result of a single said comparison or results of multiple said comparisons for identifying said sub-range of processed signal parameter;
applying said inverse transformation to the identified sub-range in order to recover transmitted data corresponding to it.

Such DRPP OFDM is shown in FIG. 13E and described further in the subsection "2. Embodiments of IST" relating to NFIT components described in the subsection "1. Embodiments of NFIT".

2. Summary of DDR

Systems and methods for Direct Data Recovery (DDR) apply to communication systems including: a data coding circuit encoding transmitted data into transmitted signals;
a transmission link transforming said transmitted signals into received signal subspaces wherein specific said received signal subspaces correspond to specific said transmitted signals,
wherein the transmission link introduces deterministic or random distortions affecting said received signal subspaces;
a processor transforming said received signal subspaces into subranges of parameters characterizing received signal wherein specific said parameter subranges correspond to specific said transmitted data,
or referencing subspaces characterizing received signal wherein specific said referencing subspaces correspond to specific said transmitted data.

The term sub-ranges/subspaces means that there is a parameter range/a referencing space which contains all said parameter subranges/referencing subspaces accordingly corresponding to a complete expected set of said transmitted data.

Said sub-ranges consist of parameters expressed by numerical values characterizing particular signal intervals, Said subspaces consist of signal intervals expressed by sets of numerical values defining signals as functions of time.

Consequently, said references/reference frames are expressed by numerical values/sets of numerical values defining functions of time as well.

The DDR includes deriving an inverse transformation reversing a transfer function of said transmission channel, in order to enable said recovery of said transmitted data from said parameters subranges or referencing subspaces;

wherein such derivation includes producing references/reference frames defining said parameter subranges/referencing subspaces and an assignment of said specific transmitted data as corresponding to said specific parameter subranges/referencing subspaces.

Different methods may be used for said deriving of inverse transformation, such as:

using a channel training session for a transmission and analysis of known data patterns transmitted specifically for channel training purposes;

continuous updating of said inverse transformation based on an analysis of known parts of normally transmitted data;

continuous updating of said inverse transformation based on a data-based channel estimation.

Said known parts of normally transmitted data may include:

headers in frames or super-frames transmitted over copper or optical links like Ethernet/Sonet;

preamble frames occurring in OFDM super-frames transmitted over copper links like DSL/ADSL/VDSL;

preamble frames transmitted over wireless OFDM links like WiLAN/WiMAX or CDMA links Said data-based channel estimation may be applied to accommodate a gradual fading of said received signal with corresponding gradual adjustments of said subranges references used in the comparisons identifying said parameter subranges.

The DDR includes adaptive data decoding (ADD) which in addition to conventional reversal of data coding made on a transmit side, performs also a reversal of received signal distortions introduced by a transmission channel;

wherein it is shown below that both reversals are achieved by the same conversion of a parameter sub-range/referencing subspace (corresponding to said received signal) into data transmitted originally.

The DDR includes instant implementation of such ADD step by comparing said signal parameter/referencing subspace with said references/reference frames and using result of such comparison for addressing a Content Addressed Memory (CAM) outputting recovered data.

Such adaptive data decoding includes also a method for adaptive data decoding from OFDM signal (ADD OFDM) combining a reversal of original data coding made on a transmit side with a reversal of received signal transformation or distortion introduced by a transmission link, by a direct conversion of a parameter of a received signal into an original data while the received signal and its parameter remain transformed or distorted by the transmission channel;

wherein the ADD OFDM method comprises the steps of:

deriving references defining sub-ranges of said parameter corresponding to said original data and an assignment of said original data to said sub-ranges, wherein integrals of tones amplitude gradients instead of the integrals of amplitudes are calculated and used as tones parameters;

processing a particular said received signal in order to derive a particular said parameter of received signal;

using said references for identifying a particular said sub-range comprising said particular parameter of received signal;

recovering a particular original data corresponding to said particular received signal based on said assignment of original data to sub-ranges.

Conventional solutions use fixed decoding relations (reverse to that applied in transmitter) for decoding data from signals or parameters used for such decoding.

Therefore substantial processing resources have to be spend on continuous filtering or correcting of received signals or their parameters in order to reverse transmission link distortions before such fixed decoding relations can be applied to received signals or parameters amended already.

DDR contributes opposite data recovery method, which avoids such filtering or correcting of received signals or their parameters by amending said decoding relation applied for data recovery instead.

Such DDR solutions comprise a variety of systems & methods some of which are described below.

1. The DDR using parameters of received signal (DDR PRS).

The DDR PRS recovers transmitted data from a signal received from a transmission channel which includes a data coding circuit encoding said transmitted data into transmitted signals, a transmission link transforming said transmitted signals into received signal subspaces wherein the transmission link introduces deterministic or random distortions affecting said signal subspaces and a processor transforming said signal subspaces into subranges of received signal parameters wherein specific said parameter subranges correspond to specific said transmitted data; wherein the DDR PRS comprises:

deriving an inverse transformation reversing a transfer function of said transmission channel, in order to enable said recovery of said transmitted data from said parameters subranges;

wherein such derivation includes producing references defining said parameter subranges and an assignment of said specific transmitted data as corresponding to said specific parameter subranges;

processing a particular said received signal in order to produce a particular single or multiple said signal parameters affected by the distortions introduced by the transmission link;

using a single or multiple said references for identifying a particular single or multiple said parameter subranges comprising said particular single or multiple signal parameters, in order to utilize said assignment for recovering a particular said transmitted data corresponding to the particular said received signal.

Consequently the last step of DDR PRS performs said ADD function, by reversing both original data coding and signal distortions caused by the transmission link, with the simple conversion limited to:

using predefined references for identifying a parameter subrange comprising specific said signal parameter, and recovering transmitted data based on a predefined assignment of transmitted data to the identified parameter subrange.

The DDR PRS is exemplified below by presenting its implementations in two different OFDM receivers.

2. The DDR using parameters of sub-band cycles (DDR PSBC).

The DDR PSBC recovers transmitted data symbols from a signal received from an OFDM transmission channel which includes a data coding circuit encoding transmitted symbols into transmitted OFDM frames, a transmission link transforming said transmitted frames into subspaces of received OFDM frame wherein the transmission link introduces deterministic or random distortions affecting said frame subspaces and a processor transforming said frame subspaces into subranges of amplitudes/phases of cycles or half cycles of sub-band signals of said received frame, wherein specific said amplitudes/phases subranges correspond to specific said transmitted symbols; wherein the DDR PSBC comprises:

deriving an inverse transformation reversing a transfer function of said transmission channel, in order to enable said recovery of said transmitted symbols from said amplitudes/phases subranges;

wherein such derivation includes producing references defining said amplitudes/phases subranges and an assignment of said specific transmitted symbols as corresponding to said specific amplitudes/phases subranges;

processing a particular said received frame in order to estimate particular said amplitudes/phases of cycles or half cycles affected by the distortions introduced by the transmission link;

using said references for identifying particular said amplitudes/phases subranges comprising the particular amplitudes/phases of cycles or half cycles, in order to utilize said assignment for recovering particular said transmitted symbols corresponding to the particular said received frame.

The step of processing said received frame, may include recovery of said sub-band signals needed to estimate said particular amplitudes/phases of cycles or half cycles.

The last step of DDR PSBC performs said ADD function, by reversing both original data coding and signal distortions caused by the transmission link, with the simple conversion limited to:

using predefined references for identifying amplitudes/phases subranges comprising particular said amplitudes/phases, and recovering transmitted data based on a predefined assignment of transmitted data to the identified amplitudes/phases subranges.

3. The DDR using parameters of sub-bands (DDR PSB).

The DDR PSB recovers transmitted data symbols from a signal received from an OFDM transmission channel which includes a data coding circuit encoding transmitted symbols into transmitted OFDM frames, a transmission link transforming said transmitted frames into subspaces of received OFDM frame wherein the transmission link introduces deterministic or random distortions affecting said frame subspaces and a processor transforming said frame subspaces into subranges of amplitudes/phases of sub-bands of said received frame, wherein specific said amplitudes/phases correspond to specific said transmitted symbols; wherein the DDR PSB comprises:

deriving an inverse transformation reversing a transfer function of said transmission channel, in order to enable said recovery of said transmitted symbols from said amplitudes/phases subranges;

wherein such derivation includes producing references defining said amplitudes/phases subranges and an assignment of said specific transmitted symbols as corresponding to said specific amplitudes/phases subranges;

processing a particular said received frame in order to estimate particular said amplitudes/phases affected by the distortions introduced by the transmission link;

using said references for identifying particular said amplitudes/phases subranges comprising the particular amplitudes/phases, in order to utilize said assignment for recovering particular said transmitted symbols corresponding to the particular said received frame.

The step of processing said received frame, may include utilization of Fast Fourier Transfer (FFT) for recovering said amplitudes/phases of sub-bands of said received frame.

The last step of DDR PSB performs said ADD function, by reversing both original data coding and signal distortions caused by the transmission link, with the simple conversion of:

amplitudes/phases subranges comprising said estimates of amplitudes/phases of received signal sub-bands into data transmitted originally.

4. The DDR using referencing subspaces (DDR RSS).

The DDR RSS utilizes adaptive data decoding (ADD) which in addition to conventional reversal of data coding made on transmit side, performs also a reversal of received signal distortions introduced by a transmission channel; wherein it is shown below that both reversals are achieved by the same conversion of a predefined subspace corresponding to received signal into data transmitted originally.

The DDR RSS recovers transmitted data from a signal received from a transmission channel which includes a data coding circuit encoding said transmitted data into transmitted signals, a transmission link transforming said transmitted signals into received signal subspaces wherein the transmission link introduces deterministic or random distortions affecting said signal subspaces and a processor transforming said signal subspaces into data referencing subspaces wherein specific said referencing subspaces correspond to specific said transmitted data; wherein the DDR RSS comprises:

deriving an inverse transformation reversing a transfer function of said transmission channel, in order to enable said recovery of said transmitted data from said referencing subspaces;

wherein such derivation includes producing reference frames defining said referencing subspaces and an assignment of said specific transmitted data as corresponding to said specific referencing subspaces;

processing a particular said received signal in order to transform it into a particular data referencing signal affected by the distortions introduced by the transmission link;

using a single or multiple said reference frames for identifying a particular referencing subspace comprising said particular referencing signal, in order to utilize said assignment for recovering a particular said transmitted data corresponding to the particular said received signal.

The last step of such DDR RSS performs said ADD function, by reversing both original data coding and signal distortions caused by the transmission link, with the simple conversion of:

said referencing subspace comprising said referencing signal into data transmitted originally.

The DDR RSS described in the above clause can be exemplified with its implementation for OFDM data recovery described below.

5. The DDR using sub-band subspaces (DDR SBS).

The DDR SBS recovers transmitted data symbols from a signal received from an OFDM transmission channel which includes a data coding circuit encoding transmitted symbols into transmitted OFDM frames, a transmission link transforming said transmitted frames into subspaces of received OFDM frames wherein the transmission link introduces deterministic or random distortions affecting said frame subspaces and a processor transforming said frame subspaces into subspaces of sub-bands of said received frames, wherein specific said sub-band subspaces correspond to specific said transmitted symbols; wherein the DDR SBS comprises:

deriving an inverse transformation reversing a transfer function of said transmission channel, in order to enable said recovery of said transmitted symbols from said sub-band subspaces;

wherein such derivation includes producing reference frames defining said sub-band subspaces and an assignment of said specific transmitted symbols as corresponding to said specific sub-band subspaces;

processing a particular said received frame in order to recover this frame's sub-band signals affected by the distortions introduced by the transmission link;

using said reference frames for identifying particular said sub-band subspaces comprising said recovered sub-band signals, in order to utilize said assignment for recovering particular said transmitted symbols corresponding to the particular said received frame.

The reference frames used for identifying subspaces comprising said recovered sub-band signals may have length limited to cycles of these sub-band signals.

2. Summary of NFIT

The NFIT alleviates said fundamental deficiencies of conventional noise filters as it is explained below.

This disclosure comprises a recovery of the originally transmitted signal by reversing functioning of the transmission channel which distorts and introduces interferences to the transmitted signal, wherein such reversal is accomplished by applying an inverse transformation to a received signal distorted by the transmission channel additionally introducing transmission link noise and adjacent channels/bands interferences.

Since every transmission channel performs some kind of transformation of a transmitted signals space consisting of originally transmitted shapes into a received signal space substantially different due to transmission channel distortion and interferences, such inverse transformation can provide effective universal means for noise filtering recovery of the original signal.

Consequently this disclosure includes a method, a system and an apparatus for noise filtering inverse transformation of a received signal (NFIT) which eliminates non-linear and other distortions and interferences of the transmission channel from the received signal, by comprising:

capturing an over-sampled received signal waveform;

pre-filtering and/or analyzing such captured waveform in order to detect which predefined set of waveform shapes includes the analyzed waveform, wherein such predefined set of shapes is designed as implementing a known transformation of an originally transmitted signal;

a recovery of said originally transmitted signal (freed of transmitting channel distortions and interferences) by applying the inverse transformation of said known transformation of the original signal into the predefined sets of shapes;

wherein such original signal transformation and its inverse transformation can be derived as theoretical models and/or results of training session and/or results of adaptive optimization process.

The NFIT further comprises comparing such captured waveform shape with a frame of reference (named also as mask) characterizing such set of predefined shapes in order to verify which set of predefined shapes the captured shape shall belong to, wherein:

an captured waveform interval is compared with such mask by producing an estimate of their shapes similarity (named also as proximity estimate), such as correlation integral or deviation integral between samples belonging to the waveform and their counterparts belonging to the mask;

such estimate of shapes similarity (proximity estimate) is used to detect, if the set of shapes characterized by the mask used corresponds to the captured waveform;

the inverse transformation of the known transmission channel transformation is applied to the mask characterizing such corresponding set of shapes, in order to recover the original signal free of transmission channel distortions and interferences.

Such NFIT further includes an instant accommodation of time variant quickly changing characteristics of transmission channel, caused by interferences such as line loads or cross-talk or inter-band interference; by comprising:

producing real time evaluations of such instantly changing interferences;

using such real time evaluations for selection of a different frame of reference accommodating such instant interferences;

using such selected different frame for said detection of set of shapes corresponding to the captured waveform affected by the instant interferences;

said recovery of the original signal by performing the inverse transformation of the frame of reference characterizing such detected set of shapes.

The NFIT includes a method for data recovery from received DMT or Multi-band frames wherein such data recovery method comprises an integration of frequency domain and time domain signal processing methods, wherein:

a DMT or Multi-band signal is filtered in frequency domain wherein frequency filters are used to produce filtered signals having known phase relation to said DMT or Multi-band frame (i.e. signals are filtered in phase with the frame);

said time domain time signal processing of such frequency filtered signals performed in phase with the frame measures amplitudes and/or phases of singular half-cycles or cycles of DMT or Multi-band tones;

such measured amplitudes and/or phases are inversely transformed by reversing their distortions introduced by a transmission channel, of said DMT or Multi-band composite signal, including distortions of previous processing stages;

such inversely transformed amplitudes and phases are used to recover data symbols originally encoded in the transmitted signal;

every set of data symbols recovered from amplitudes and/or phases of a particular tone or band-frequency, is processed using statistical methods in order to select the most probable symbol.

Such data recovery method includes sensing amplitudes and/or phases of signals surrounding said data carrying tone or band signal and reversing distortions of such data signal caused by said surrounding signals, wherein such data recovery method comprises:

detection of amplitudes and/or phases of noise and/or other signals surrounding such particular data carrying signal in frequency domain and/or in time domain;

using such detected amplitudes and/or phases of noise and/or other surrounding signals for deriving estimates of data signal distortions introduced by the surrounding noise and/or other signals;

using such distortions estimates for performing reverse transformation of said detected amplitudes and/or phases of the data carrying signal into the amplitudes and/or phases corresponding to the data signal transmitted originally.

This disclosure further includes using a synchronous circular processing (SCP) method and apparatus for very fast front-end signal processing performing real time functions, such as:

continuous waveform over-sampling and capturing, said instant interferences evaluations, waveform interval analysis and comparison with pre-selected masks and other signal processing in time domain and/or frequency domain.

The SCP comprises sequentially connected stages fed with digital samples produced by A/D converter of incoming wave-form; wherein:

such sequential stage comprises a register for storing and/or processing sequentially multiple wave-form samples;

such sequential stage register comprises circularly used segments designated for storing and/or processing of consecutive samples assigned to consecutive segments of the stage by an index circulating within a stage segments number;

such storing and/or processing of consecutive samples in the segments of the sequential stage is driven by consecutive circular clocks designated for a particular stage wherein every such consecutive circular clock is applied to its designated segment at a time instant occurring periodically within a circulation cycle;

outputs of a segment or segments of this sequential stage register can be used by a next sequential stage while other segment or segments of the first stage are still accepting and/or processing other samples during the first stage's circular cycle.

Such SCP enables configuration comprising variety of said consecutive stages having widely varying sizes of registers defined by the stages segments numbers adjusted to accommodate data processing requirements between the consecutive stages.

Consequently; a number of said stage segments can be adjusted freely to accommodate FIR and/or IIR filters having different orders, and any required extension of processing time can be achieved by adding a corresponding sampling intervals' number by increasing number of segments in the stage register.

The SCP further comprises;

using such SCP stage for implementing a digital FIR or IIR filter producing output which maintains a known phase displacement towards (is in phase with) a composite input signal;

using such SCP stages for implementing time domain filters producing outputs which are in phase with the composite input signal;

and combining such stages implementing such FIR and/or IIR filters and/or such time domain filters, into a signal processing system producing multiple outputs which are in phase with the composite input signal.

This disclosure still further includes using a programmable control unit (PCU) for on-line back-up processing providing very comprehensive and versatile programmable functions such as:

controlling operations of the waveform screening and capturing circuit (WFSC) providing received waveform samples needed for said received waveform analysis which uses a training session and/or implements an adaptive noise filtering procedure updating inverse transfer function while usual received signal filtering is still taking place uninterrupted;

calculating and implementing the inverse transformation function based on received waveform analysis;

pre-loading said masks used by the SCP;

controlling all said SCP operations by pre-loading SCP control registers which define functions performed by SCP.

The NFIT further includes an inverse transformation of band filtered signal (ITBFS) method, system and apparatus for recovering the original signal from a received signal pre-filtered by a band-pass filter wherein the inverse transformation is applied to such pre-filtered signal in order to compensate transmission channel changes caused by instant interferences such as inter-band interferences and/or line loads and/or cross-talk; wherein the ITBFS comprises:

using a band-pass filter for producing a pre-filtered received signal from the captured waveform;

producing real time evaluations of such instant interferences which are in-phase with the pre-filtered signal;

using such real time evaluations for selection of a different frame of reference accommodating such instant interferences;

using such selected different frame for said detection of set of shapes corresponding to the pre-filtered signal affected by the instant interferences;

said recovery of the original signal by performing the inverse transformation of the frame of reference characterizing such detected set of shapes.

The ITBFS includes said producing of real time evaluations further comprising:

a time domain processing of the captured waveform and/or other pre-filtered frequency bands adjacent to the pre-filtered signal band, wherein such time domain processing of the waveform and/or the adjacent frequency bands produce results which are in phase with the pre-filtered signal in order to accomplish in-phase application of said selected frame of reference to the pre-filtered signal.

The ITBFS further includes:

using said SCP for implementing a band-pass filter producing a pre-filtered received signal from the captured waveform;

using said SCP for such time domain processing of the captured waveform and/or other pre-filtered frequency bands adjacent to the pre-filtered signal band, in order to produce said results being in phase with the pre-filtered signal.

This disclosure comprises using NFIT and ITBFS for recovering the originally transmitted signal in ADSL/VDSL wireline systems; by comprising the steps of:

using said SCP for implementing band-pass filters for pre-filtering of discrete tone signals from the captured waveform;

using said SCP for said time domain processing of the captured waveform and/or such pre-filtered tone signals adjacent to a specific pre-filtered tone signal, wherein such time domain processing of the waveform and/or the adjacent pre-filtered tone signals produce results which are in phase with the specific pre-filtered tone signal in order to accomplish in-phase application of said selected frame of reference to the specific pre-filtered tone signal.

wherein by applying such steps to every specific discrete tone signal, all originally transmitted discrete tone signals are recovered.

Furthermore this disclosure comprises using NFIT and ITBFS for recovering originally transmitted signal in a wide variety of other communication systems as well; including wireless communication systems such as Multi-Band systems and WiLAN.

The NFIT further includes inverse transformation of frequency domain representation of received signal (ITFDR) method and system for filtering out noise from a received signal frequency spectrum and for correcting transmission channel transformation by an inverse transformation of the received signal spectrum into an originally transmitted signal; wherein:

such received frequency spectrum is compared with a spectrum mask, by producing a spectrum proximity estimate such as a correlation integral or deviation integral between components of the received frequency spectrum and their counterparts from the spectrum mask;

such proximity estimate is used to detect, if the spectrum mask applied represents a noise filtered version of the received frequency spectrum;

said inverse transformation of said transmission channel transformation is applied to the spectrum mask representing such noise filtered received spectrum, in order to recover the originally transmitted signal.

Such ITFDR comprises:

using a variety of spectrum masks for approximating different said received spectrums and/or for filtering out different predictable and/or random noise components;

using multiple consecutive proximity estimates for identifying such spectrum mask which is most effective in said approximating of the received spectrum and in said noise filtering;

or using proximity estimates providing indication which spectrum mask shall be applied as the next in order to detect such most effective spectrum mask;

wherein the selection of the next applied spectrum mask is determined by results of real-time in-phase processing of the received signal and/or received spectrum and/or by previous proximity estimates.

The ITFDR method and system includes recovering the original signal from a received signal wherein Fast or Discrete Fourier Transform of received signal, in such communication systems as wireless multi-band OFDM (Orthogonal Frequency Division Multiplexing) or wireline ADSL/VDSL DMT, is inversely transformed in order to recover the content of originally transmitted data carrying signal; wherein the ITFDR comprises:

producing real time evaluations of frequency spectrums of major interferences affecting frequency bands or discrete tones reproduced by FFT/DFT, wherein such major interferences include said re-produced by FFT/DFT frequency spectrums influencing themselves and adjacent frequency bands/tones or other significant interferences;

using such real time evaluations for a selection of a spectrum mask most suitable for accommodating such major interference sources when it is applied to a specific band/tone reproduced by FFT/DFT;

wherein a specific band/tone spectrum reproduced by FFT/DFT is compared with such selected spectrum mask, by producing a spectrum proximity estimate such as correlation integral or deviation integral between components of the band/tone spectrum and their counterparts from the spectrum mask;

wherein such proximity estimate is used to detect, if the set of spectrums characterized by the spectrum mask corresponds to the specific band/tone spectrum;

the inverse transformation of the known transmission channel transformation is applied to the spectrum mask characterizing such corresponding set of spectrums, in order to recover the original frequency domain signal free of transmission channel interferences;

wherein by applying such steps to every specific band/tone spectrum, the original frequency domain signals transmitted over all bands/tones are recovered.

The ITFDR further comprises:

analyzing frequency spectrums produced by the FFT or DFT during a training session or adaptive control procedure in order to derive said spectrum masks corresponding to specific data symbols transmitted over specific frequency bands or discrete tones, wherein for every specific data symbol variety of different spectrum masks can be derived wherein such different spectrum masks correspond to different content of major sources of interference such as adjacent frequency bands or discrete tones;

wherein such derivation of the spectrum masks includes derivation of an inverse transform of transmission channel transformation which can be used for said recovery of original frequency domain signals based on an analysis of said corresponding to them frequency spectrums reproduced by FFT/DFT on the receiver side.

The NFIT introduced with above examples, further includes methods and systems characterized below.

The NFIT includes inverse transformation of received signal (ITRS) method and system and apparatus, for recovering originally transmitted signal and for filtering out a transmission channel transformation and noise by applying an inverse transformation of said received signal into the original signal; wherein:

a representation of said received signal is compared with a mask, by producing an proximity estimate such as correlation integral or deviation integral between components of the received signal representation and their counterparts from the mask;

such proximity estimate is used to detect, if the mask applied represents a noise filtered version of the received signal representation;

said inverse transformation of said transmission channel transformation is applied to the mask representing such noise filtered received signal, in order to recover the originally transmitted signal.

Said ITRS comprises:

using variety of such masks for approximating different representations of said received signal and/or for filtering out different predictable and/or random noise components;

and/or using results of real-time in-phase processing of such representation of received signal or representations of predictable interferences, for such selections of next masks applied;

using multiple consecutive proximity estimates for selecting said mask which is most effective in said approximating of the received signal representation and in said noise filtering;
and/or using a numerical result of a previous proximity estimate for selecting such most effective mask.
Said ITRS further comprises:
using an over-sampled waveform of a time interval of received signal as said received signal representation;
or using a frequency spectrum of said time interval of received signal as said received signal representation.
Said ITRS using the over-sampled interval waveform as signal representation, comprises a preliminary characterization of a shape of waveform interval wherein a result of such interval shape characterization facilitates selection of an interval mask applied to the interval waveform in order to find a correct approximation of the received signal interval freed of unpredictable noise; wherein such ITRS comprises:
evaluation of an averaged peak amplitude of internal pulses occurring within the interval waveform;
evaluation of an averaged phase, of periodical edges of such internal interval pulses, versus a known phase reference;
using such averaged amplitude and averaged phase for selecting said interval mask.
The ITRS comprises applying plurality of such masks and analyzing their proximity estimates in order to optimize selection of a final interval mask transformed inversely into the original signal; wherein such ITRS comprises:
applying said interval masks having different amplitudes and analyzing their proximity estimates in order to find an interval mask providing the closest amplitude wise approximation of the interval waveform;
and/or applying said interval masks having different phases and analyzing their proximity estimates in order to find an interval mask providing the closest phase wise approximation of the interval waveform;
inverse transformation of the interval mask, providing such closest approximation, into the originally transmitted signal.
The ITRS further comprises different application methods of said interval masks having different phases versus said received signal waveform; wherein:
plurality of said interval masks, having different phases versus the same interval waveform, is applied and their proximity estimates are analyzed in order to find the closest phase wise approximation of the interval waveform;
or the same interval mask is applied to plurality of phase shifted interval waveforms and resulting proximity estimates are analyzed, in order to find the optimum phase of the interval mask versus the received signal waveform approximated by that mask.
This disclosure comprises methods, systems and solutions described below.

1. A method for noise filtering inverse transformation (NFIT), comprising a recovery of an original signal by reversing functioning of the transmission channel distorting the original signal, wherein such reversal is accomplished by applying an inverse transformation to a received signal wherein such distortion includes transmission link noise and adjacent channel or band interference; the NFIT method comprising the steps of:
capturing an over-sampled waveform of said received signal;
pre-filtering or analyzing such captured waveform in order to detect which predefined set of waveform shapes includes pre-filtered or analyzed waveform, wherein such predefined set of shapes is designed as implementing a known transformation of the original signal;
the recovery of said original signal by applying the inverse transformation of said known transformation of the original signal into the predefined sets of shapes;
wherein such original signal transformation and its inverse transformation can be derived using theoretical models or results of training session or results of adaptive optimization process.

2. A method for noise filtering inverse transformation (NFIT), comprising a recovery of an original signal by reversing functioning of the transmission channel distorting the original signal, wherein such reversal is accomplished by applying an inverse transformation to a received signal wherein such distortion includes transmission link noise and adjacent channel or band interference; the NFIT method comprising the steps of:
capturing an over-sampled waveform of said received signal;
comparing an interval of the captured waveform with a mask used as frame of reference characterizing a set of predefined shapes, in order to verify which set of predefined shapes such waveform interval corresponds to,
wherein such comparison includes
producing a proximity estimate, estimating similarity of their shapes, such as correlation integral or deviation integral between samples belonging to the waveform interval and their counterparts belonging to the mask,
and using such proximity estimate for verifying if the set of shapes characterized by the mask used corresponds to the captured waveform shape;
applying the inverse transformation of the known transmission channel transformation to the mask characterizing such corresponding set of shapes, in order to recover the original signal.

3. A method for noise filtering inverse transformation (NFIT), comprising a recovery of an original signal by reversing functioning of the transmission channel distorting the original signal, wherein such reversal, accomplished by applying an inverse transformation to a received signal, includes accommodation of time variant quickly changing characteristics of transmission channel caused by interference including line load or cross-talk or inter-band interference; the NFIT method comprising the steps of:
capturing an over-sampled waveform of a received signal;
producing a real time evaluation of such instantly changing interference;
using such evaluation for pre-selection of a mask used as frame of reference characterizing a set of predefined shapes of said received signal, in order to accommodate such interference;
comparing an interval of the captured waveform with such pre-selected mask, in order to verify which set of predefined shapes such waveform interval corresponds to,
wherein such comparison includes producing a proximity estimate, estimating similarity of their shapes, such as correlation integral or deviation integral between samples belonging to the waveform interval and their counterparts belonging to the mask;
said recovery of the original signal by performing the inverse transformation of the frame of reference characterizing such detected set of shapes.

4. A method for data recovery from a composite frame (DRCR) comprising discrete multiple tones (DMT) or multiple sub-bands (MSB) wherein such data recovery method comprises combination of frequency domain and time domain signal processing methods, the DRCR method comprising the steps of:

frequency domain filtering of a composite signal carrying such composite frame wherein frequency filters produce discrete tones or sub-bands having known phase relation to said DMT or MSB frame i.e. said frequency filters keep their outputs in phase with the composite frame;

said time domain time signal processing of such discrete tones or sub-bands performed in phase with the composite frame, measures amplitudes and/or phases of singular half-cycles or cycles of discrete tones or sub-bands;

such measured amplitudes and/or phases are inversely transformed by reversing their distortions introduced by a transmission channel of said composite signal, including distortions caused by previous processing stages;

such inversely transformed amplitudes and phases are used to recover data symbols originally encoded in the transmitted signal.

5. A DRCR as described in clause 4, wherein the DRCR method comprises the step of:

selecting the most probable symbol by using statistical methods for processing a set of data symbols recovered from amplitudes and/or phases of a particular tone or sub-band.

6. A method for data recovery from a composite signal (DRCS) comprising discrete multiple tones (DMT) or multiple sub-bands (MSB) wherein a combination of frequency domain and time domain signal processing methods is utilized, wherein amplitudes and/or phases of signals surrounding a particular data carrying tone or sub-band are sensed and distortions of said particular tone or sub-band are reversed; the DRCS method comprising the steps of:

frequency domain filtering of said composite signal producing discrete tones or sub-bands having known phase relation to said DMT or MSB frame;

said time domain signal processing of such discrete tones or sub-bands measures amplitudes and/or phases of singular half-cycles or cycles of discrete tones or sub-bands;

detection of amplitudes and/or phases of noise and/or other signals surrounding such particular tone or sub-band, performed in frequency domain and/or in time domain;

using such detected amplitudes and/or phases for deriving estimates of distortions introduced by the surrounding noise and/or other signals to such particular tone or sub-band;

using such distortions estimates for performing reverse transformation of said detected amplitudes and/or phases of such singular half-cycles or cycles of the particular tone or sub-band into the amplitudes and/or phases corresponding to data transmitted originally.

such reversely transformed amplitudes and phases are used to recover data symbols originally encoded in the transmitted signal.

7. A synchronous circular processing (SCP) system for a front-end signal processing performing real time functions including continuous over-sampling and capturing of a received signal waveform, and time domain processing of the captured waveform producing outputs having a known phase displacement towards the received signal i.e. being in phase with it; the SCP system comprising:

sequentially connected stages fed with digital samples produced by an A/D converter of received wave-form;

such sequential stage comprises a register for storing and/or processing sequentially multiple wave-form samples;

such sequential stage register comprises circularly used segments designated for storing and/or processing of consecutive samples assigned to consecutive segments of the stage by an index circulating within a stage segments number;

such storing and/or processing of consecutive samples in the segments of the sequential stage is driven by consecutive circular clocks designated for the particular stage wherein every such consecutive circular clock is applied to its designated segment at a time instant occurring periodically within a circulation cycle;

outputs of a segment or segments of this sequential stage register can be used by a next sequential stage while other segment or segments of the first stage are still accepting and/or processing other samples during the first stage's circular cycle.

8. A synchronous circular processing (SCP) system for a front-end signal processing performing real time functions including continuous over-sampling and capturing of a received signal waveform, and time domain processing of the captured waveform producing outputs having a known phase displacement towards the received signal i.e. being in phase with it; the SCP system comprising:

sequentially connected stages fed with digital samples produced by an A/D converter of received wave-form;

such sequential stage comprises a register for storing and/or processing sequentially multiple wave-form samples;

such sequential stage register comprises circularly used segments designated for storing and/or processing of consecutive samples assigned to consecutive segments of the stage by an index circulating within a stage segments number;

such storing and/or processing of consecutive samples in the segments of the sequential stage is driven by consecutive circular clocks designated for the particular stage wherein every such consecutive circular clock is applied to its designated segment at a time instant occurring periodically within a circulation cycle;

outputs of a segment or segments of this sequential stage register can be used by a next sequential stage while other segment or segments of the first stage are still accepting and/or processing other samples during the first stage's circular cycle;

wherein said consecutive stages have varying sizes of registers defined by the stages segments numbers adjusted to accommodate data processing requirements between consecutive stages;

wherein plurality of said stage segments accommodates FIR and/or IIR filters which may be of different orders, and any required extension of processing time can be achieved by adding a corresponding sampling intervals number by increasing number of segments in the stage register.

9. A synchronous circular processing (SCP) method for a front-end signal processing performing real time functions including continuous over-sampling and capturing of a received signal waveform and time domain processing of the captured waveform producing outputs having a known phase displacement towards the received signal; the SCP method comprising the steps of:

using sequentially connected stages for storing or processing of samples produced by A/D converter of received wave-form;

wherein such sequential stage comprises a register for storing and/or processing multiple sequential waveform samples;

wherein such sequential stage register comprises circularly used segments designated for storing and/or processing of consecutive samples assigned to consecutive segments of the stage by an index circulating within a stage segments number;
driving such storing and/or processing of consecutive samples in the segments of the sequential stage, by applying consecutive circular clocks designated for the particular stage wherein every such consecutive circular clock is applied to its designated segment at a time instant occurring periodically within a circulation cycle;
using outputs of a segment or segments of a particular sequential stage register by a next sequential stage when other segment or segments of said particular stage are still accepting and/or processing other samples during said circular cycle of the particular stage.

10. A synchronous circular processing (SCP) method for signal processing implementing digital FIR and/or IIR filter producing outputs which maintain known phase displacements towards a composite input signal such as discrete multi-tone (DMT) or multi-sub-band (MSB) i.e. said outputs are in phase with the composite signal; the SCP method comprising the steps of:
using sequentially connected stages for storing or processing of samples produced by an A/D converter of received wave-form;
wherein such sequential stage comprises a register for storing and/or processing multiple sequential samples fed circularly into consecutive segments of such register by consecutive circular clocks;
using outputs of a segment or segments of a particular sequential stage register by a next sequential stage when other segment or segments of the particular stage are still accepting and/or processing other samples during a circular cycle of the particular stage;
using such sequential stage for implementing digital FIR or IIR filter producing output which maintains a known phase displacement towards said composite signal;
or using such sequential stage for implementing time domain filters producing outputs which are in phase with the composite signal.

11. A method of adaptive synchronous circular processing (ASCP) combining use of a front end synchronous circular processor (SCP) performing real time processing of a received signal, with a programmable control unit (PCU) providing back-up processing enabling more comprehensive programmable functions; the ASCP method comprising the steps of:
using sequentially connected stages for storing or processing of samples produced by an A/D converter of a received signal wave-form;
wherein such sequential stage comprises a register for storing and/or processing multiple sequential samples fed circularly into consecutive segments of such register by consecutive circular clocks;
using outputs of a segment or segments of a particular sequential stage register by a next sequential stage when other segment or segments of the particular stage are still accepting and/or processing other samples during a circular cycle of said particular stage;
using said PCU for controlling operations of the received waveform screening and capturing circuit (WFSC),
wherein such WFSC supplies said PCU with received waveform samples needed for a received waveform analysis;
using said PCU for updating inverse transformation function by utilizing a training session and/or implementing an adaptive noise filtering procedure while received signal processing is taking place uninterrupted;
using said PCU for calculating and implementing an inverse transformation function based on said received waveform analysis, wherein such inverse transformation reverses received signal distortions introduced by a transmission channel of the received signal;
wherein said PCU implements such inverse transformation by controlling SCP operations by pre-loading SCP control registers which define functions performed by SCP.

12. A method of inverse transformation of a band filtered signal (ITBFS) for a recovery of an original signal by applying an inverse transformation to a pre-filtered signal, wherein such inverse transformation includes compensation of transmission channel change caused by an instant interference; wherein the ITBFS method comprises the steps of:
using a band-pass filter for producing a pre-filtered signal from a captured waveform of a received signal;
producing a real time evaluation of such instant interference, wherein this real time evaluation is produced in phase with the pre-filtered signal as it has a known phase alignment to such signal;
using such real time evaluation for selection of frames of reference accommodating such instant interference,
using such selected frames of reference for detecting a set of shapes corresponding to the pre-filtered signal affected by the instant interference,
wherein such detection includes comparison of such frames of reference, characterizing sets of predefined signal shapes, with a shape of said affected signal;
said recovery of the original signal by performing the inverse transformation of the frame of reference which detected such set of shapes corresponding to the signal affected by interference.

13. An ITBFS method as described in clause 12, wherein said band filtered signal is a tone or sub-band and said received signal is a composite OFDM signal transmitted over a wireline or wireless link and said original signal is the original tone or sub-band incorporated into the composite OFDM signal.

14. A method for reversal of non-linearity (RNL) of amplifier gain or signal attenuation by applying a polynomial transformation to a non-linear signal, wherein the RNL method comprises the steps of:
identification of dependency between amplitude of an original signal and said non-linear signal; using such dependency for defining polynomial approximation thresholds and their slope coefficients and their exponents;
calculating an exponential component for every said threshold exceeded by a sample of said non-linear signal,
wherein such exponential component for the maximum exceeded threshold, is calculated by rising a difference, between the non-linear signal sample and the maximum threshold, to a power defined by said exponent for the maximum threshold;
wherein such exponential component for every other exceeded threshold, is calculated by rising a difference, between the next exceeded threshold and such other exceeded threshold, to a power defined by said exponent for the other exceeded threshold;
calculating an approximation component for every such approximation threshold exceeded by said non-linear signal sample, by multiplying such exponential component by its slope coefficient;
addition of such approximation components, calculated for approximation thresholds exceeded by or equal to the non-linear signal sample;

wherein by such addition of the approximation components, calculated for the approximation thresholds exceeded by or equal to the non-linear signal sample, said non-linearity is reversed.

15. A method for inverse normalization (IN) of OFDM tone or sub-band, comprising reversal of frequency dependent distortion of said tone or sub-band, by applying normalizing coefficients adjusted to a frequency of this tone or sub-band in order to equalize amplitude and phase distortions introduced to the tone or sub-band by an OFDM transmission channel and a signal processing applied; such IN method comprises the steps of:
identification of the frequency related amplitude or phase distortion of such tone or sub-band by sampling and analyzing of a waveform performed by a programmable control unit (PCU);
calculating such normalizing coefficients for the tone or sub-band, performed by said PCU;
using such normalizing coefficients for equalizing such frequency related distortions, performed by a real-time processing unit (RTP).

16. A method for noise compensation (NC) for a data carrying tone or sub-band of OFDM signal, utilizing evaluation of a noise pattern occurring around this tone or sub-band; wherein such NC method comprises the steps of:
detecting a noise pattern occurring in frequency domain by using frequency domain processing such as Frequency Sampling Filter (FSF) for noise sensing in a frequency spectrum incorporating this tone or sub-band;
detecting a noise pattern occurring in time domain by using time domain processing for noise sensing over time intervals including this tone or sub-band;
using a programmable control unit (PCU)
for analyzing such noise pattern in frequency domain or in time domain, in order to create a deterministic or random noise model for such frequency domain or time domain noise pattern,
and for deriving a noise compensation coefficient by utilizing such deterministic or random model;
using such noise compensation coefficient by a Real Time Processor (RTP) for improving signal to noise ratio in the data carrying tone or sub-band;
using the RTP for time domain recovery of data symbols from singular sinusoidal cycles of the tone or sub-band,
applying such noise model for estimating probability of symbols recovered or for dismissing symbols accompanied by high noise levels close in time;
using such probability estimates or dismissals of unreliable symbols for applying statistical methods for a final recovery of an original data symbol, transmitted by the tone or sub-band, from such plurality of data symbols recovered from the singular sinusoidal cycles.

17. A method for time domain data recovery (TDDR) from a tone or sub-band of OFDM composite frame comprising recovery of data symbols from singular sinusoidal cycles or half-cycles of the tone or sub-band; the TDDR method comprising the steps of:
measuring an amplitude of a singular half-cycle or cycle by calculating an integral of amplitude over a half-cycle or cycle time;
measuring a phase of the half-cycle or cycle;
comparing said measured amplitude to predefined amplitude thresholds, in order to decode an amplitude related factor;
comparing said measured phase to predefined phase thresholds, in order to decode a phase related factor;
using such amplitude and/or phase related factor for producing an address to a content addressed memory (CAM) storing a counter of half-cycles or cycles detecting occurrences of a particular data symbol during said OFDM composite frame;
wherein such CAM can accommodate plurality of such counters of occurrences of data symbols detected within this tone or sub-band during the OFDM frame;
application of statistical methods for selecting data symbol recovered from this tone or sub-band, by utilizing content of such counters of data symbols occurrences within this tone or sub-band.

The DDR and IST comprise using:
a synchronous sequential processor (SSP) for capturing and real time processing of an incoming waveform;
the wave-from screening & capturing circuit (WFSC) for programmable screening of the over-sampled unfiltered wave-form, and for capturing screened out wave-form intervals, and for communicating said captured intervals and other results to the PCU;
the programmable control unit (PCU) for supporting adaptive noise filtering, edge detection and mask selection algorithms.

General definition of the SSP is provided below.

The SSP includes real time capturing and processing of in-coming wave-form and a programmable computing unit (PCU) for controlling SSP operations and supporting adaptive signal analysis algorithms.

Said SSP comprises an over-sampling of incoming waveform level by using a locally generated sampling clock and its sub-clocks generated by the outputs of serially connected gates which the sampling clock is propagated through. If an active edge of the wave-form is detected by capturing a change in a wave-form level, the position of the captured signal change represents an edge skew between the waveform edge and an edge of the sampling clock.

In addition to the above wave-form capturing method, the SSP includes 3 other methods of the edge skew capturing which are defined below:
the sampling clock captures the outputs of serially connected gates which the incoming wave-form is propagated through;
the outputs of serially connected gates which the incoming wave-form is propagated through, provide waveform sub-clocks which capture the sampling clock.
the incoming wave-form captures the outputs of serially connected gates which the sampling clock is propagated through;

The above mentioned edge skew capturing methods further include:
using falling edges of said sub-clocks for driving clock selectors which select parallel processing phases during which positive sub-clocks are enabled to perform said edge skew capturing, or using rising edges of said sub-clocks for driving selectors which select parallel processing phases during which negative sub-clocks are enabled to perform said edge skew capturing;
using serially connected clock selectors for enabling consecutive sub-clocks, in order to assure that consecutive sub-clocks will target appropriate consecutive bits of appropriate capture registers.

The SSP invention includes using said serially connected gates:
as being an open ended delay line;
or being connected into a ring oscillator which can be controlled in a PLL configuration;
or being connected into a delay line which can be controlled in a delay locked loop (DLL) configuration.

Every said edge skew amounts to a fraction of a sampling clock period.

The SSP comprises measuring time intervals between active wave form edges, as being composed of said edge skew of a front edge of the incoming waveform, an integer number of sampling clock periods between the front edge and an end edge, and said edge skew of the end edge of the wave-form.

The SSP further comprises a parallel multiphase processing of incoming signal by assigning consecutive parallel phases for the capturing of edge skews and/or processing of other incoming wave-form data with clocks which correspond to consecutive sampling clocks.

Consequently the SSP invention comprises using 1 to N parallel phases which are assigned for processing incoming signal data with clocks corresponding to sampling clock periods numbered from 1 to N, as it is further described below:
  circuits of phase1 process edge skews or phase skews or other incoming signal data with a clock which corresponds to the sampling clock period number 1;
  circuits of phase2 process edge skews or phase skews or other incoming signal data with a clock which corresponds to the sampling clock period number 2;
  finally circuits of phase N process edge skews or phase skews or other incoming signal data with a clock which corresponds to the sampling clock period number N.

Said parallel multiphase processing allows N times longer capturing and/or processing times for said multiphase stages, compared with a single phase solution.

The SSP includes parallel stage processing of incoming signal by providing multiple processing stages which are driven by the same clock which is applied simultaneously to inputs of output registers of all the parallel stages.

The SSP further comprises a synchronous sequential processing of incoming signal by using multiple serially connected processing stages with every stage being fed by data from the previous stage which are clocked-in by a clock which is synchronous with the sampling clock.

Since every consecutive stage is driven by a clock which is synchronous to the same sampling clock, all the stages are driven by clocks which are mutually synchronous but may have some constant phase displacements versus each other.

The SSP further comprises:
  merging of processing phases which occurs if multiple parallel processing phases are merged into a smaller number of parallel phases or into a single processing phase, when passing from a one processing stage to a next processing stage;
  splitting of processing phases which occurs if one processing phase is split into multiple processing phases or multiple processing stages are split into even more processing stages, when passing from a one processing stage to a next processing stage.

The SSP includes a sequential clock generation (SCG) circuit which uses said clock selectors and said sub-clocks: to generate SSP clocks which drive said parallel phases and said sequential stages, and to generate selector switching signals for said merging and splitting of processing phases.

The SSP includes time sharing of said parallel phases: which is based on assigning a task of processing of a newly began wave-form pulse to a next available parallel processing phase.

The SSP comprises a sequential phase control (SPC) circuit, which uses results of a wave edge decoding and said SSP clocks, for performing said time sharing phase assignments and for further control of operations of an already assigned phase.

The SSP comprises passing outputs of a one parallel phase to a next parallel phase, in order to use said passed outputs for processing conducted by a following stage of the next parallel phase.

The outputs passing is performed: by re-timing output register bits of the one phase by clocking them into an output register of the next parallel phase simultaneously with processing results of the next parallel phase.

The SSP further comprises all the possible combinations of the above defined: parallel multiphase processing, parallel stage processing, synchronous sequential processing, merging of processing phases, splitting of processing phases, and outputs passing.

The SSP includes processing stage configurations using selectors, arithmometers, and output registers, which are arranged as it is defined below:
  input selectors select constant values or outputs of previous stages or outputs of parallel stages or an output of the same stage to provide arithmometer inputs, and arithmometer output is clocked-in to an output register by a clock which is synchronous to the sampling clock;
  multiple arithmometers are fed with constant values or outputs of previous stages or outputs of parallel stages or an output of the same stage, and an output selector selects an arithmometer output to be clocked-in to an output register by a clock synchronous to the sampling clock;
  the above defined configuration as being supplemented by using an output of an output selector of a parallel processing stage for controlling output selector functions.

Proper arrangements of said parallel and sequential combinations and said stages configurations provide real time processing capabilities for very wide ranges of signal frequencies and enable a wide coverage of very diversified application areas.

Summary of the WFSC is provided below.

The wave-form screening and capturing circuits (WFSC) comprises:
  using programmable data masks and programmable control codes for verifying incoming wave-form captures for compliance or non-compliance with a pre-programmed screening patterns;
  buffering captured data for which the pre-programmed compliance or non-compliance have been detected;
  counting a number of the above mentioned detections;
  communicating both the buffered captured data and the number of detections, to an internal control unit and/or to an external unit;
  using programmable time slot selection circuits for selecting a time interval for which wave-form captures shall be buffered and communicated to the PCU.

Said PCU comprises implementation of the functions listed below:
  programming of verification functions and patterns for checking captured wave-forms for compliance or non-compliance with the patterns;
  reading verification results and reading captured wave-forms which correspond to the preprogrammed verification criteria;
  reading captured wave-forms which can be pre-selected by the PCU arbitrarily or based on other inputs from the SSP;

programming of noise filtering functions and noise filtering masks for filtering captured wave-forms;

reading results of real-time wave-form processing from the SSP, processing the results and providing control codes and parameters for further real-time wave-form processing in the SSP, in accordance with adaptive signal processing algorithms;

reading output data from the SSP, interpreting the data, and communicating the data to external units.

BRIEF DESCRIPTION OF THE DRAWINGS

1. Brief Description of the NFIT Drawings

FIG. 1 shows Block Diagram of Inverse Transformation Method in order to introduce major sub-systems defined in FIG. 2-FIG. 11.

FIG. 12A & FIG. 12B define Timing Clocks driving the sub-systems shown in FIG. 2-FIG. 11, wherein:

FIG. 12A shows time slots assigned for sub-clocks driving consecutive processing stages, FIG. 12B shows sub-clocks driving consecutive bits of circular processing stages.

The FIG. 2-FIG. 11 are numbered correspondingly to the flow of processed data.

All interconnect signals between these figures have unique names identifying their sources and destinations explained in the Detailed Description utilizing the same names.

Inputs supplied from different drawings are connected at the top or left side and outputs are generated on the bottom due to the top-down or left-right data flow observed generally.

Clocked circuits like registers or flip-flops are drawn with two times thicker lines than combinatorial circuits like arithmometers or selectors.

FIG. 2 shows sampling of DMT signal and correction of it's non-linearity.

FIG. 3 shows comb filtering of DMT signal.

FIG. 4 shows Resonating IIR Filter for 129 Tone (129T/RIF).

FIG. 4A shows Resonating IIR Filter 129.5 SubTone (129.5ST/RIF).

FIG. 5 shows integration & amplitudes registration for half-cycles of 129 Tone.

FIG. 5A shows integration & amplitudes registration for half-cycles of 129.5 Sub-Tone.

FIG. 6 shows phase capturing and initialization of tone processing for 129 Tone/128.5 Sub-Tone/129.5 Sub-Tone, wherein block 8 shows the Frame Samples Counter and MTP Start generator common for Real Time Processors for all Tones/Sub-Tones.

FIG. 7 shows retiming & averaging of positive and negative half-cycles for 129 Tone/128.5 Sub-Tone/129.5 Sub-Tone.

FIG. 8 shows amplitude & phase normalization for 129 Tone/128.5 Sub-Tone/129.5 Sub-Tone.

FIG. 9A-FIG. 9B show accessing noise compensation coefficients for 129 Tone.

FIG. 10 shows using these coefficients for compensating expected noise contributions from the 128.5 Sub-Tone & 129.5 Sub-Tone.

FIG. 11 shows Recovery and Registration of 129T Frame Symbols.

2. Brief Description of the IST Drawings

FIG. 13A shows data recovery from preprocessed signal subspaces by using processed signal parameters.

FIG. 13B shows data recovery from preprocessed subspaces of OFDM signal by using processed signal parameters (DRPS PSP OFDM).

FIG. 13C shows a comparator of signal interval to reference frame (CSR).

FIG. 13D shows data recovery from preprocessed subspaces of OFDM signal (DRPS OFDM).

FIG. 13E shows data recovery from processed parameters of OFDM signal (DRPP OFDM).

3. Brief Description of the DDR Drawings

FIG. 14 shows Direct Data Recovery using parameters of sub-band cycles (DDR PSBC).

FIG. 15 shows Adaptive Data Decoder (ADD) for the DDR PSBC.

FIG. 16 shows Direct Data Recovery using sub-bands subspaces (DDR SBS).

FIG. 17 shows Adaptive Data Decoder (ADD) for the DDR SBS.

FIG. 18 shows Direct Data Recovery using parameters of sub-bands (DDR PSB).

4. Brief Description of the ADD Drawings

FIG. 19 shows calculation and registration of integrals of amplitude gradients for 129 Tone.

FIG. 20 shows selecting reference frames and derivation of Deviation Integrals.

FIG. 21 shows detections of minimums of Deviation Integrals and their utilization for data symbols recovery.

FIG. 22 shows Adaptive Data Decoding from intervals of tone signals.

FIG. 23 shows Adaptive Data Decoding from parameters of tone signals.

DETAILED DESCRIPTION

1. Embodiments of NFIT

The Inverse Transformation Method (ITM) is introduced in FIG. 1 as including subsystems shown in blocks 1-7.

These subsystems enable an efficient low-power processing of high-speed oversampled data enabled by implementing real-time processing units (RTPs) which use simplified algorithms based on variable coefficients.

These RTPs are controlled by a Programmable Control Unit (PCU) which performs a background processing. This background processing includes implementing adaptive non-linear algorithms which analyze received line signal and intermediate processing results, in order to define such coefficients and to download them to content addressed memories such as the Control Register Set for 129 Tone (mentioned further below as 129T_CRS occurring in FIG. 4, FIG. 6 and FIG. 7).

These memories are accessed by the RTPs implementing said ITM outlined in FIG. 1. These RTPs can be implemented as it is detailed below for 129 Tone of DMT Frame.

The RTPs include doing basic sorting of recovered symbols (introduced in the block 7 of FIG. 1 and detailed in FIG. 11) based on symbols occurrence frequencies and noise levels in surrounding sub-tones or tones, while the PCU comprises doing further analysis of such sorted symbols including use of adaptive statistical methods for finalizing selection of most credible symbols.

Said blocks 1-7 are defined in greater detail in FIG. 2-FIG. 11 and corresponding descriptions, as it is referenced below:

block 1 comprising the PAAR Correction, is detailed in FIG. 2 and described further below;

block 2 with the diagram of frequency magnitude response of its frequency sampling filters (shown on the right side) is detailed in FIG. 3, FIG. 4, FIG. 4A and described further below;

block 3 with the diagram illustrating detection of amplitudes and phases of tones & sub-tones (shown on the right side), is detailed in FIG. 5, FIG. 5A, FIG. 6, FIG. 7 and described further below;

block 4 is detailed in FIG. 8;

block 5 is detailed in FIG. 9A-FIG. 9B and FIG. 10;

blocks 6 and 7 are detailed in FIG. 11.

The embodiments presented herein are based on the assumption listed below:

DMT OFDM Frame has frequency 4 kHz.

DMT Frame comprises OFDM Tones numbered from 32 to 255 (such OFDM Tones have frequencies equal to Tone_NR×4 kHz)

The sampling clock 0/Clk (see FIG. 2) is kept in phase with the DMT Frame, and has sampling frequency 4 kHz×255×16=16.32 Mhz.

The NFIT (see FIG. 1) comprises a correction of Peak to Average Amplitude Ratio (PAAR), which reverses a non-linear line signal distortion caused by a gain limitation of line amplification path when a composition of tones having different frequencies & phases ascends into extreme amplitude levels.

The PAAR correction is explained below.

For Ys=Modulus(A/D sample), Ylt=Linearity Threshold, Cs=Compensation Slope;

Yc=Corrected Sample Modulus is calculated as Yc=f(Ys) function defined below:

If Ys>Ylt; Yc=Ys+Cs (Ys−Ylt)$^2$ else; Yc=Ys.

Since such correcting function Yc=f(Ys) maintains continuity of the derivative of the resulting corrected curve, such transformation maintains a smooth transition between the non-corrected and corrected regions while it reverses non-linearity occurring originally in the corrected region due to the gain limitation.

A detailed implementation of such PAAR correction is shown in FIG. 2, wherein the A/D samples are written into the Stage1 of the Synchronous Circular Processor (SCP) comprising A/D_Buffer0/A/D_Buffer1 driven by the circular sub-clocks 1/Clk0/1/Clk1 accordingly (see FIG. 12B explaining circular sub-clocks applications).

Using 2 buffers having separate processing circuits attached enables two times longer processing times for calculating DMT0/DMT1 values with reversed effects of the gain limitation.

The Linearity Threshold (LinThr(D:0)) is subtracted from the amplitude of the attenuated signal sample (i.e. from the Modulus(A/D_Buffer(Sign,D:0)) and such subtraction result is squared and added to the amplitude of the attenuated sample, in order to reverse said gain attenuation.

Any non-linearity can be reversed smoothly (i.e. without derivatives discontinuity) with any accuracy desired by applying polynomial transformation:

$$Y_{reversed}=C_{s0}Y_s; \text{ if } \ldots Y_s\in(0,Y_{t1}]$$

$$Y_{reversed}=C_{s0}Y_s+C_{s1}(Y_s-Y_{t1})^{e1}; \text{ if } \ldots Y_s\in(Y_{t1},Y_{t2}]$$

$$Y_{reversed}=C_{s0}Y_s+C_{s1}(Y_s-Y_{t1})^{e1}+C_{s2}(Y_s-Y_{t2})^{e2}; \text{ if } Y_s\in(Y_{t2},Y_{t3}]$$

$$Y_{reversed}=C_{s0}Y_s+C_{s1}(Y_s-Y_{t1})^{e1}+C_{s2}(Y_s-Y_{t2})^{e2}+\ldots+C_{sN}(Y_s-Y_{tN})^{eN}; \text{ if } \ldots Y_s\in(Y_{t(N-1)},Y_{tN}]$$

wherein; $C_{s0}, C_{s1}, \ldots C_{sN}$ represent slopes of approximations added at $0, Y_{t1}, Y_{t2}, \ldots Y_{tN}$ non-linearity thresholds.

The implementation and equations shown above illustrate a method for reversal of gain non-linearity and/or signal attenuation, wherein such method comprises:

identification of dependency between processed signal attenuation and attenuated signal amplitude;

defining approximation thresholds and their approximation slopes and approximation exponents;

calculating an exponential component for every said approximation threshold exceeded by an attenuated signal sample, by rising a difference, between the attenuated sample and its approximation threshold, to a power defined by its approximation exponent;

calculating an approximation component for every such approximation threshold exceeded by an attenuated signal sample, by multiplying such exponential component by its slope coefficient;

addition of such approximation component, calculated for the particular approximation threshold, to the approximation result comprising previous approximation components calculated for previous approximation thresholds exceeded by the attenuated signal sample;

wherein by such addition of the approximation components calculated for the approximation thresholds exceeded by the distorted and/or attenuated signal sample, said gain-non-linearity and/or signal attenuation is reversed.

This disclosure includes an implementation of a Finite Impulse Response (FIR) filter with a circularly driven register (i.e. consecutive processed samples are clocked in circularly into the register) connected to circuits processing properly delayed samples supplied by the register. Such register based FIR filter is shown in FIG. 3 wherein the FIR filter is exemplified as the $1-z^{-511}$ Comb Filter.

The comb filtering based on "$1-z^{-511}$" begins when N+1=512 samples initializing a new tone are collected in CFR2(S0:S511), wherein:

the first filtered sample S(511) is filtered with the collected already samples S(0)/S(509) delayed 511/2 times accordingly, in order to produce the output CFSO(Sign,E:0) fulfilling the difference equation v(n)=x(n)−r$^N$x(n−N)−r$^2$x(n−2);

and similarly the second filtered sample S(0) is filtered with the collected already samples S(1)/S(510) delayed 511/2 times accordingly, in order to produce the output CFSE (Sign,E:0) fulfilling the same difference equation.

Said corrected DMT0/DMT1 outputs of the 1$^{st}$ SCP stage are connected to the Comb Filter Register 2 driven by 512 circular clocks 2/Clk0, 2/Clk3, . . . 2Clk511 in order to enable the $1-z^{-511}$ Comb Filter of 512$^{th}$ order implemented by the 2$^{nd}$ SCP stage.

Such comb filter has 511 zeros assigning 511 Sub-Bands which can be produced by Frequency Sampling Filters constructed by connecting the output of such Comb Filter to 511 resonating filters defined by the equations:

$$1/(1-e^{j2\pi k/511}z^{-1}) \text{ for } k=0,1,2,\ldots 510.$$

Such idea is implemented in more practical way in FIG. 3 where all the details are shown and described (such Frequency Sampling Filtering named as Type IV FSF is explained comprehensively on the pages 311-319 in the book "Understanding Digital Signal Processing" by Lyons, Ed. 2004").

Consequently "even zeros" from the range of ~64 to ~510 correspond to even Sub-Bands 64-510 which are considered as facilitating DMT tones numbered from 32T to 255T, while "odd zeros" correspond to separating them odd Sub-Bands numbered from 63-511 which are considered as facilitating noise sensing Sub-Tones numbered as 31.5ST, 32.5ST, and 33.5ST to 255.5ST.

Such naming convention of the Tones and Sub-Tones is used further on in this Section text and drawings.

The Comb Filter shown in FIG. 3 uses selection circuits, connected to the circularly driven Comb Filter Register 2 (CFR2), for producing consecutive filtered signal samples.

Another possible implementation can use a shifted CFR2 wherein the DMT0/DMT1 signals are clocked into the same segment S0 of the CFR2 and always the same segments S0/S511 can be used, as providing 511 times delay, for producing Comb Filter Output signal.

This disclosure comprises both; the FIR filter, with the circularly driven filter register, using the selection circuits connected to the register for supplying consecutive signal samples, and the FIR filter, with the shifted filter register, utilizing the shifting of the filter register for supplying consecutive signal samples.

This disclosure includes an implementation of an Infinite Impulse Response (IIR) filter with a circularly driven filter register (i.e consecutive filtered samples are clocked circularly into the register) supplying IIR processing circuits with properly delayed samples. Such IIR filter achieves infinite response characteristic by connecting outputs of such IIR processing circuits back to the inputs of the circularly driven register.

Said IIR Filter with circularly driven register (see FIG. 4), uses selection circuits, connected to the outputs of the Resonator Filter Register (129RFR(S0:S3)), for supplying filter processing circuits which produce consecutive filtered signal samples written back circularly into consecutive samples S0-S3 of 129RFR (S0:S3).

Such circularly driven IIR filter exemplified in FIG. 4, is a resonating filter, having idealistic transfer function $(F(z)=1/(1-e^{j2\pi 258/511} z^{-1}))$ adjusted into the Type IV FSF (explained in the Lyons book mentioned above) for better stability and performance.

Another possible implementation can use a shifted Resonator Filter Register (RFR(S0:S3)) wherein the input signal from the previous stage and outputs of the Resonator Filter Register supply filter processing circuits which produce filtered sample clocked into the same segment S0 of the RFR(S0:S3).

This disclosure comprises both; the IIR filter, with the circularly driven register, using the selection circuits connected to the register outputs for supplying consecutive processed samples, and the IIR filter, with the shifted register, using shifted register outputs for supplying consecutive processed samples to the filter processing circuits.

The odd/even output of the comb filter CFSO(Sign,E:0)/CFSE(Sign,E:0) re-timed in the Comb Filter Reg.3 (CFR3) produces Resonant Filters Selected Input (RFSI(S,E:0)) which is connected to the multiple resonating Infinite Impulse Response (IIR) Filters designated for specific Tones or Sub-Tones.

Such resonating IIR filter designated for the 129Tone (129T) is shown in FIG. 4, wherein:

the reference "(from 129T_CRS)" indicates that any following constant is provided by its register (belonging to the Control Register Set for 129 Tone), wherein this register is loaded by PCU in order to control operations of the Real Time Processor for 129 Tone (129T_RTP);

the coefficient k equals to 2×129=258 for the 129 Tone;

the resonating IIR filtering begins after the CFR3(S0) is produced after collecting N+1=512 samples in CFR2(S0:S511);

the Resonator Filter Register is reset by the signal RESET RFR(S0:S3) before any new tone IIR filtering begins, and furthermore such IIR filtering of an entire sequence of N+1=512 samples is completed before using resulting RFR outputs for any further signal processing.

Similar resonating IIR filter designated for the 129.5Sub-Tone (129.5ST) is shown in FIG. 4A, wherein:

the reference "(from 129.5ST CRS)" indicates that any following constant is provided by its register (belonging to the Control Register Set for 129.5ST), wherein this register is loaded by PCU in order to control operations of Real Time Processor for 129.5Sub-Tone (129.5ST_RTP);

the coefficient k equals to 2×129.5=259 for the 129.5Sub-Tone;

the resonating IIR filtering begins after the CFR3(S0) is produced after collecting N+1=512 samples in CFR2(S0:S511);

the Resonator Filter Register is reset by the signal RESET RFR(S0:S3) before any new tone IIR filtering begins, and furthermore such IIR filtering of an entire sequence of N+1=512 samples is completed before using resulting RFR outputs for any further signal processing.

This disclosure comprises implementation of integrating and/or averaging time domain filter with a circularly driven register (i.e consecutive processed samples are clocked in circularly into the register) supplying such filter's integrating/summating circuits with a proper set of integrated/summated samples.

Such time domain filter achieves integration/summation over a consecutive set containing a required number of samples, by circular replacing of the first sample of a previous set, stored in the circular register, with a new sample following the last sample of the previous set. Resulting consecutive set of samples on the circular register outputs is supplied to the filter integrating/summating circuit producing filter output.

Such time domain filter is exemplified in FIG. 5 where it is used for integration of 129T Half-Cycles and for detecting phases of such Half-Cycles (HC) ends, wherein an end of the present HC occurs at the beginning of the next opposite HC.

Since the input to such HC integrating filter has already been filtered by the previous stages FSF, such input must have sinusoidal shape. Therefore resulting integral of amplitudes of 129T HC represents filtered indicator of original amplitude of the 129T sinusoid. Such integral is used for the recovery of the original tone amplitude as it explained later on.

Since such time domain filter and all the previous filters belong to the SCP operating in phase with the Tones Frame (DMT Frame), such detected HC phase is used for recovering phase of the originally transmitted HC of 129T.

The outputs of the 129T Resonator Filter Register (129RFR(S0:S3)) are clocked in circularly into the Stage5/129 Half Cycle Register (129HCR(S0:S15)) which comprises 16 samples covering an approximated HC interval.

The outputs of 129HCR are connected to the summating circuits producing an integral of the last 16 samples long sequence (named Next Integer (NI)).

While Next Integral (NI) of amplitudes of HC long interval is calculated and fed to the Integral Register (IR(0:K)); it is also compared with the Previous Integral (PI) kept in Previous Integral Buffer (PIB(0:K)), in order to verify if Half-Cycle end is reached.

Such HC end occurs when NI<PI/NI>PI is detected following positive/negative HC accordingly.

When the end of positive/negative HC is detected, the integral of amplitudes over positive/negative HC is loaded into 129 Positive Ampl. Reg. ((129PAR((0:K))/129 Negative Ampl. Reg. (129NAR(0:K)) by signal 129Ld_PA/FE/129Ld_NA/RE accordingly.

Signals 129Ld_PA/FE/129Ld_NA/RE are generated by DecCLK/IncCLK strobes, only if IncCTR>5/DecCTR>5 condition is met. The purpose of such preconditioning is prevention of oscillations (such as caused by computational instability at small signal amplitudes), by providing histeresis introduced by Inc.Counter(0:2)/Dec.Counter(0:2) for positive/negative HC accordingly.

Said IncCTR>5/DecCTR>5 conditions are possible only when the multi-tone processing inhibition signal MTP_Inh is de-activated after initial 640 sampling periods of every new DMT frame (see FIG. 5 and FIG. 6).

The 642 Decoder (shown in the block 8 in FIG. 6) decodes such 640 samples delay introduced by waiting until 640+2 sampling intervals are counted by Frame Samples Counter (FSC), wherein the additional 2 intervals account for the 2 sampling intervals occurring between the MTP_Inh generation in the SCP stage 4 and its actual application in the SCP stage 6.

In addition to the prevention of IncCTR>5/DecCTR>5 conditions, MTP_Inh signal inhibits any generation of 129Ld_PHC/129Ld_NHC (see FIG. 6), and thus MTP_Inh makes sure that no time domain processing takes place before valid signals are supplied by the frequency domain filters.

Circuit shown in FIG. 5A providing "Half_Cycles Integration & Amplitudes Registration for 129.5 Tone", performs the same operations as the circuit shown in FIG. 5 described above.

Since SCP operations are driven by clocks and sub-clocks having known phase and frequency relation to DMT Frame, results produced by SCP stages have known phase relations to DMT Frame as well. Therefore such detection of an end of positive/negative HC can be used to detect phase of Tone cycle producing such HC.

As such detection of positive/negative HC end signals detection of falling/rising edge of 129 Tone sinusoid as well, signal 129Ld_PA/FE/129Ld_NA/RE is used in FIG. 6 for capturing phase of such falling/rising edge by capturing 129 Tone Phase in 129 Falling Edge Reg. (129FER(0:5))/129 Rising Edge Reg. (129RER(0:5) accordingly.

This FIG. 6 shows Phase Capturing and Tone Processing Initialization for the 129T/128.5ST/129.5ST, wherein:
the reference "(from 129T_CRS)" indicates that any following constant is provided by its register (belonging to the Control Register Set for 129 Tone), wherein this register is loaded by PCU in order to control operations of Real Time Processor for 129 Tone (129T_RTP);
since 129RisingEdgeReg./129FallingEdgeReg. captures the end of a negative/positive half-cycle, it represents phase of the rising/falling edge accordingly of a sinusoid represented by such negative/positive half-cycle.

Such 129 Tone Phase is produced by subtracting 129 Last Cycle Phase Reg. (such 129LCPR(0:13) specifies nr. of sampling intervals corresponding to the beginning of the presently expected cycle of 129 Tone) from Frame Samples Counter (such FSC(0:12) specifies nr. of sampling intervals which past from the beginning of the present DMT Frame).

Consequently such capture of the 129 Tone Phase defines phase of presently detected cycle of 129 Tone measured in number of sampling intervals which occurred between the beginning of the expected cycle (having 0 phase) and the detected 129T cycle.

Content of 129LCPR is derived by comparing if FSC-LCPR=129 Cycle (129 Cycle represents number of sampling intervals expected during consecutive 129Tone cycle), and by loading FSC into LCPR whenever such equality condition is fulfilled.

In order to avoid accumulation of digitization errors during such multiple comparisons (involving fractional numbers expressing expected lengths of 129Tone cycles);
a method using fractional bit staffing (described also in public domain) can be applied by adding consecutive bits from Fractional Bits Register (FBR(0:128)) to 129CycleBase(0:4).

These additions provide consecutive values of 129Cycle (0:5) keeping total digitization error below single sampling interval.

SCP combines in-phase processing in frequency domain with in-phase processing in time domain.

Therefore SCP detects time/phase dependence between noise sub-bands and DMT Tones.

Consequently SCP enables estimating and compensating impact of neighbor noise sub-bands and neighbor tones on specific cycles of particular tones.

Such estimates and compensation use data from training session and from adaptive wave-form sampling and screening for identifying noise patterns and for programming compensation and inverse transformation coefficients by PCU.

Such detection of phase relations is facilitated by capturing a falling edge of positive HC of 129T/128.5ST/129.5ST in 129FER(0:5)/128.5FER(0:5)/129.5FER(0:5) by signal 129Ld_PA/FE/128.5Ld_PA/FE/129.5Ld_PA/FE.

Similarly a rising edge of negative HC of 129T/128.5ST/129.5ST is captured in 129RER(0:5)/128.5RER(0:5)/129.5RER(0:5) by signal 129Ld_NA/RE/128.5Ld_NA/RE/129.5Ld_NA/RE.

In order avoid using incomplete HC detected at a beginning of DMT Frame, second appearance of signal LD_PA/FE/LD_NA/RE is required in order to produce signal 129Ld_PHC/129Ld_NHC enabling further processing of 129Tone shown in FIG. 7.

This FIG. 7 shows Retiming & Averaging of Positive and Negative HC for 129T/128.5ST/129.5ST, wherein:
the content of 129FER/128.5FER/129.5FER is processed by the "Modulo-Cycle Adder of Half-Cycle" converting a phase of falling edge into a corresponding phase of rising edge,
wherein this phase of rising edge represents phase of sinusoid defined by a positive half-cycle ending at the time instant captured in 129FER/128.5FER/129.5FER.

The 7/Clk shown in FIG. 7 generates single PHC/Clk/CYC/Clk impulse if it detects Ld_PHC/Ld_NHC timed by 6/Clk. Such PHC/Clk re-times 129RER(0:5)/128.5RER(0:5)/129.5RER(0:5) by re-loading them into 129REB(0:5)/128.5REB(0:5)/129.5REB(0:5), which are:
averaged with 129FER(0:5)/128.5FER(0:5)/129.5FER(0:5) converted into cycle edge by Modulo-Cycle Addition of Half-Cycle);
and re-timed with CYC/Clk loading them into 129AER(0:5)/128.5AER(0:5)/129.5AER(0:5).

The positive amplitude registers 129PAR(0:K)/128.5PAR(0:K)/129.5PAR(0:K) are averaged with 129NAR(0:K)/128.5NAR(0:K)/129.5NAR(0:K) accordingly and loaded into the averaged amplitude registers 129AAR(0:K+1)/128.5AAR(0:K+1)/129.5PAR(0:K+1).

SCP comprises using every positive or negative HC as separate data used for recovering a tone symbol. Such ability of using singular Half-Cycles for data recovery provides a huge data redundancy which facilitates use of statistical methods much more reliable than conventionally used DFT averaging over DMT Frame.

Nevertheless, in order to illustrate implementation having lower power dissipation; SCP exemplified by this embodiment has 7th stage (see FIG. 7) combining amplitudes and phases of positive and negative HC into averages per cycle (which still provide significant redundancy).

The NFIT comprises an inversion of frequency related distortions in a transmission channel (such as DMT link), by applying different normalizing coefficients to different Carrier Frequencies (such as DMT Tones) wherein such normalizing coefficients are adjusted to equalize amplitude and phase distortions of the transmitted Carrier Freq. including distortions introduced by a signal processing applied; such inverse normalization of amplitudes and phases comprises:
identification of the frequency related distortions occurring on the Carrier Frequencies (or DMT Tones) by using training sessions or adaptive wave-form sampling/screening controlled by PCU;
calculating normalizing coefficients, for such Carrier Frequencies or DMT Tones, by PCU;
using such normalizing coefficients, supplied by PCU, by real-time processing unit for equalizing such frequency related distortions in the processed Carrier Freq. or DMT Tones.

Such amplitude and phase normalization for 129T/128.5ST/129.5ST is shown in FIG. 8, wherein it includes normalization of noise sensing Sub-Tones (128.5ST/129.5ST) neighbor to the data carrying 129T.

129 Tone phase defined by 129 Tone Averaged Edge Register (129AER(0:5)), is normalized by multiplying by the 129T Phase Normalizing coefficient (129PhaNor) and by adding the 129T Phase Adjusting coefficient (129PhaAdj).

Since sinusoidal noise contribution from such neighbor sub-tones is dependent on phase differences between the tone and the sub-tones, such phase differences are normalized by multiplying them by the Phase Normalizing coefficient.

129T Averaged Amplitude Register (129AAR(0:K+1)) and its 128.5ST/129.5ST counterparts ((128.5AAR(0:K+1)/(129.5AAR(0:K+1)) are normalized by multiplying them by the 129T Amplitude Normalizing coefficient (129AmpNor).

All such normalizing coefficients are taken from the 129 Tone Control Register Set (129T_CRS) which is pre-loaded by PCU implementing adaptive distortion reversing techniques.

While SCP comprises performing signal processing operations which are synchronized by the processed incoming signal, such approach comprises two different synchronization methods specified below and exemplified by the embodiments shown herein.

When SCP stages (such as previous 7 stages) perform processing of belonging to frequency domain DMT Tones (or Multi-Band carriers); they are synchronized by DMT Frame (or channel frame), as such stages are driven by the clocks or sub-clocks synchronous to the sampling clock which is phase locked to DMT Frame (or channel frame).

When SCP stages (such as this $8^{th}$ stage and next stages) perform processing of already detected tone (or band) cycles belonging to time domain; they are synchronized by such cycles detection events instead, as such stages are driven by clocks generated when information about cycle detection is passed from a higher level stage to the next level.

Such second synchronization method does not do (discontinues) any further processing if a new cycle of the tone (or band) is not detected.

SCP comprises both synchronization methods defined above.

The cycle detection signal CYC/Clk enables using leading edge of 8/Clk/8 (having frequency 8 times lower than the sampling clock) for the one time activation of AS1/Clk signal which drives all the registers of the SCP $8^{th}$ stage presented in FIG. 8.

Such AS1/Clk signal remains active (for about 1 sampling period) until the leading edge of the next 9/Clk signal activates the AS1_RST signal (see FIG. 9A).

Such AS1_RST signal enables using leading edge of the next 8/Clk/8 for the one time activation (for about 1 sampling period) of the signal which initiates reading of amplitude and noise compensation coefficients from Memory of Noise Compensation Coefficients (MNCC).

Such timing enables Address Decoders for Memory of Noise Compensation Coeff. (AD_MNCC) to have processing time extended to 8 sampling intervals in order to use normalized amplitudes and phases provided by the previous 8th stage for decoding Address(0:8)/NS_MNCC before AS2/Read_MNCC is activated.

The NFIT comprises an efficient non-linear reversing of transmission channel distortions and non-linear noise compensation in over-sampled signals, by implementing real time processing units (RTPs) using simplified algorithms applying variable coefficients, wherein such RTPs are controlled by the back-ground processing PCU which implements adaptive non-linear algorithms by analyzing received line signal and intermediate RTPs processing results and by defining and down-loading such coefficients to content addressed memories accessed by RTPs such a 129 Tone Control Registers Set (129T_CRS) or Memory of Noise Compensation Coefficients (MMCC).

Such NFIT noise compensation method comprises RTP operations listed below:
frequency domain and/or time domain processing of data carrying signal and/or neighbor tones or frequency bands in order to derive estimates of parameters influencing distortion or noise components in the signal, wherein such parameters may include amplitudes and/or phase of data carrying tone or freq. band and/or surrounding noise or interference from neighbor tones or bands;
converting such parameters into an effective address of said content addressed memory in order to access coefficients providing most accurate compensation of said channel distortion or noise;
applying such coefficients to a sequence of predefined arithmetic and/or logical operations performed on the received signal in order to reverse transmission channel distortions and/or to improve signal to noise ratio.

Such noise compensation method is illustrated in FIG. 9A-FIG. 9B and FIG. 10 showing stage $9^{th}$ and $10^{th}$ of the SCP embodiment.

It is shown in FIG. 9A that:
said noise affecting parameters supplied by 129T/129.5ST Normalized Amplitude Registers (abbreviated to 129NAR(0:P)/129.5NAR(0:P)) and 129.5ST Averaged Phase Difference Register (abbreviated to 129.5APDR(0:L)
are used together with the 129 Tone Amplitude Thresholds/Next Sub-tone Amplitude Thresholds and Next-Sub-tone Phase Difference Thresholds,
in order to decode address to the Next Sub-tone MNCC (Address(0:8)/NS_MNCC).

It is detailed in FIG. 9A that:

said 129 Tone Amplitude Thresholds facilitating use of different coefficients programmed adaptively by PCU, are applied as T/AT1, T/AT2, . . . T/AT6, T/AT7;

said Next Sub-tone Amplitude Thresholds facilitating use of different coefficients depending on 129.5ST Amplitude, are applied as NS/AT1, NS/AT2, . . . NS/AT6, NS/AT7;

said Next Sub-tone Phase Difference Thresholds facilitating use of different coefficients depending on 129.5ST Phase Difference, are applied as NS/PDT1, NS/PDT2, . . . NS/PDT6, NS/PDT7;

said Address(0:8)/NS_MNCC selects reading & loading of coefficients, compensating expected noise contribution from the 129.5ST, to their registers 129.5Ampl. Addition Reg/129.5 Ampl. Multiplication Reg./129.5 Phase Addition Reg./129.5 Phase Multiplication Register.

Very similar circuits and methods (shown in FIG. 9B) addressing the Previous Sub-tone MNCC (Address(0:8)/PS_MNCC) are applied in order to select & load coefficients, compensating expected noise contribution from the 128.5ST, to their registers 128.5Ampl. Addition Reg/128.5 Ampl. Multiplication Reg./128.5 Phase Addition Reg./128.5 Phase Multiplication Register.

These registers, loaded from NS_MNCC and PS_MNCC, supply coefficients producing estimates of noise compensating components which are added to 129T amplitude and to 129T phase (as shown in FIG. 10), in order to provide compensated amplitude in 129 Compensated Amplitude Register (129CAR(0:P,ERR)) and compensated phase in 129 Compensated Phase Register (129CPR(0:L,ERR)).

Such noise compensating coefficients are derived by PCU based on evaluations of noise patterns occurring in tones frequency region and their contributions to signal noise acquired during training session and supported by adaptive wave-form sampling and screening utilizing wide coverage of almost entire spectrum by Tones and Sub-tones detected with said FSFs.

The NFIT comprises:

detecting noise patterns occurring in frequency domain by using frequency domain processing such as Frequency Sampling Filters for noise sensing in a wide continuos frequency spectrum incorporating data carrying tones or frequency bands;

detecting noise patterns occurring in time domain by using time domain processing for noise sensing over time intervals including tone (or band) reception intervals;

using back-ground PCU for analyzing such detected noise patterns and for creating deterministic and random models of occurring noise patterns;

using such models of noise patterns for deriving noise compensation coefficients used by the Real Time Processors for improving signal to noise ratios in received data carrying signal;

taking advantage of the recovered symbols redundancy (assured by the RTPs time domain processing ability of recovering data symbol from every tone cycle) by applying such noise models for estimating probability of symbols recovered and/or for dismissing symbols accompanied by high noise levels close in time;

using such probability estimates and/or dismissals of unreliable symbols for applying statistical methods which are more reliable than conventional DFT averaging of tone signal received.

Such ability of said symbol dismissal, if detected in a vicinity of high noise, is illustrated in FIG. 10, wherein:

the comparison is made if the sum of 129T Amplitude Noise Components (128.5/129.5Amp.NoiseComp.) exceeds 129 Maximum Ampl. Noise (abbreviated to 129Max.AmpNoise) pre-loaded to 129T-CTRS by PCU as a total limit on both acceptable compensations from 128.5ST and 129.5ST taken together.

if the comparison 128.5ANC+129.5ANC>129MAN, the ERROR bit marking such symbol for dismissal is written to the 129CAR(0:P,E).

Similarly for the 129T Phase Noise Components (128.5/129.5Pha.NoiseComp.):

if the comparison 128.5PNC+129.5PNC>129MPN, the ERROR bit marking such symbol for dismissal is written to the 129CAP(0:L,E).

The NFIT comprises a method for recovery of data symbol transmitted by a singular half-cycle/cycle of said DMT or Multiband tone, wherein:

an amplitude measure of said singular half-cycle/cycle, such as integral of amplitude over the half-cycle/cycle time period, and a phase measure of the half-cycle/cycle, are applied to a symbol decoder transforming such combination of amplitude and phase measures into a number representing said recovered data symbol.

Such symbol recovery method further comprises:

comparing said amplitude measure to predefined amplitude thresholds, in order to decode an amplitude related factor in a recovered symbol definition;

comparing said phase measure to predefined phase thresholds, in order to decode a phase related factor in recovered symbol definition;

wherein such amplitude and phase comparators produce their parts of a binary address to a content addressed memory storing a counter of half-cycles/cycles detecting said symbol occurrences during said DMT or Multi-band signal frame;

wherein such symbols counters memory (SCM) can accommodate different symbols, detected during said DMT or Multi-band frame, varying during the same frame due to said channel distortions and changing in time noise distribution;

sorting symbols, carried by singular half-cycles/cycles, detected during said DMT or Multi-band frame, in accordance to their detections numbers and/or distributions;

application of statistical methods for selecting data symbol recovered, from said DMT or Multiband tone, such as selection of a symbol having higher detections number in a range outlined with statistical distribution models.

Implementation of such data symbol recovery, is exemplified in FIG. 11.

A DMT control registers set (DMT_CRS) programmed adaptively by PCU, supplies said amplitude thresholds (AT1, AT2, AT3, AT4) and said phase thresholds (PT1, PT2, PT3, PT4) to address decoder for symbols counts memory (AD_SCM); wherein:

said AT1, AT2, AT3, AT4 (programmed adaptively by PCU) represent Amplitude Thresholds digitizing recovered amplitude;

said PT1, PT2, PT3, PT4 (programmed adaptively by PCU) represent Phase Thresholds digitizing recovered phase.

AD_SCM digitizes compensated amplitude/phase provided by CAR(0:P)/CPR(0:L) by comparing them with said amplitude and phase thresholds, in order to produce address ADR(0:3) equal to binary code of symbol detected.

Such ADR(0:3) is applied (as ADR/SCM) to the symbols counts memory (SCM) when the read-write signal (Rd-Wr/SCM) initializes read-write cycle in 129T symbol counts memory (129SCM).

In response to such Rd-Wr/SCM signal said 129SCM provides a content of a symbol counter (129Symb.Count(0:8)) identified by said ADR/SCM.

129Symb.Count is increased by 1 and is written back to the same symbol location in SCM (as updated counter CNT-UPD(0:8)/SCM), if 129SymAcc=1 (i.e. if both Error Bits CAR(E) and CPR(E) are inactive).

However; 129Symb.Count remains unchanged when it is written back to the same SCM location, if 129SymAcc=0 (i.e. if CAR(E) or CPR(E) is active).

Maximum Count of detections of the same symbol discovered in present 129T, is stored in 129Max.CounterReg. (129MCR(0:8)) which is read by PCU at the end of DMT frame.

Any consecutive updated counter CNT-UPD/SCM (abbreviated as 129SC+1) is compared with such 129Max.CounterReg. (abbreviated as 129MCR).

If (129SC>129MCR)=1; the newly updated counter is loaded to said 129Max.CounterReg., and the address of the newly updated counter (equal to the binary code of the symbol detected) is loaded to 129Max.Cont.Addr.Reg. (129MCAR(0:3) which is read by PCU at the end of DMT frame.

Otherwise if (129SC>129MCR)=0; both 129Max.CounterReg. and 129Max.Cont.Addr.Reg. remain unchanged.

In order to simplify further PCU operations; there is a 129T detected symbols map register (129DSMR(1:16)) which has 16 consecutive bits designated for marking occurrence of the 16 consecutive symbols during DMT frame, wherein particular marking bit is set to 1 if corresponding symbol occurs one or more times. Such 129DSMR(1:16) is read by PCU at the end of DMT frame.

2. Embodiments of IST

The DRPS OFDM described in configuration 6 and shown in FIG. 13D, is designed to compare half-cycles/cycles of tones/sub-bands received from the resonating filters (see FIG. 4) with reference frames having expected sinusoidal contours in order to detect which of such frames is the closest one.

Such comparison can be accomplished using comparator shown in FIG. 13C (explained further below) as producing deviation integrals for continuing sinusoidal outputs produced by the resonating filters.

Averaged values of such deviation integrals can be used to select one of reference frames applied to this tone/sub-band as being the closest one and thus being useful for recovering amplitude related component of the data symbol.

Occurrence of minimum values may indicate phase of the tone/sub-band and thus can be useful for recovering phase related component of the symbol.

Samples of an interval of said received or preprocessed signal may be compared with elements of a reference frame as it is shown in FIG. 13C and explained below.

For a signal interval ending with a sample Sk of a signal, earlier samples $S_{k+1}$ of said sample $S_k$, may be defined by using 1 ranging from 0 to 15 if it is assumed that this interval is 16 samples long.

For such interval a deviation of its sample $S_{k+1}$ from its corresponding element $R_1$ of a reference frame may be calculated as Modulus of $(S_{k+1}-R_1)$.

Consequently for every such interval, its deviation integral $DI_k$ may be calculated as equal to:

$$DI_k = \sum_{1=0}^{15} |S_{k+1} - R_1|$$

Estimates of minimums of such deviation integrals may be used to verify if:
the interval comprises a data carrying contour (such as an edge of PAM or a half-cycle or cycle of tone or sub-band of OFDM);
the frame is close enough to estimate a range of amplitude and phase represented by the contour in order to identify received or preprocessed signal subspace which this contour belongs to,
wherein this particular subspace is predefined as carrying specific data by the inverse transformation algorithm.

As it has been indicated in the NFIT embodiment, the direct data recovery may be achieved by using such contours subspace identifiers for addressing Content Addressed Memory, pre-loaded with data implementing said inverse transformation algorithm.

Since this embodiment deviation integrals result from adding positive deviations between single samples and their mask counterparts, minimum values of such integrals indicate edge occurrences.

Such frame (having amplitude and phase attributes assigned to it) can recover specific data symbol encoded originally into a particular half-cycle/cycle by addressing a Content Addressed Memory.

The DRPS PSP OFDM described in configuration 9 and shown in FIG. 13B, is designed to use:
amplitude integrals, produced by NFIT circuits for amplitude integration and registration (see FIG. 5)
and phases of half-cycles/cycles, supplied by NFIT circuits for phase capturing (see FIG. 6),
for selecting reference having amplitudes and phases close enough to limit number of comparisons made simultaneously for high order OFDM codes applied.

Such selection of close frames can be followed by comparisons interpretations and symbol recovery similar to those described above.

The DRPS PSP OFDM configuration shown in FIG. 13E, is optimized (compared to the configuration 12 and another presented in "Embodiments of NFIT") by direct addressing of Content Addressed Memory with amplitude integrals and phase captures in order to recover data symbols, instead of comparing these integrals and phase captures with their references (as it's shown in configuration 12) or thresholds (as it's shown in "Embodiments of NFIT") before applying the inverse transformation of sub-ranges identified by these comparisons.

3. Embodiments of DDR and ADD

The embodiment of DDR PSBC described in the section "2. Summary of DDR" is shown in FIG. 14 and explained below.

The programmable control unit (PCU) reads received signal samples supplied by a waveform screening and capturing circuit (WFSC).

The PCU performs background processing in order to derive and keep updating a relation between said data transmitted originally and said subranges of amplitudes/phases of cycles or half-cycles of sub-band signals.

Such derivation is based on theoretical models of transmission channels and/or training sessions and an analysis of said received signal samples supplied by the WFSC.

The WFSC is described in the sec. "2. Summary of NFIT" on page 47 and its configuration with PCU is described in the same section on page 30.

The PCU specifies such relation by:
producing said references defining said amplitudes/phases subranges and an assignment of said specific transmitted symbols as corresponding to said specific amplitudes/phases subranges;
supplying said assignment of specific transmitted symbols as corresponding to specific subranges of amplitudes/phases detected by the Received Signal Processor (RSP) performing real time processing.

The PCU may also control said real time processing performed by the RSP and modify coefficient used in RSP operations in order to improve their efficiency.

Such RSP implementations are exemplified herein with the circuits described in the sec. "1. Embodiments of NFIT" on pages 51 and 53-59 and shown in FIG. 3-FIG. 6.

The Adaptive Data Decoder (ADD) is shown in FIG. 15.

The References Register is loaded from PCU with references defining subranges of parameters (amplitudes/phase of cycles or half-cycles).

Such signal parameters are compared to these references by the Comparator in order to detect which references is this parameter the closest to.

The Comparator uses such closest references to define a binary address of a cell of the Content Addressed Memory (CAM) which contains data symbol loaded to the CAM by the PCU signal assigning data symbols to parameters subranges.

The ADD recovers data symbol corresponding to the signal parameters supplied to it from the RSP, by simply reading this cell from the CAM.

Such DDR configuration can accommodate instantly fast changing characteristics of the received signal and/or transmission channel,
since the RSP can produce signal parameters characterizing channel interferences and/or history of a particular signal, in addition to parameters characterizing said particular signal received presently.

Such additional parameters can be compared with their references derived and supplied by PCU, in order to modify said CAM address to one which selects a cell containing appropriate data symbol.

Such additional parameters can be derived to characterize distortions introduced by signals having adjacent frequencies contributed by the environment of a particular sub-band including external noise or other components of received signal.

The frequency sampling configurations disclosed in the RSP's RTP (see pages 51, 53-59) can perform on chip spectrum analysis exemplified therein by detecting and characterizing parameters of intermediate frequencies occurring between data carrying sub-bands.

This application includes using such parameters of intermediate frequencies for reversing effects of distortions caused by a noise sampled at these intermediate frequencies, by applying them to and using by the same ADD-PCU configuration as the parameters related to specific sub-bands only described above.

The embodiment of DDR SBS described in the section "2. Summary of DDR" is shown in FIG. 16 and explained below.

This embodiment of DDR SBS preserves the features of DDR PSBC described above with the exception of two structural differences described below.

It uses sub-band signals as referencing signals for identifying referencing subspaces instead of using signal parameters for identifying parameters subranges, in order to address CAM and recover data symbols from it.

Therefore it needs deviation integrals calculators and analyzer and reference frames selector/identifier shown in the ADD presented in FIG. 17.

Such deviation integrals calculators needed for decoding data from OFDM sub-bands have been already described and shown in FIG. 13C of IST.

Such utilization of deviation integrals instead of straight parameters can allow more reliable data recovery which can be more desirable in Base Stations communicating with mobile devices transmitting less powerful signals.

The embodiment of DDR PSB described in the section "2. Summary of DDR" is shown in FIG. 18.

It keeps general features of the PSBC but it does not require oversampling or recovery of individual cycles or half-cycles of OFDM sub-bands.

Therefore its applications include FFT based OFDM receivers used commonly as it is shown in FIG. 18.

The embodiments of the ADD systems and circuits presented in FIG. 13C, FIG. 16 and FIG. 17 comprise solutions shown in the FIG. 19. FIG. 20 and FIG. 21;
wherein integrals of tones amplitude gradients instead of the integrals of tones amplitudes are calculated and used as tones parameters utilized for identifying the referencing subspaces and recovering data which these subspaces correspond to.

This identification of referencing subspaces and the data recovery are conducted by:
using these gradient integrals for selecting reference frames (defining the referencing sub-spaces) which are expected to be the closest to the received tones;
calculating integrals of deviations between the received tones and the selected reference frames;
detecting minimums of the deviation integrals in order to identify the closest reference frame and the referencing sub-space defined by the closest reference frame;
wherein the selection of the reference frames may be accomplished by using the gradient intervals for addressing a Content Addressed Memory (preloaded by the PCU based of the signal analysis) and reading the closest frames;
wherein the closest frame may be used for addressing another Content Addressed Memory (preloaded by the PCU as well) in order to read data corresponding to the referencing subspace defined by the closest frame.

It is shown in FIG. 19 that the calculation and registration of the gradients integrals may be implemented with the circuit very similar to that shown in FIG. 5 and described in &3/page57-&1/page58.

The only differences are described below.

An integral of gradients around a specific middle signal sample is calculated by:
subtracting amplitudes of previous samples from amplitudes of corresponding following samples shifted forward by the same number of sampling periods as the previous samples are trailing the specific middle sample;
adding all the subtraction results derived over a half-cycle surrounding the specific middle sample.

In order to implement such algorithm with signals available in FIG. 19 the following equation needs to be implemented:

$$\text{Next Integral } (NI) = \sum_{k=0}^{k=7} 5/QCR(Sk) - \sum_{k=0}^{k=7} 6/QCR(Sk)$$

Therefore the half-cycle sub-tone interval is split into two quarter-cycle intervals which are pre-loaded into two different stages $5^{th}$ and $6^{th}$ instead of being accommodated in the $5^{th}$.stage as previously.

Consequently the registrations of maximum gradient integrals in the 129Positive Grad.Register and minimum gradient integrals in the 129Negative Grad. Register are delayed by one stage and are done in the $7^{th}$ stage instead of the $6^{th}$.stage.

FIG. 20 shows selecting reference frames by reading them from the Content Address Memory of Reference Frames (CAM RF), wherein:

the maximum and minimum gradients represented by the outputs of the gradient registers named 129PGR(0:K) and 129NGR(0:K) (selected by signals 129Ld_PG/FE and 129Ld_NG/RE accordingly) provide suitable addresses to the CAM RF;

the selected reference frame (Read Ref. Frame RRF(0:15)) is read and loaded to selected frame register (Selected Ref. Frame RF(0:15)) synchronously to the tone half-cycle currently inserted into the shift register (ShiftReg SR(0:15)) from the half-cycle register (7/129HalfCycleReg. 7/129HCR(0:15)).

Such synchronous operations essential for providing corresponding arguments to the Deviation Integral Arithmometer are controlled by synchronization circuit generating read request signal when maximum and minimum gradients are detected, wherein the 129Ld_PG/FE and 129LD_NG/RE are activating proper bit in the register 7/129RRR(0:15) prompting the read request signal Read Request and causing the data ready signal Data Ready to appearing by one half-cycle before the half-cycles having these maximum and minimum gradients.

Such by half-cycle forward displacement allows reference frame application to the half-cycles preceding detections of maximums and minimums occurring at the end of half cycles.

The minimum of deviation integrals (see 129MinimumDeviationRegister 129MDR(0:D)) is detected as shown in FIG. 21 with the circuit very similar to that explained in the &3/page57-&1/page.58.

These minimums of deviation integrals are utilized for recovering data symbols from tone half-cycles by using the configuration of the Content Address Memory of Data Symbols (CAM DS) and supporting circuits in the configuration very similar to that explained above as used for reading selected reference frames from the CAM RF.

It shall be noted that using such integrals of half-cycles of gradients instead of amplitude has the advantage of eliminating problems with any floating of DC level in OFDM tones.

The above gradient based solution exemplifies more complex method where subranges of gradients (used as tones parameters) are used to select closest reference frames detecting tones subspaces which are inversely transformed to detect original data.

It shall be noted the ADD solutions contributed herein also include simpler solutions wherein:

subranges of gradients (used as tones parameters) are subjected directly to said inverse transformation recovering original data without even using said reference frames;

or saids reference frames are applied directly to the tones and use of parameters for these frames selection is avoided.

FIG. 22 shows FIG. 16 (described in subsection "3. Embodiments of DDR and ADD") supplemented by: description of the Sub-band Signals, which corresponds to that provided in FIG. 13D; blocks presenting Defining Distinctive Sets, Defining Assignment of Transmitted Data and Identification of the Defined Distinctive Sets, which correspond to steps described in subsection "1. Summary of IST".

FIG. 23 shows FIG. 14 (described in subsection "3. Embodiments of DDR and ADD") supplemented by description of the Signal Parameters corresponding to FIG. 13E and the blocks mentioned above as corresponding to the steps described in subsection "1. Summary of IST".

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the full scope consistent with the claims, wherein reference to an element in the singular is not intended to mean "one and only one" unless specifically so stated, but rather "one or more". All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

The invention claimed is:

1. A method for adaptive data recovery (ADR) from a received orthogonal frequency division multiplexing (OFDM) signal by an adaptive decoding of transmitted data symbols from intervals of tone signals of the received OFDM signal wherein the intervals of the tone signals correspond to cycles or half-cycles of the tone signals, wherein the received OFDM signal is produced by a transmitter coding circuit converting the transmitted data symbols into a transmitted OFDM signal and a transmission system performing a transformation of the transmitted OFDM signal into the received OFDM signal wherein the transformation introduces distortions including noise to the received OFDM signal; wherein the ADR method comprises the steps of:

defining distinctive sets of the intervals of the tone signals wherein each of the distinctive sets comprises the intervals of the tone signals expected to represent one of the transmitted data symbols;

preloading the transmitted data symbols to a content addressed memory;

producing, using a received signal processor, the intervals of the tone signals from the received OFDM signal;

identifying ones of the distinctive sets comprising the produced intervals by processing the produced intervals;

decoding adaptively the transmitted data symbols by reversing both the transmitter coding and the transformation distortions, wherein the reversing of both the transmitter coding and the transformation distortions is achieved by reading the transmitted data symbols from the content addressed memory addressed with identifiers of the identified distinctive sets.

2. A method for adaptive data recovery (ADR) from a received orthogonal frequency division multiplexing (OFDM) signal by an adaptive decoding of transmitted data symbols from parameters of tone signals of the received OFDM signal, wherein the received OFDM signal is produced by a transmitter coding circuit converting the transmitted data symbols into a transmitted OFDM signal and a transmission system performing a transformation of the transmitted OFDM signal into the received OFDM signal wherein the transformation introduces distortions including noise to the received OFDM signal; wherein the ADR method comprises the steps of:

defining distinctive sets of the parameters of the tone signals wherein each of the distinctive sets comprises the parameters of the tone signals expected to represent one of the transmitted data symbols;

preloading the transmitted data symbols to a content addressed memory;

producing, using a real time processor, the parameters of the tone signals from the received OFDM signal wherein the produced parameters correspond to amplitudes or phases of the tone signals, wherein operations of the real time processor are controlled by a background processor;

identifying ones of the distinctive sets comprising the produced parameters by processing the produced parameters;

decoding adaptively the transmitted data symbols by reversing both the transmitter coding and the transformation distortions, wherein the reversing of both the transmitter coding and the transformation distortions is achieved by reading the transmitted data symbols from the content addressed memory addressed with identifiers of the identified distinctive sets.

3. A method for adaptive data recovery (ADR) from a received orthogonal frequency division multiplexing (OFDM) signal by an adaptive decoding of transmitted data symbols from parameters of cycles or half-cycles of tone signals of the received OFDM signal, wherein the received OFDM signal is produced by a transmitter coding circuit converting the transmitted data symbols into a transmitted OFDM signal and a transmission system performing a transformation of the transmitted OFDM signal into the received OFDM signal wherein the transformation introduces distortions including noise to the received OFDM signal; wherein the ADR method comprises the steps of:

defining distinctive sets of the parameters of the cycles or half-cycles of the tone signals wherein each of the distinctive sets comprises the parameters of the cycles or half-cycles of the tone signals expected to represent one of the transmitted data symbols;

preloading the transmitted data symbols to a content addressed memory;

producing, using a received signal processor, the parameters of the cycles or half-cycles of the tone signals from the received OFDM signal wherein the produced parameters correspond to amplitudes or phases of the cycles or half-cycles of the tone signals;

identifying ones of the distinctive sets comprising the produced parameters by processing the produced parameters;

decoding adaptively the transmitted data symbols by reversing both the transmitter coding and the transformation distortions, wherein the reversing of both the transmitter coding and the transformation distortions is achieved by reading the transmitted data symbols from the content addressed memory addressed with identifiers of the identified distinctive sets.

* * * * *